(12) United States Patent
Liu et al.

(10) Patent No.: US 12,414,331 B2
(45) Date of Patent: Sep. 9, 2025

(54) ISOLATION FOR MULTIGATE DEVICES

(71) Applicant: Taiwan Semiconductor Manufacturing Company, Ltd., Hsin-Chu (TW)

(72) Inventors: Ko-Cheng Liu, Hsinchu (TW); Chang-Miao Liu, Hsinchu (TW); Ming-Lung Cheng, Kaohsiung County (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 520 days.

(21) Appl. No.: 17/833,322

(22) Filed: Jun. 6, 2022

(65) Prior Publication Data

US 2023/0261077 A1 Aug. 17, 2023

Related U.S. Application Data

(60) Provisional application No. 63/311,087, filed on Feb. 17, 2022.

(51) Int. Cl.
*H10D 30/67* (2025.01)
*H10D 62/10* (2025.01)
*H10D 64/01* (2025.01)

(52) U.S. Cl.
CPC ..... *H10D 30/6735* (2025.01); *H10D 30/6757* (2025.01); *H10D 62/115* (2025.01);
(Continued)

(58) Field of Classification Search
CPC .......... H01L 29/42392; H01L 29/0649; H01L 29/0673; H01L 29/6653; H01L 29/66545; H01L 29/78696; H01L 29/0653; H01L 29/0847; H01L 29/1083; H01L 29/66439; H01L 29/775; H01L 29/7847; H01L 29/165; H01L 29/7848; H01L 27/0924; H01L 21/823821; H01L 21/823878;
(Continued)

(56) References Cited

U.S. PATENT DOCUMENTS 9,984,936 B1 5/2018 Xie et al.
11,018,222 B1 5/2021 O'Brien et al.
(Continued)

*Primary Examiner* — Allison Bernstein
(74) *Attorney, Agent, or Firm* — HAYNES AND BOONE, LLP

(57) ABSTRACT

An exemplary device includes a stack of channel layers over a substrate extension, a gate, and an insulation layer. The stack of channel layers extends between a first epitaxial source/drain and a second epitaxial source/drain. The gate surrounds each channel layer of the stack of the channel layers. The insulation layer is over the substrate extension, the gate is between a bottommost channel layer of the stack of channel layers and the insulation layer, and the insulation layer is between the gate and the substrate extension. The insulation layer extends between the first epitaxial source/drain and the second epitaxial source/drain, each of which may include an undoped epitaxial layer. A top surface of the undoped epitaxial layer is below a bottom surface of the bottommost channel layer and/or above a top surface of the insulation layer. The insulation layer may wrap the substrate extension and/or have an air gap therein.

20 Claims, 27 Drawing Sheets

(52) U.S. Cl.
CPC ......... *H10D 62/121* (2025.01); *H10D 64/015* (2025.01); *H10D 64/017* (2025.01)

(58) Field of Classification Search
CPC ............. H01L 29/785; H01L 29/66636; H01L 29/66795; B82Y 10/00; H10D 30/6735; H10D 30/6757; H10D 62/115; H10D 62/121; H10D 64/015; H10D 64/017; H10D 30/796; H10D 30/797; H10D 30/014; H10D 30/43; H10D 62/151; H10D 62/371; H10D 62/822; H10D 62/116; H10D 84/0188; H10D 84/0193; H10D 84/038; H10D 84/853; H10D 30/024; H10D 62/021; H10D 30/62

See application file for complete search history.

(56) References Cited

U.S. PATENT DOCUMENTS

| | | |
|---|---|---|
| 2020/0135932 A1 | 4/2020 | Wang et al. |
| 2020/0152734 A1 | 5/2020 | Frougier et al. |
| 2020/0303500 A1 | 9/2020 | Loubet et al. |
| 2020/0365687 A1 | 11/2020 | Xie et al. |
| 2021/0119031 A1* | 4/2021 | Song .................. H01L 27/0924 |
| 2021/0313326 A1 | 10/2021 | Lim et al. |
| 2021/0375685 A1* | 12/2021 | Xie ................. H01L 21/823468 |
| 2022/0037499 A1 | 2/2022 | Chu et al. |

\* cited by examiner

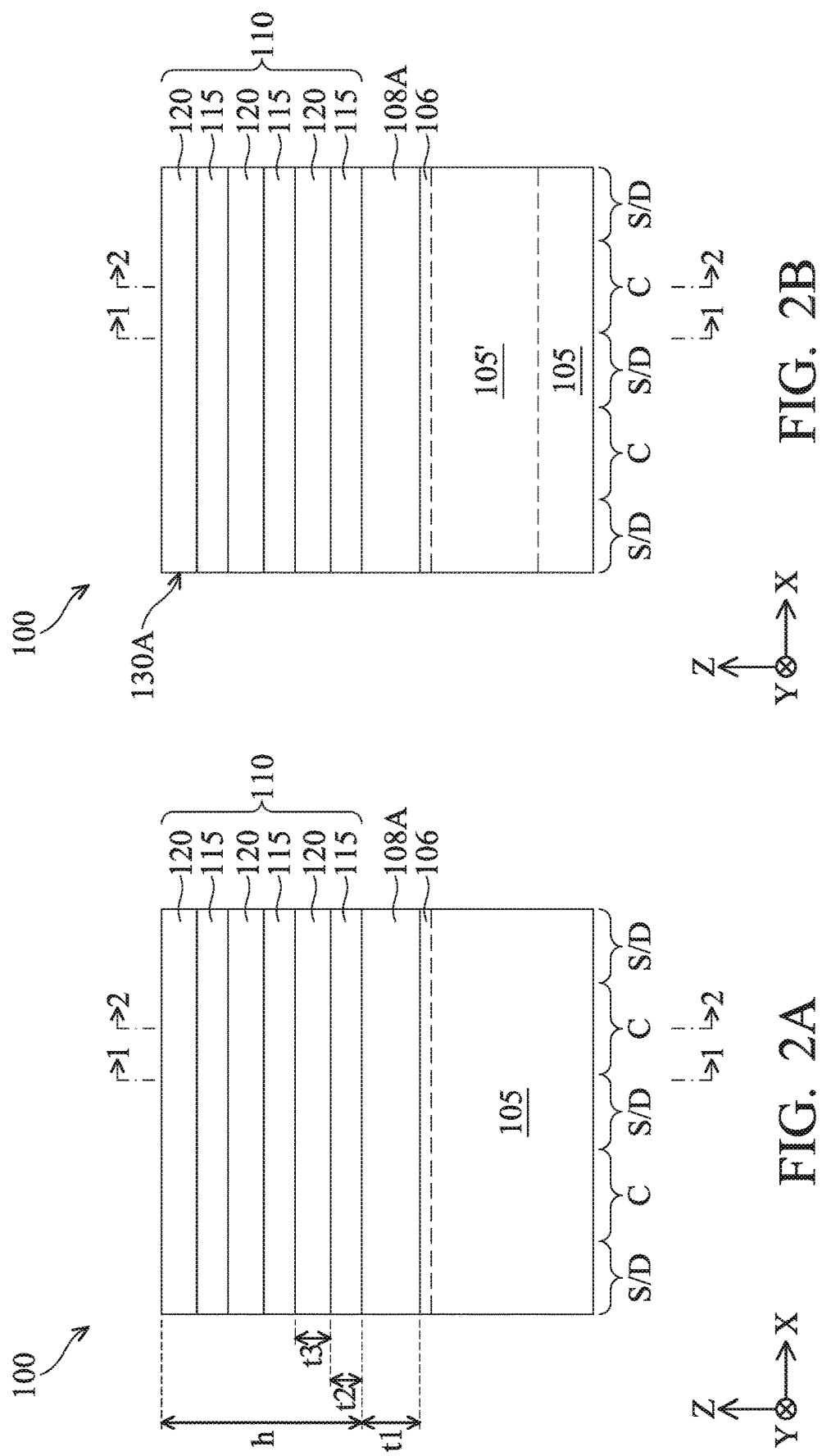

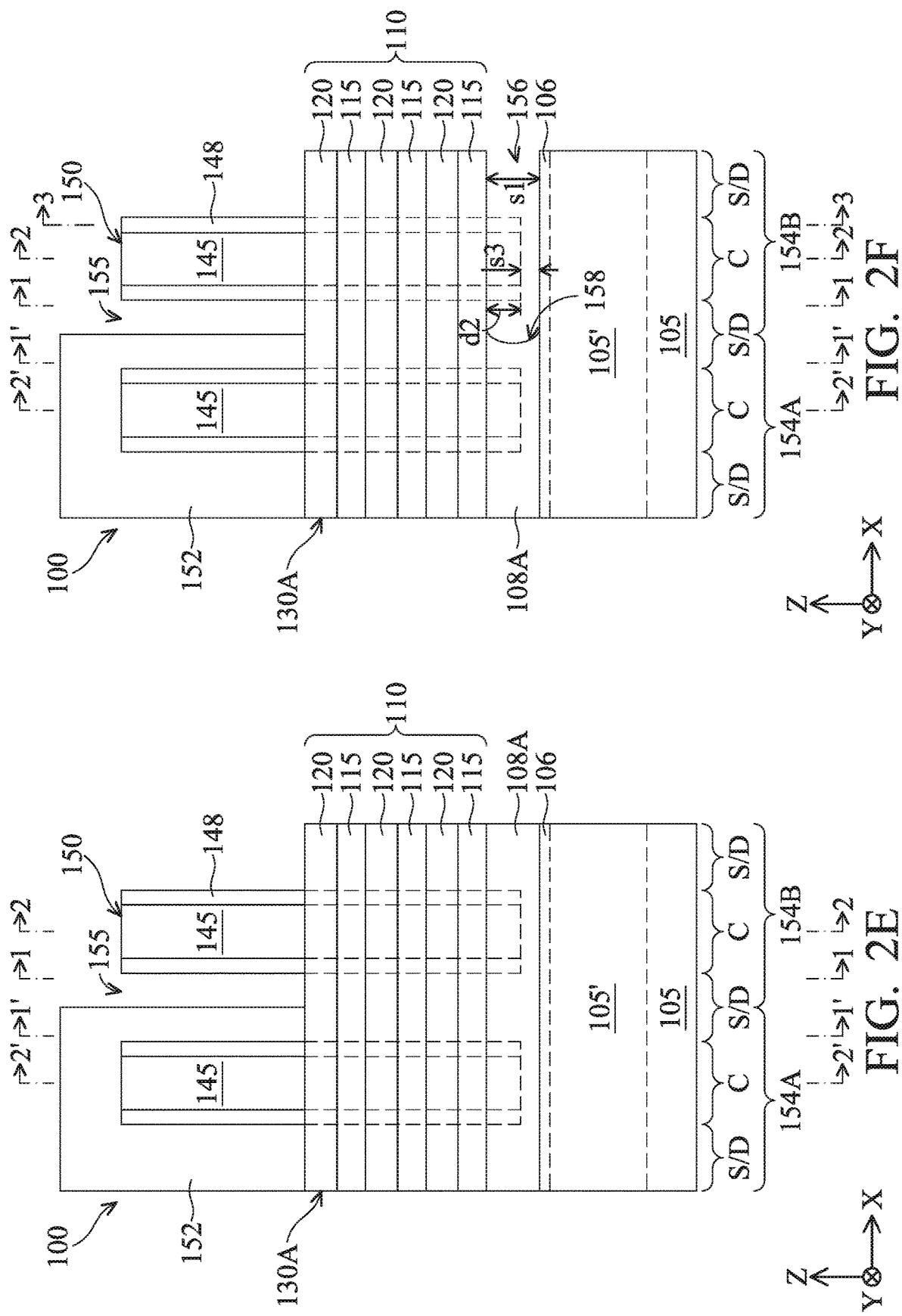

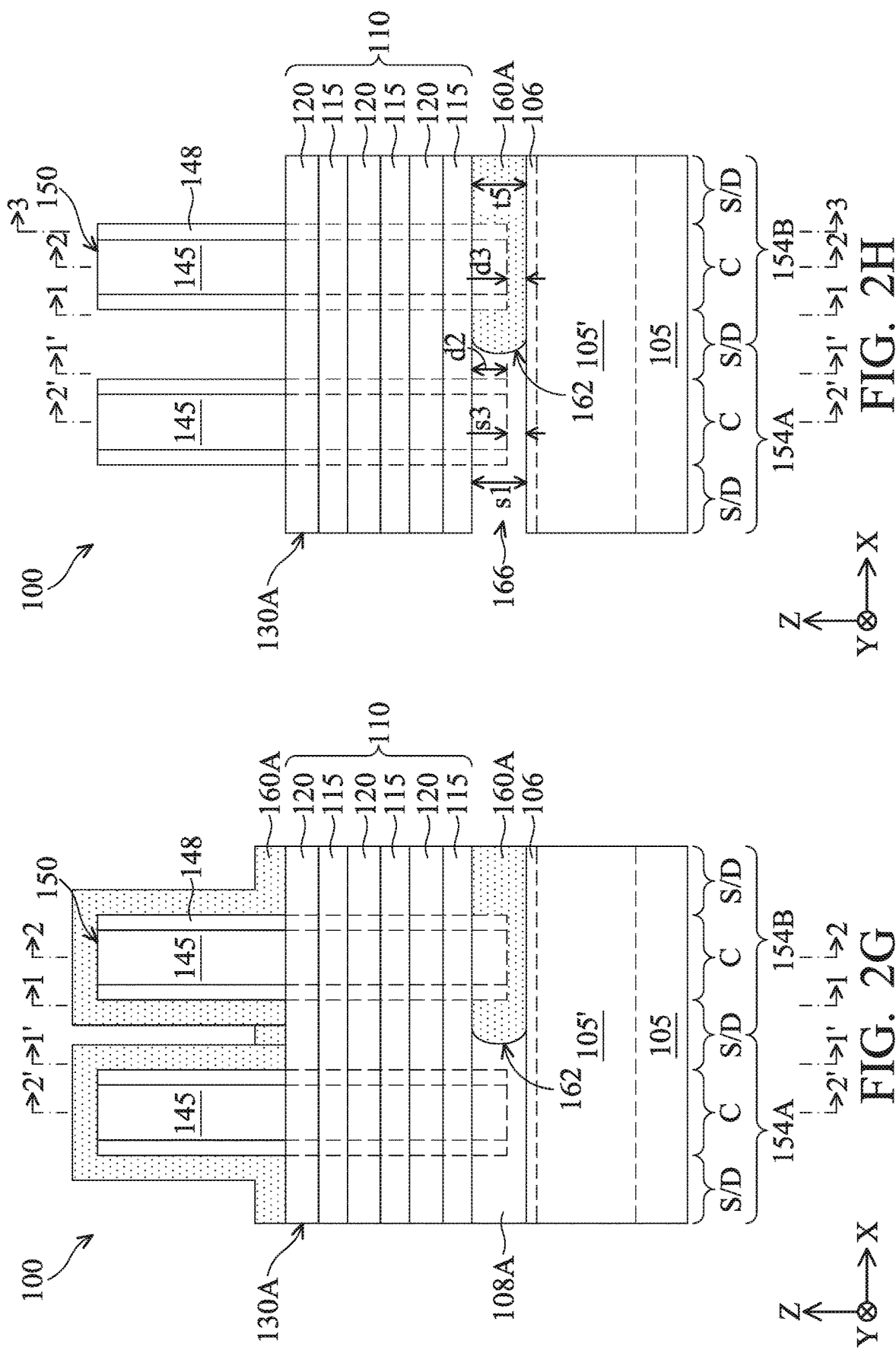

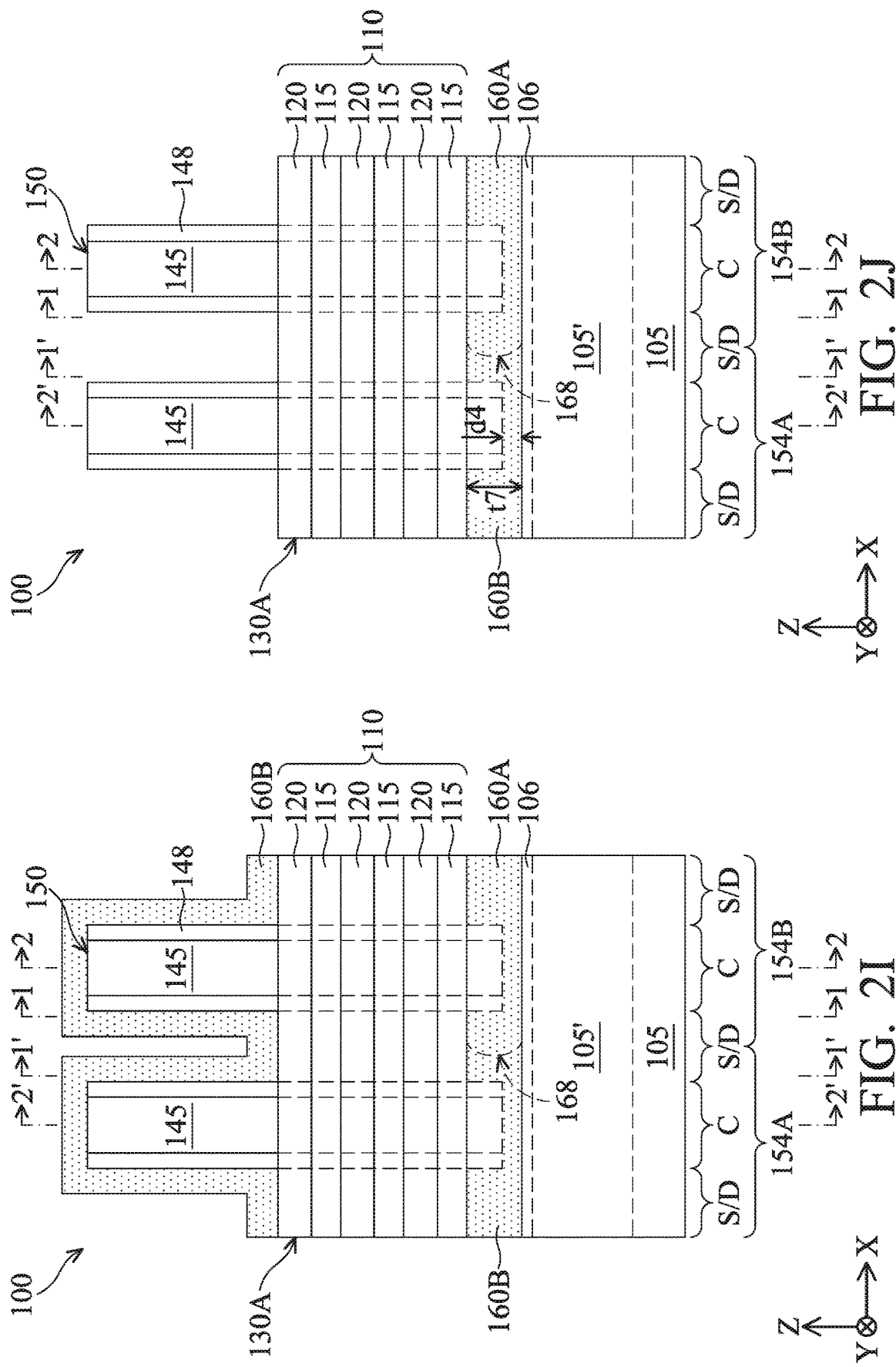

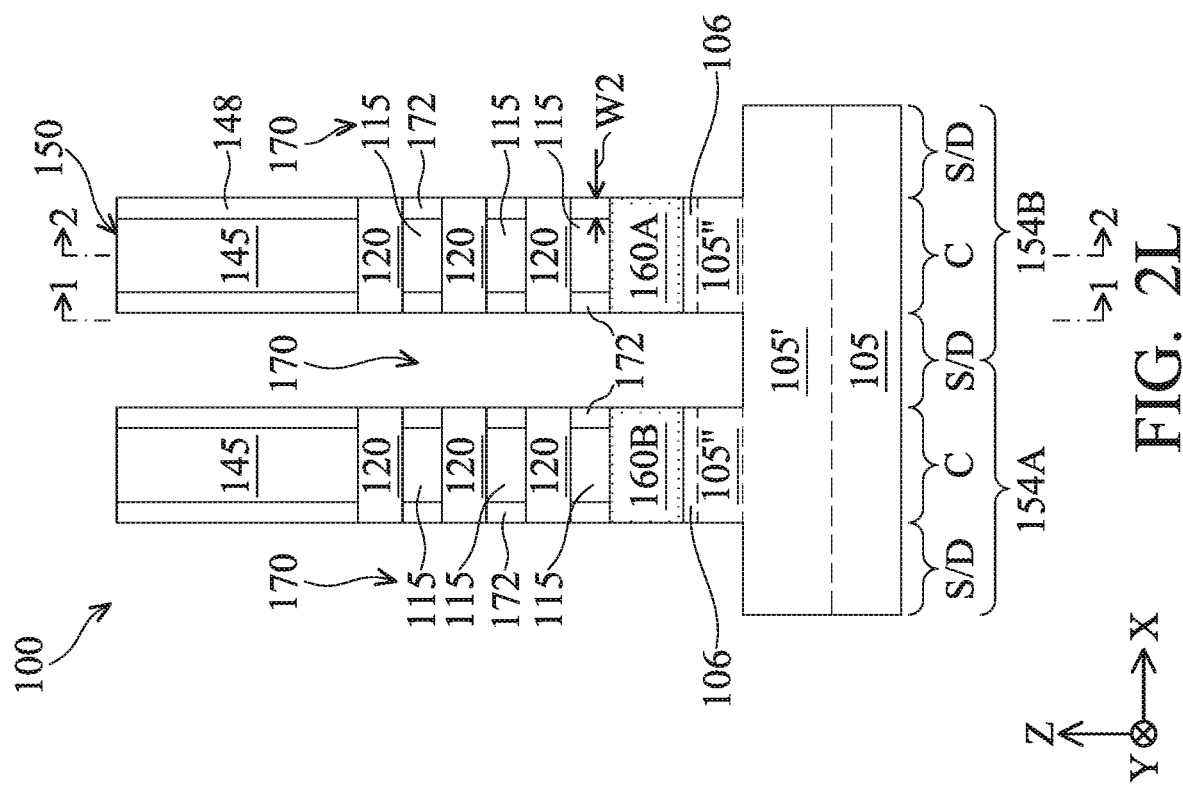
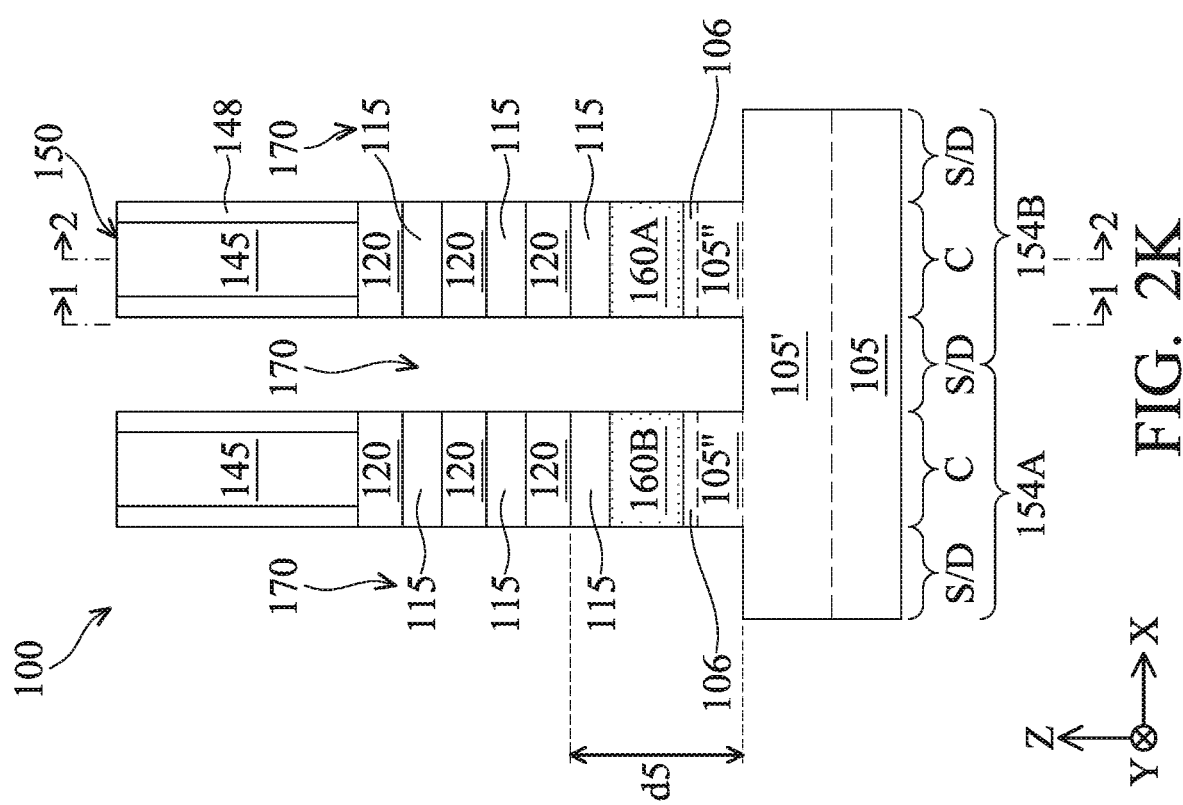

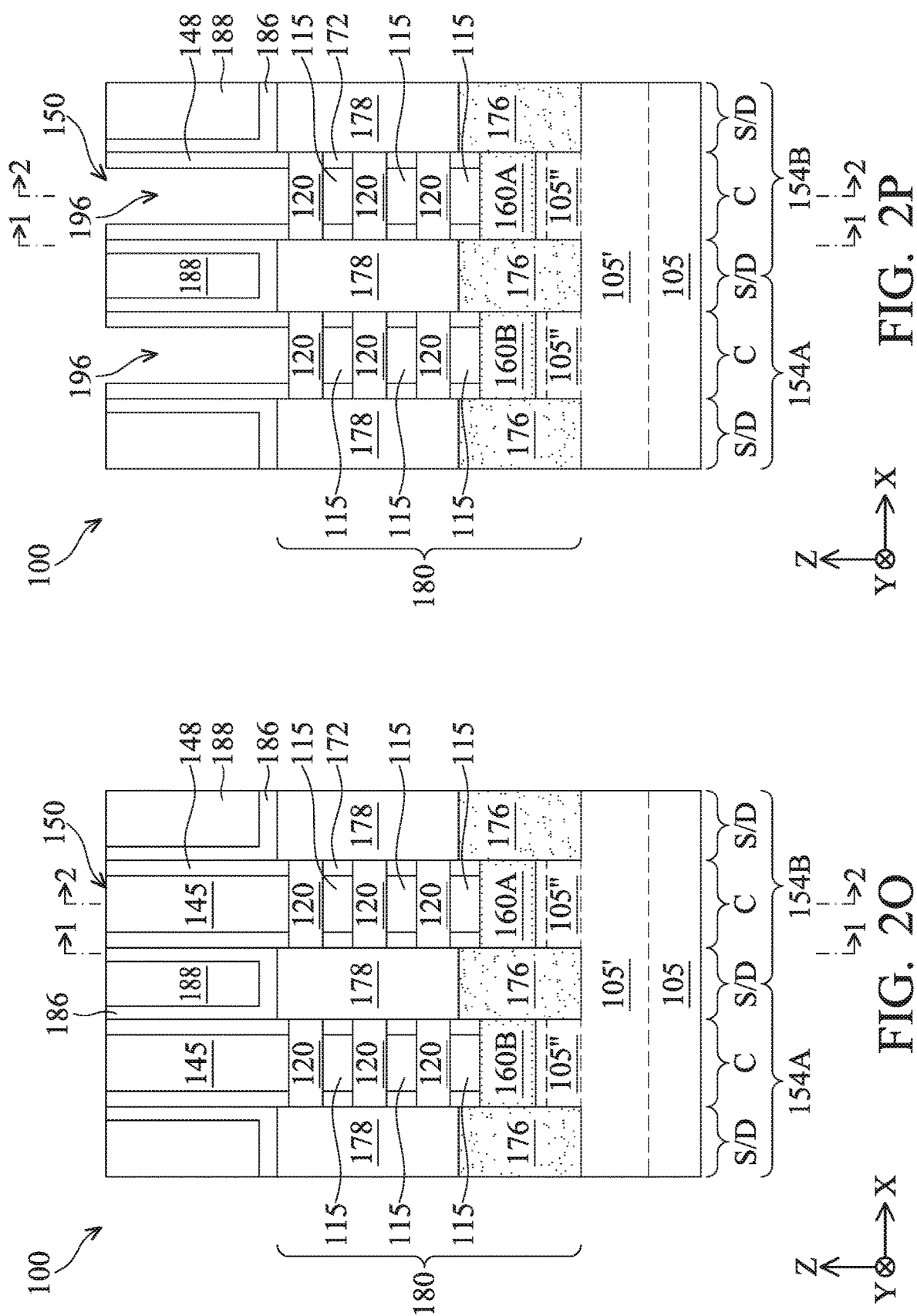

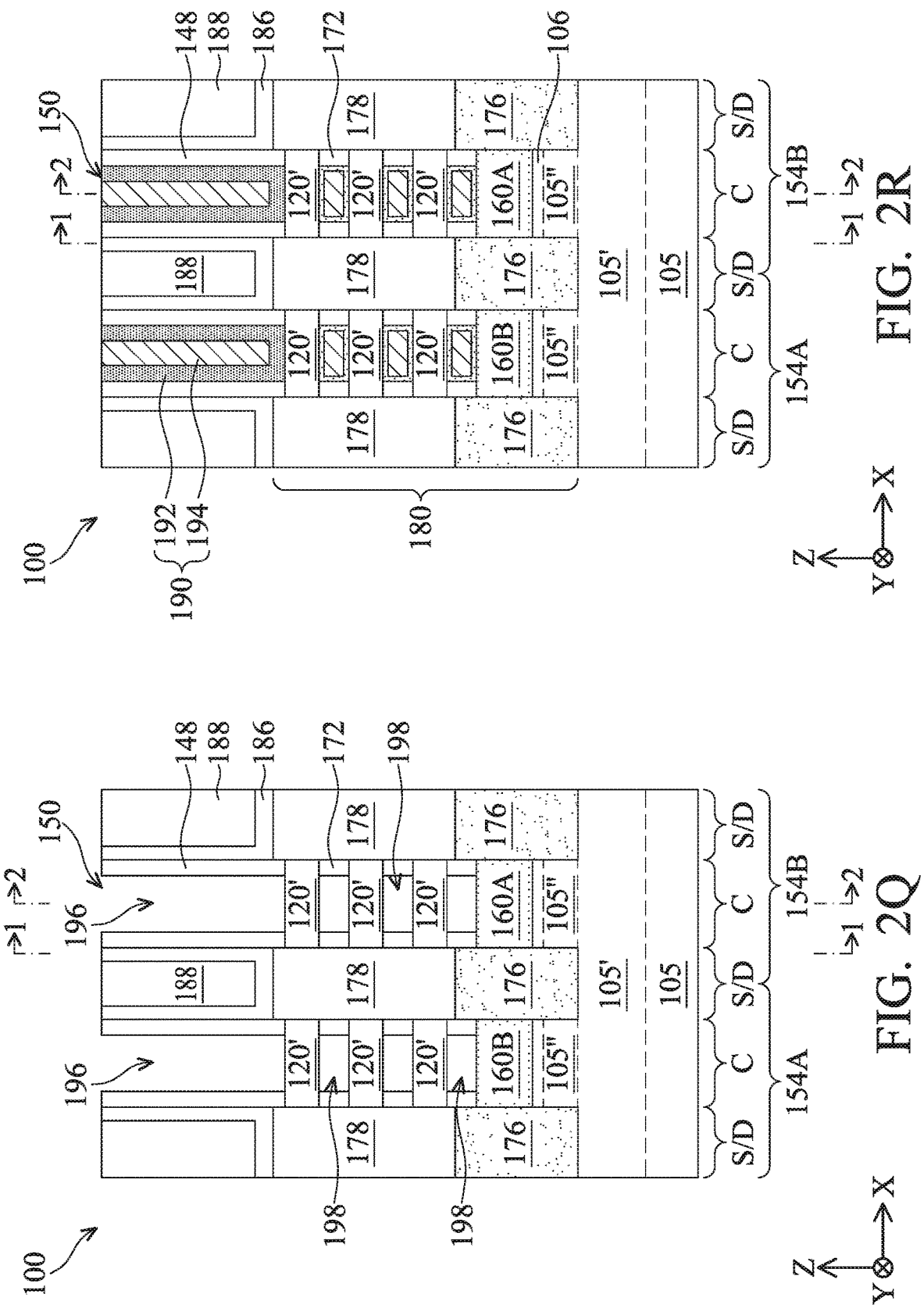

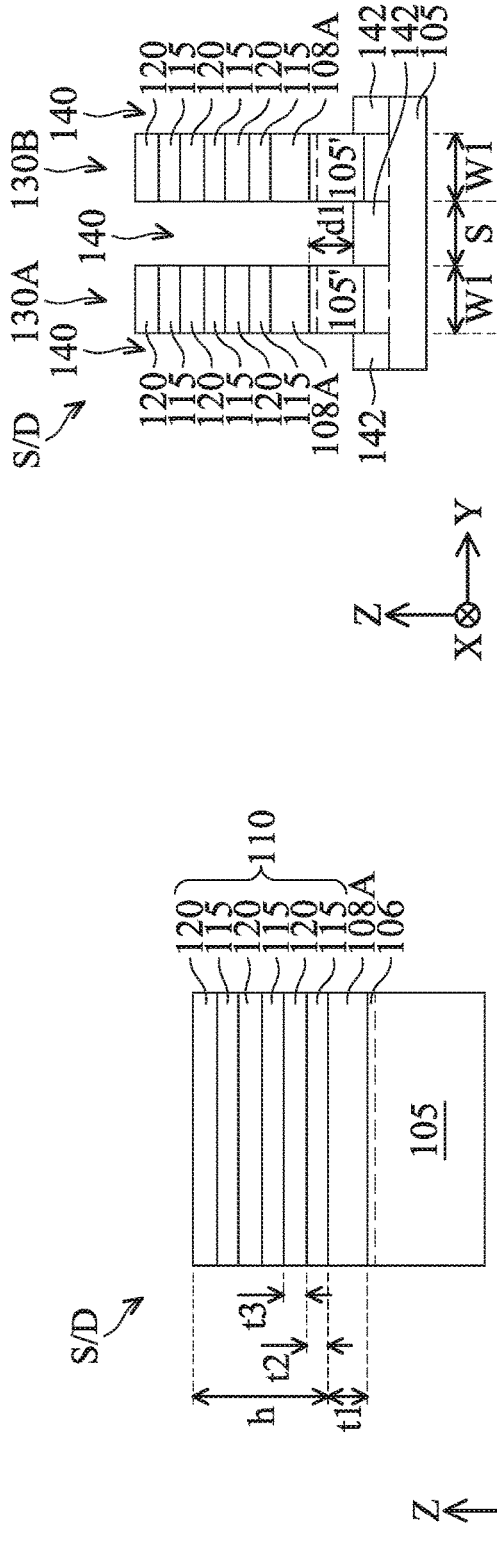
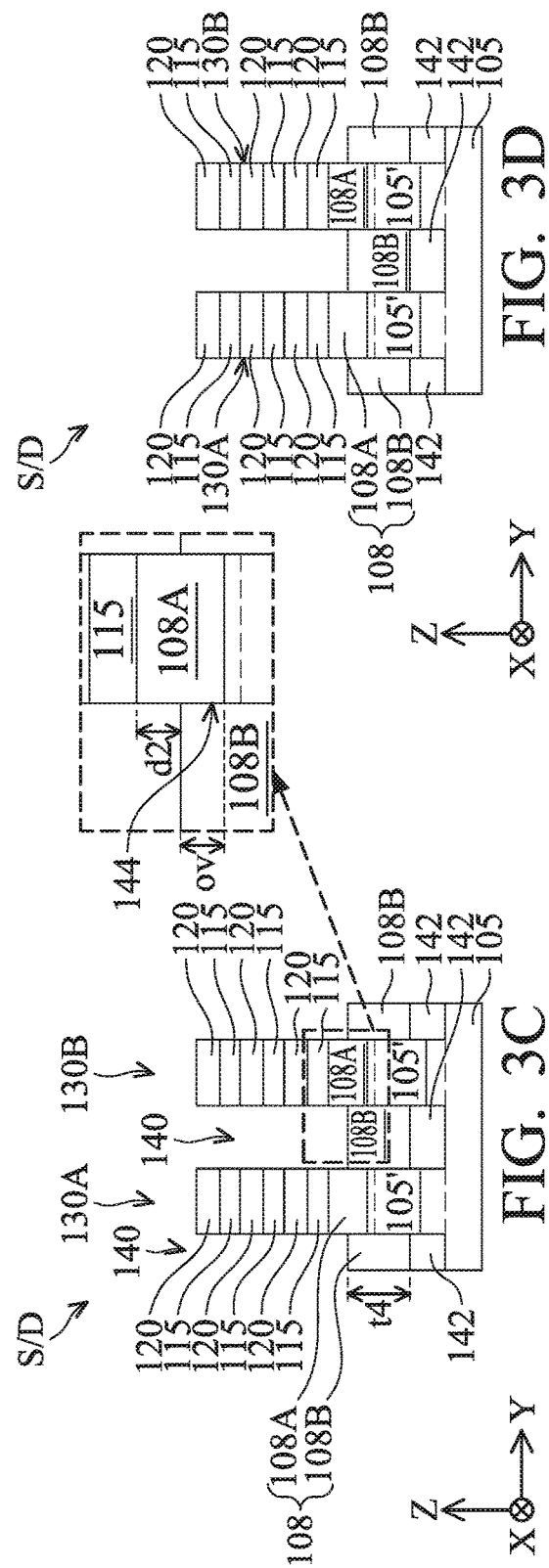
FIG. 3A
FIG. 3B
FIG. 3C
FIG. 3D

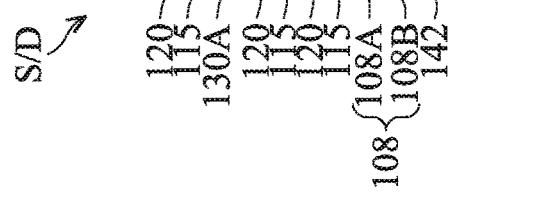
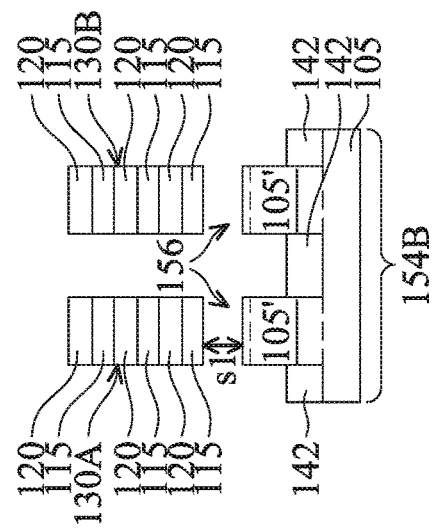
FIG. 3E
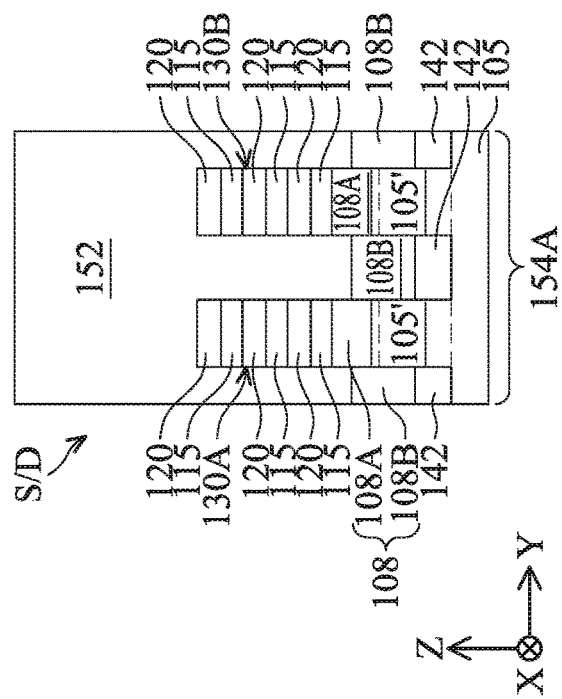
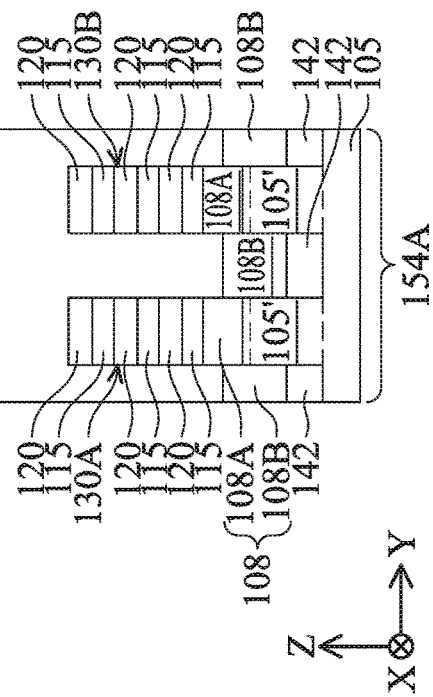
FIG. 3F

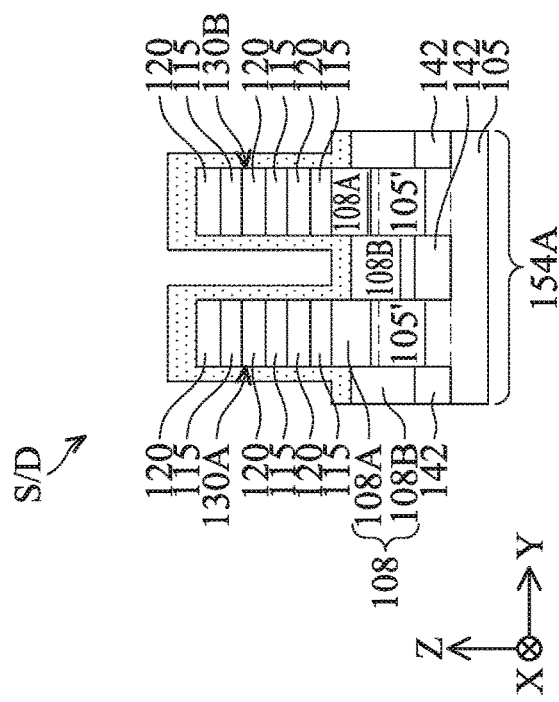
FIG. 3G
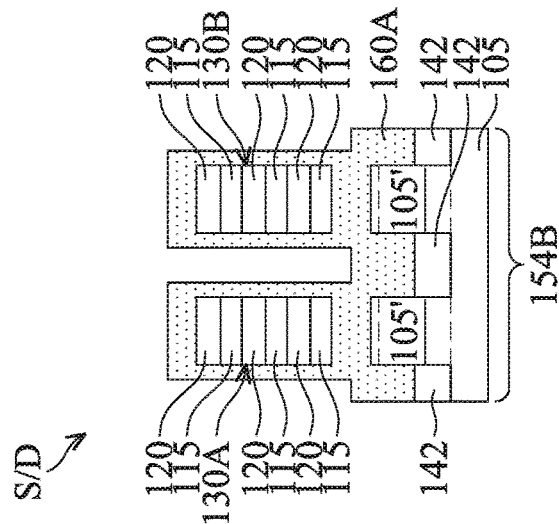
FIG. 3H
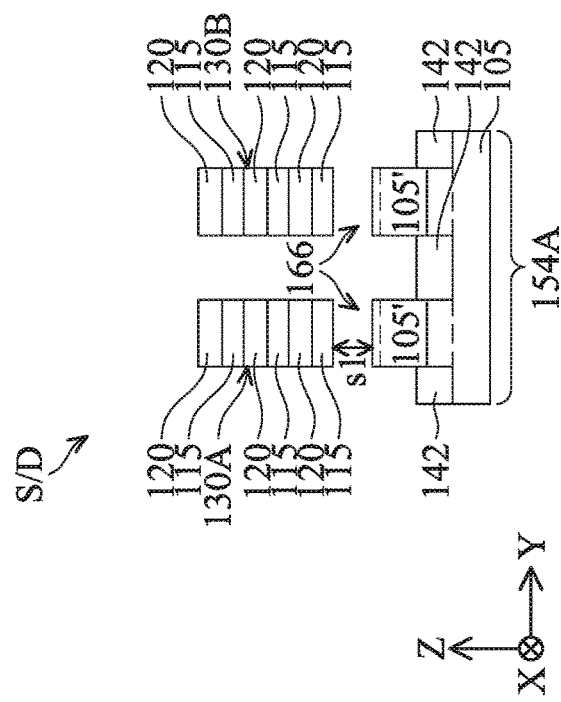
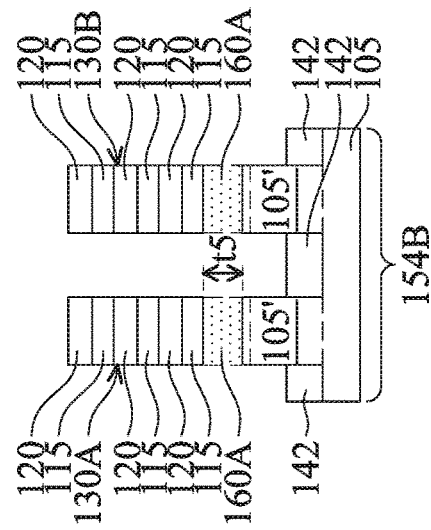

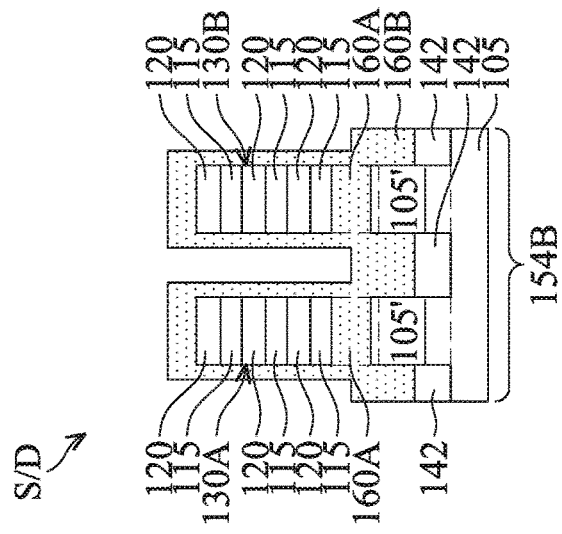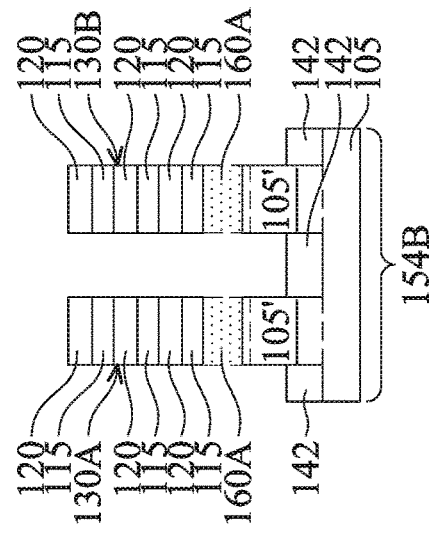
FIG. 3I
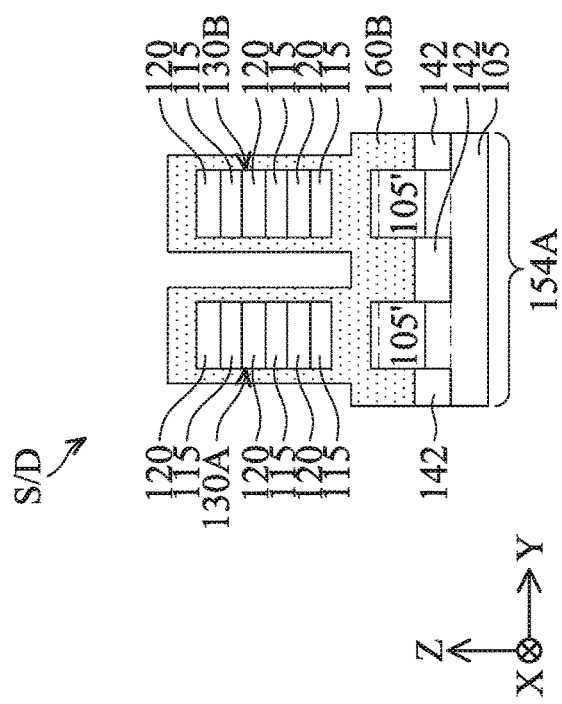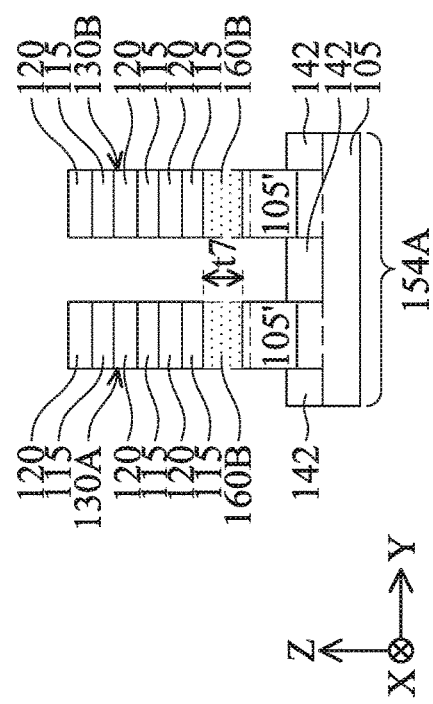
FIG. 3J

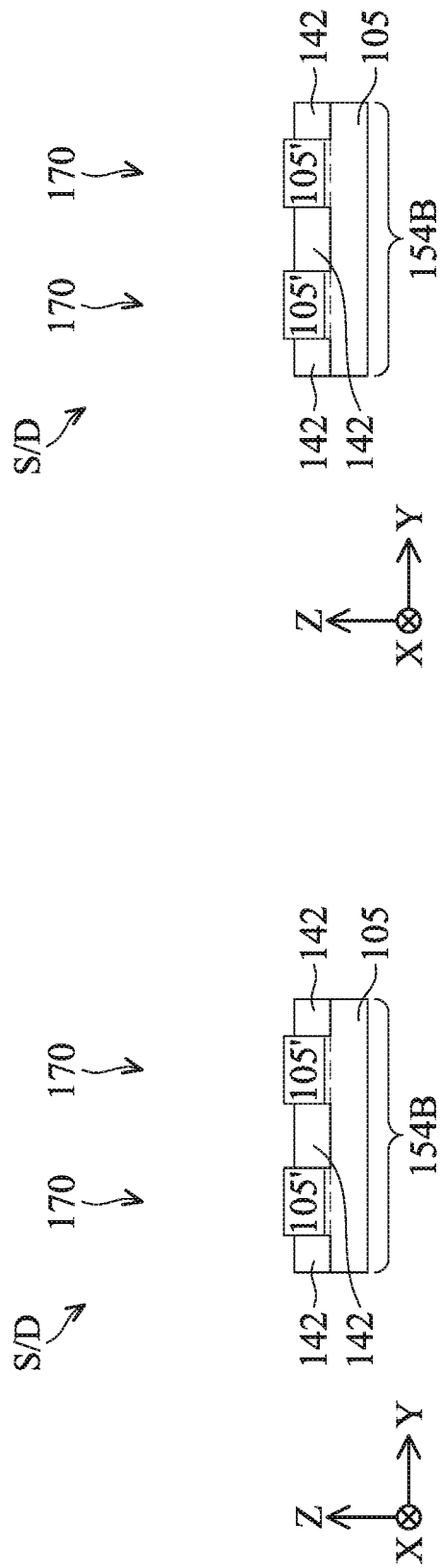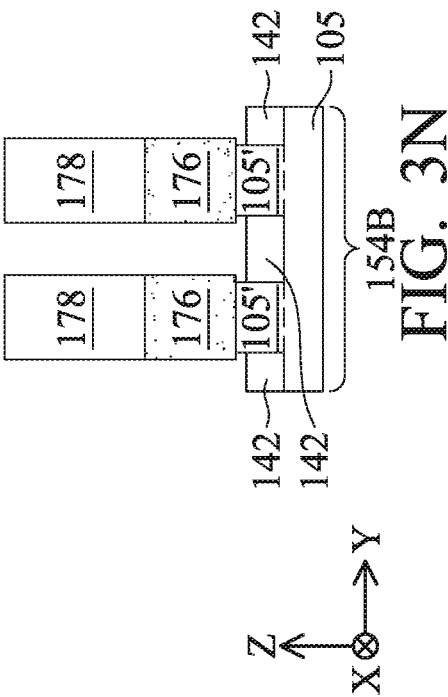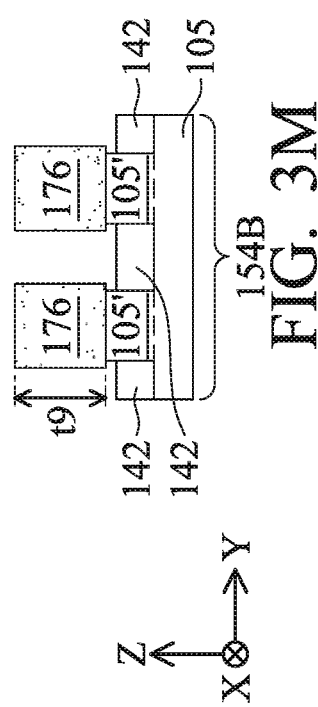

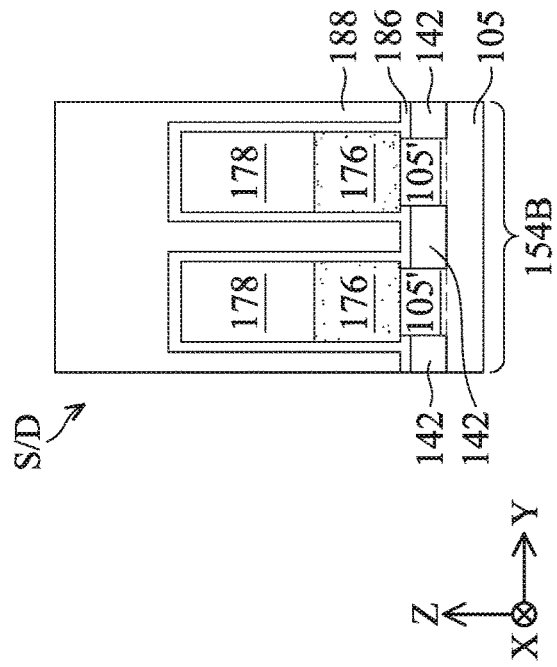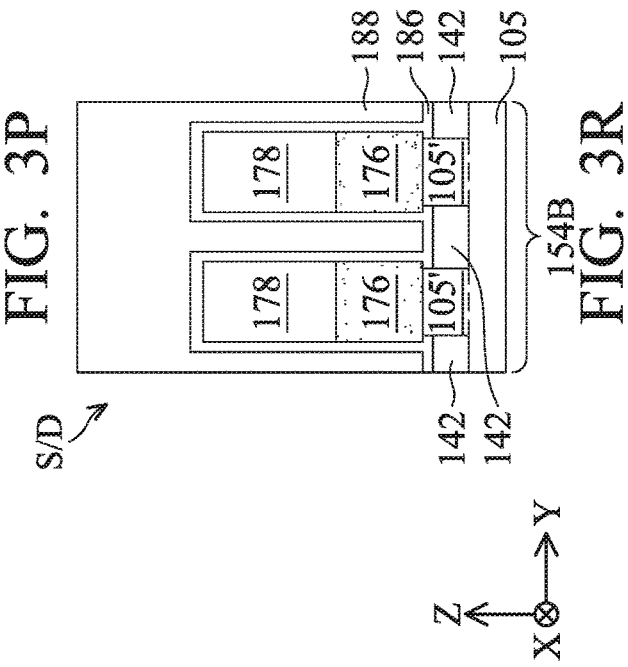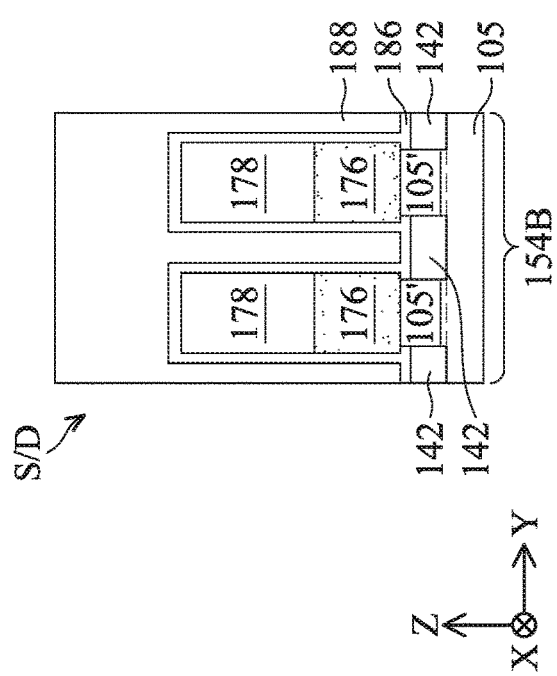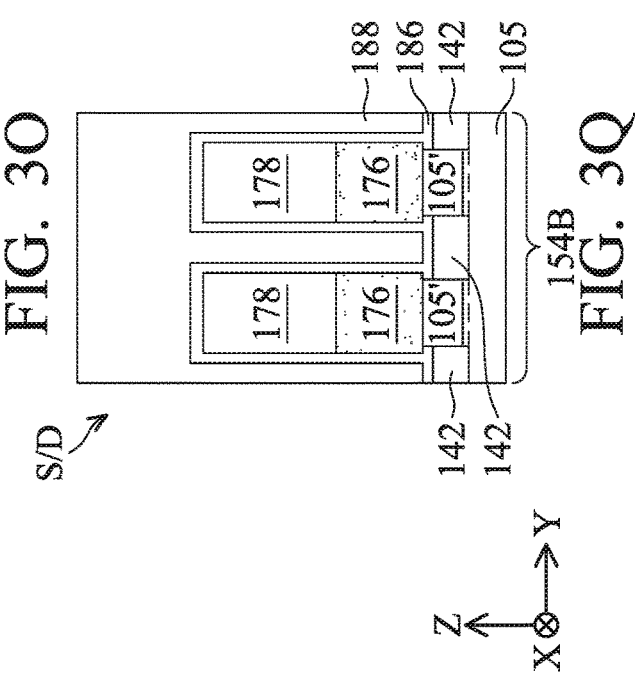

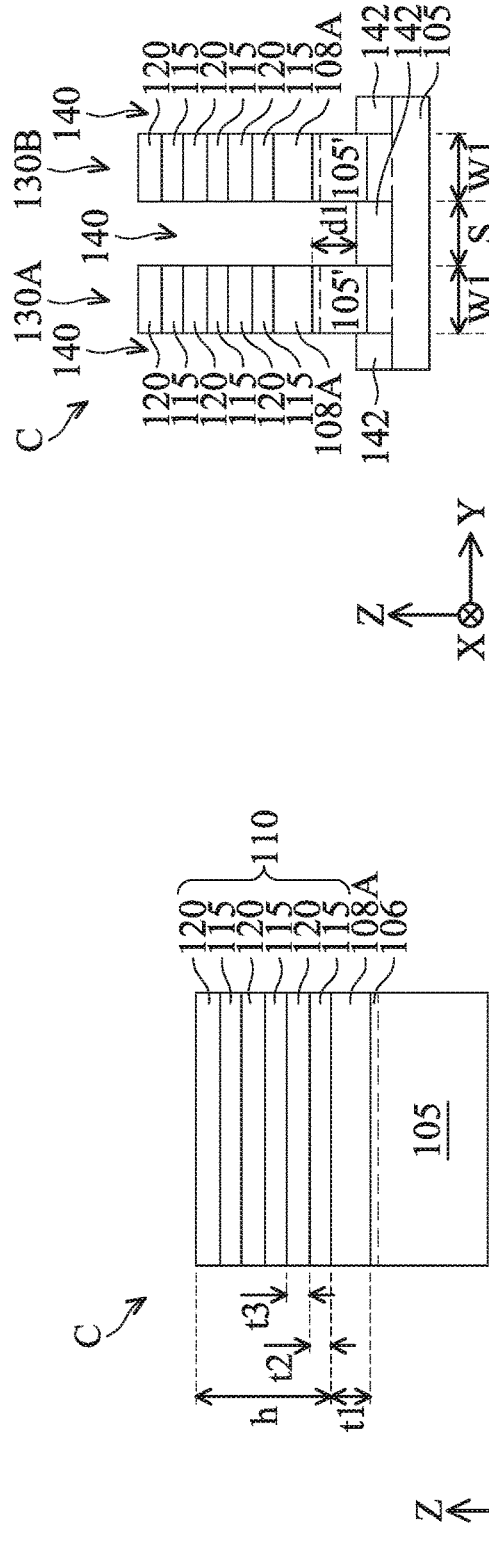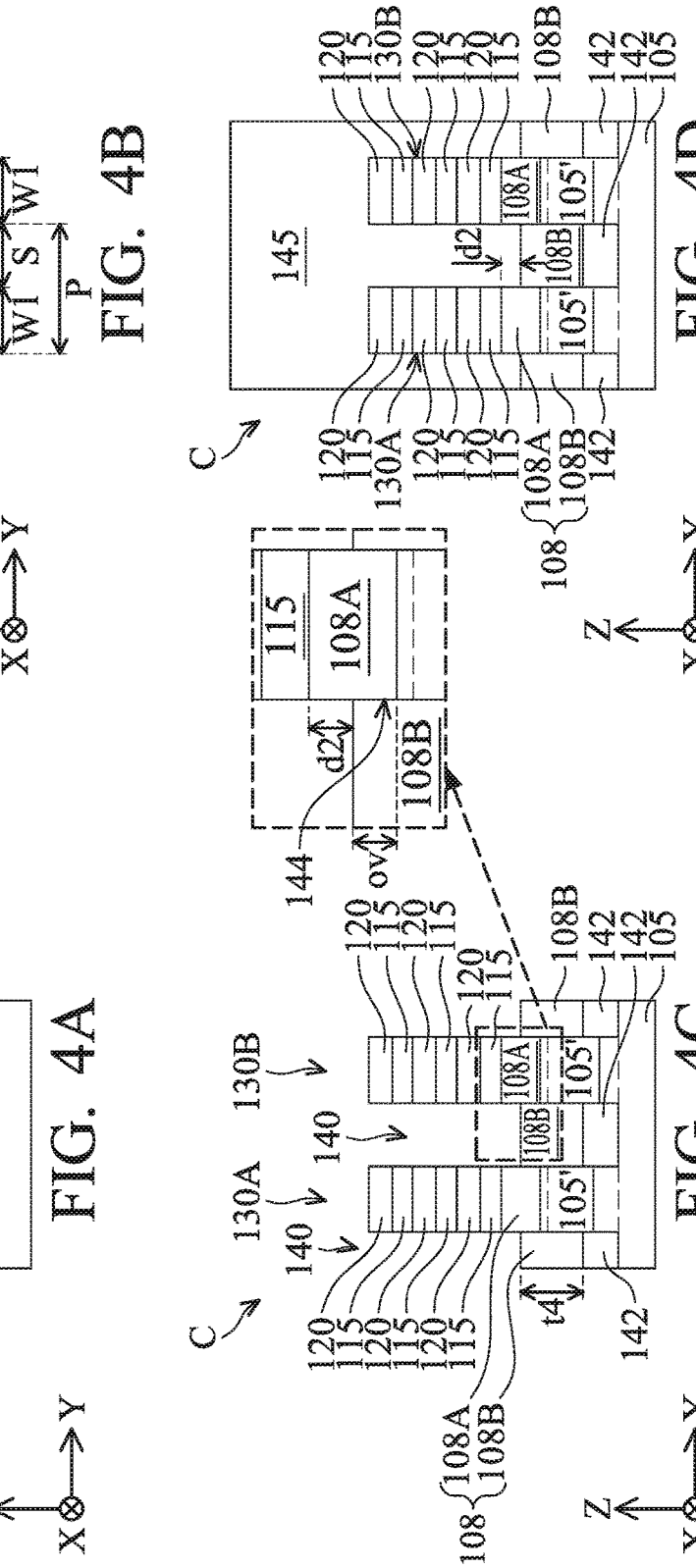
FIG. 4A  FIG. 4B  FIG. 4C  FIG. 4D

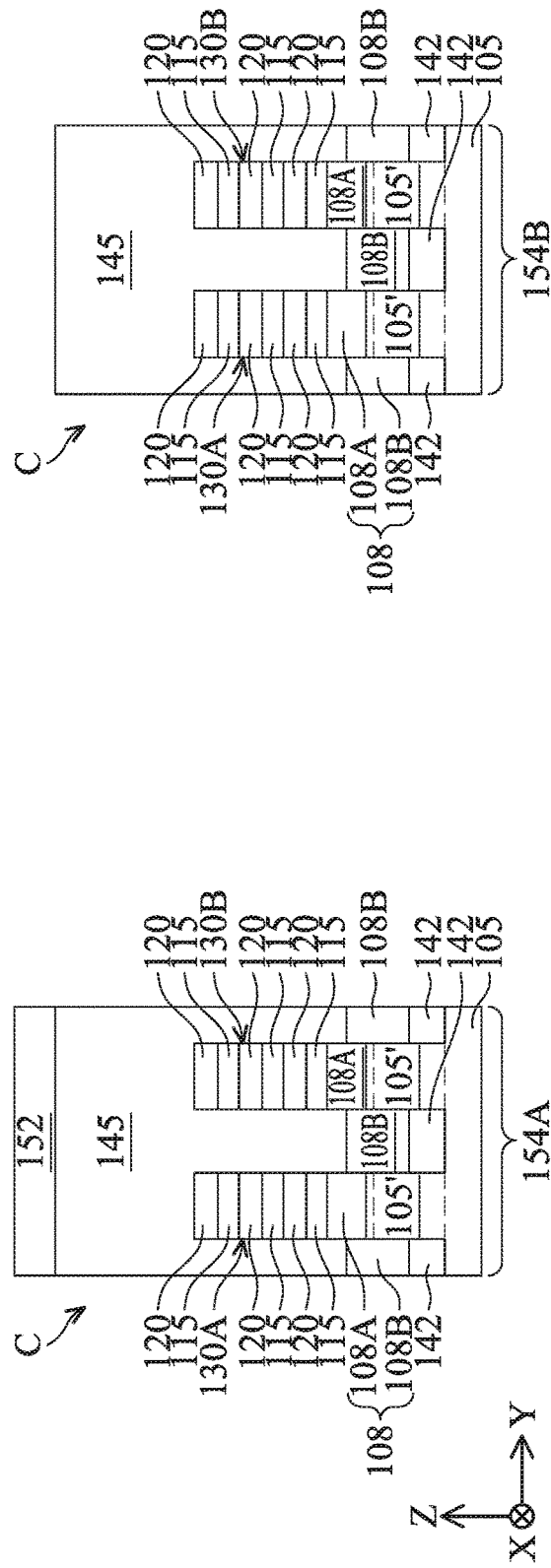
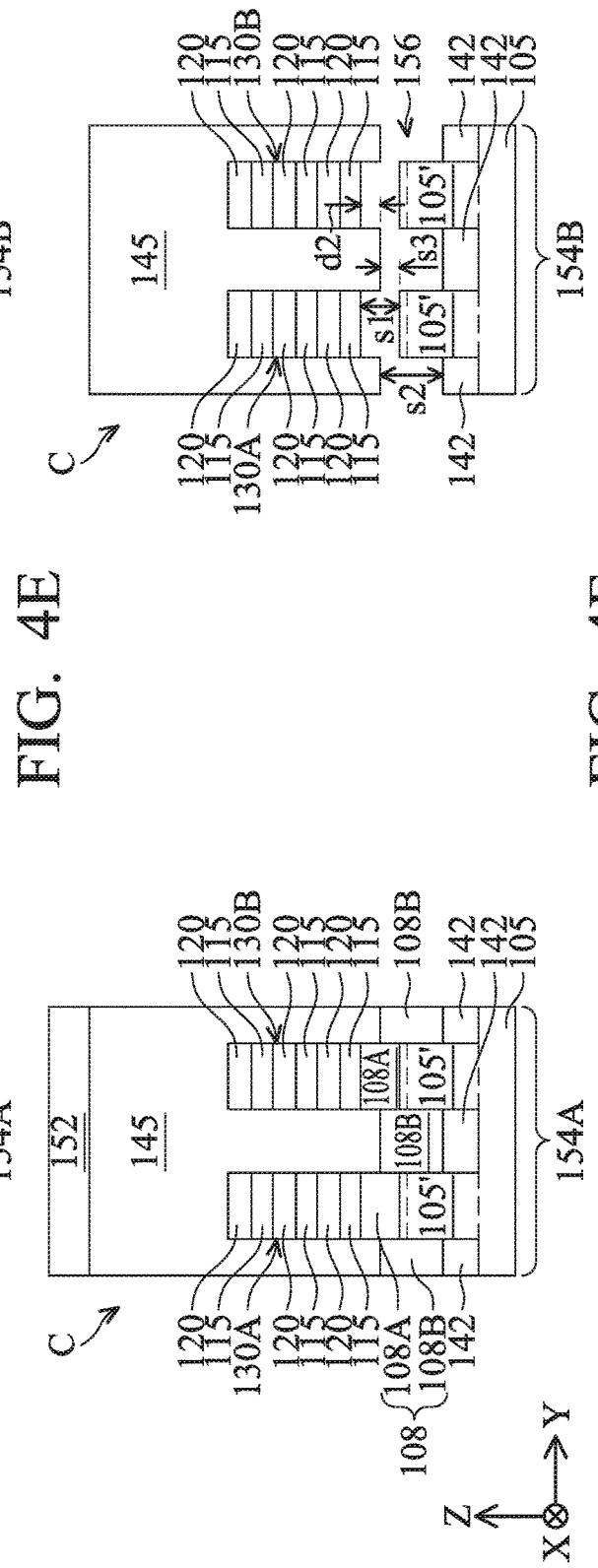
FIG. 4E
FIG. 4F

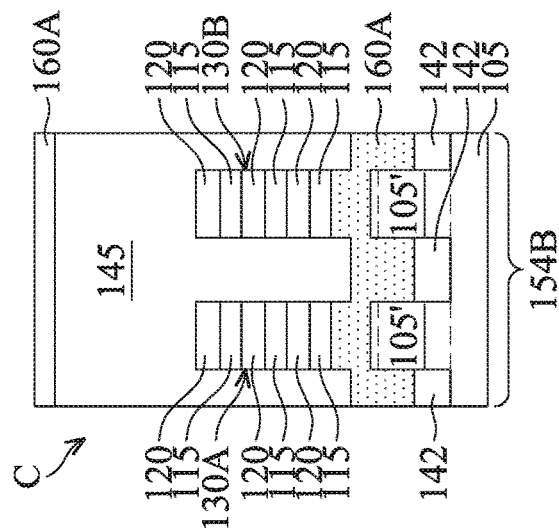
FIG. 4G
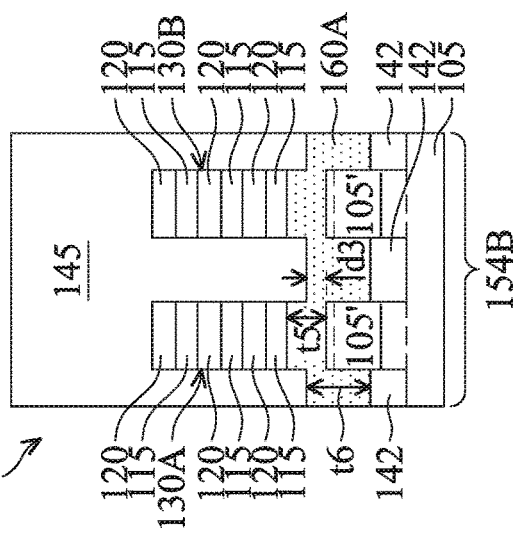
FIG. 4H
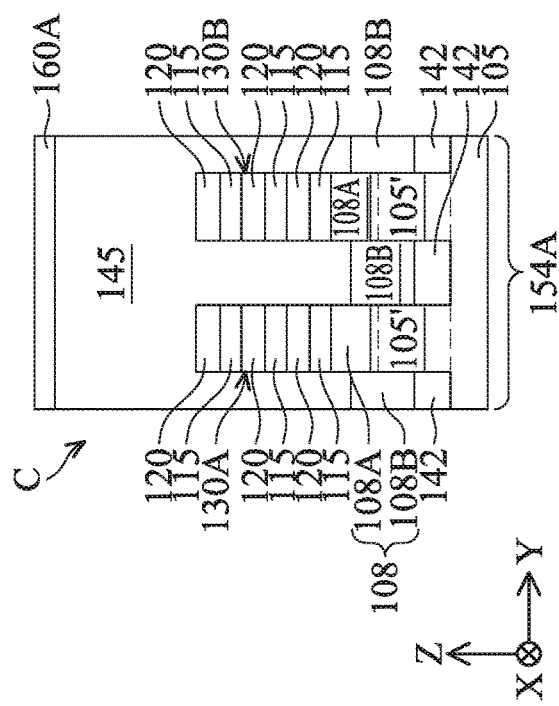
FIG. 4E
FIG. 4F

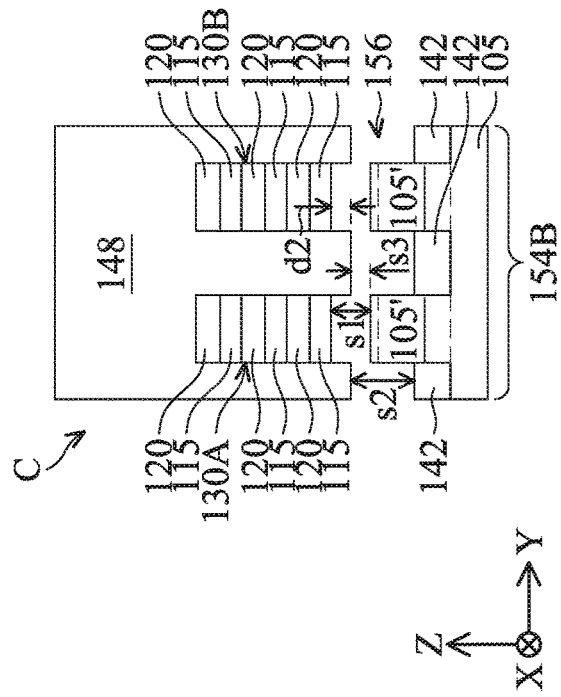
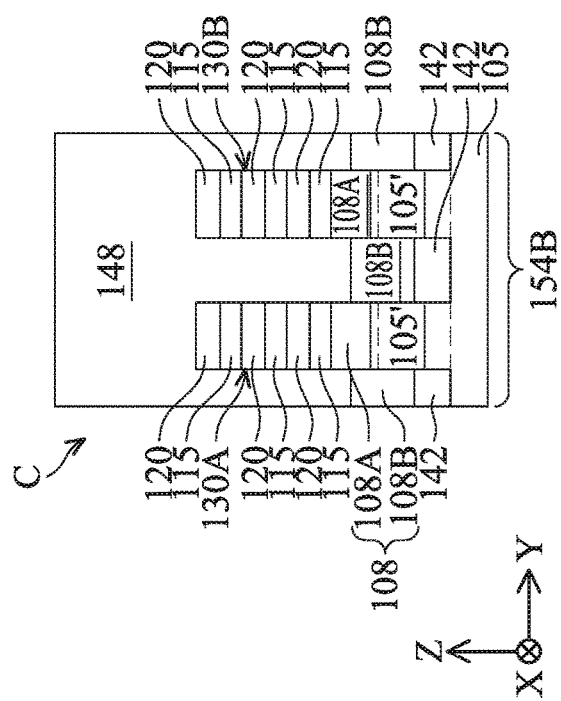
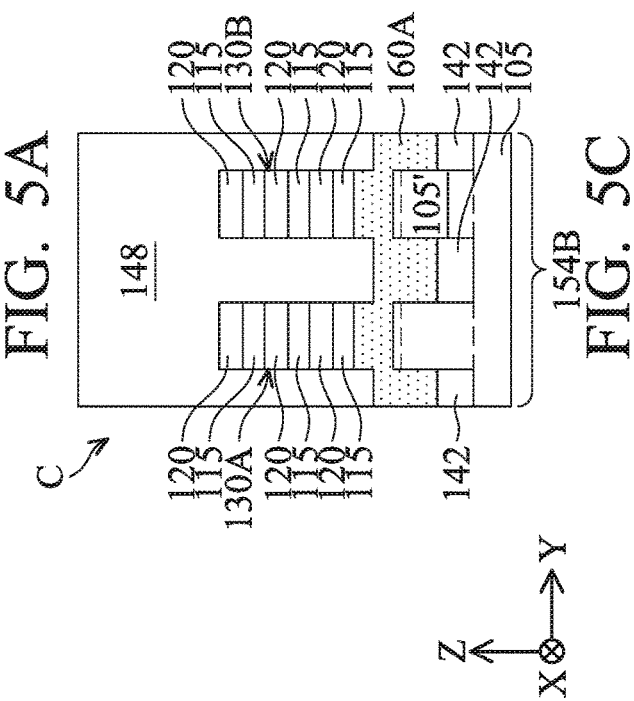

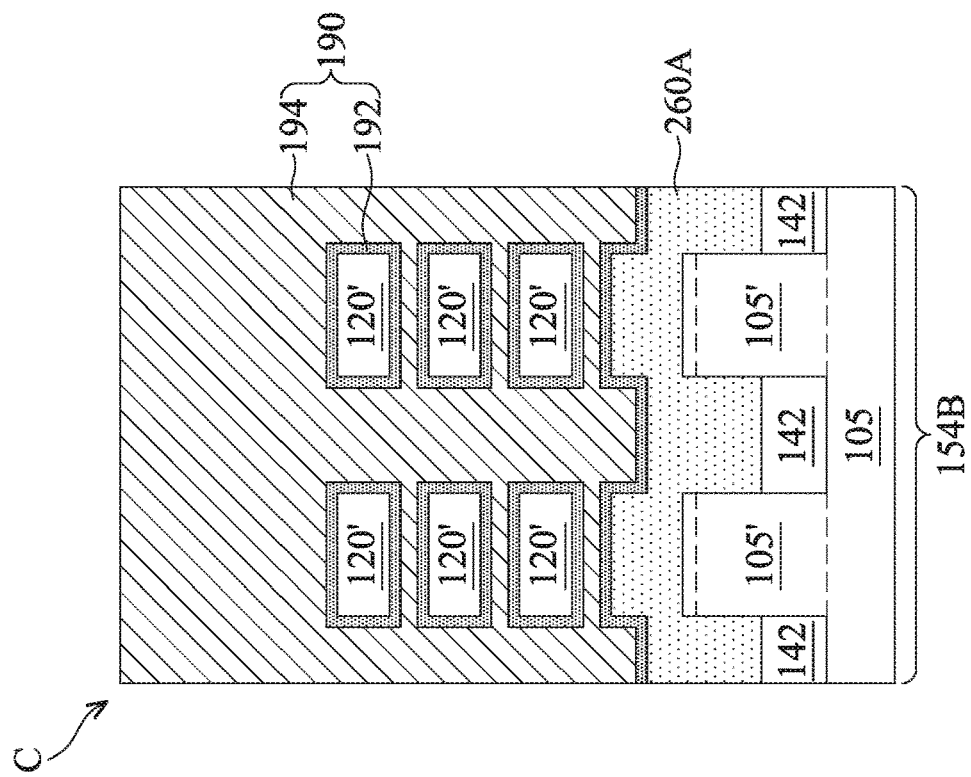
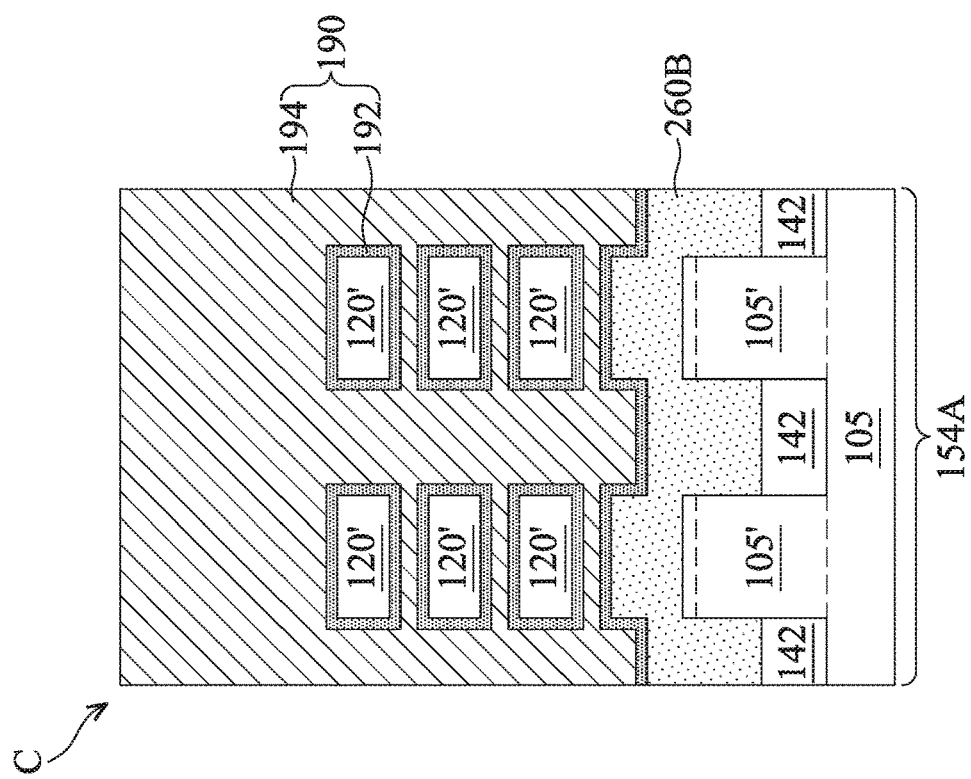
FIG. 6C

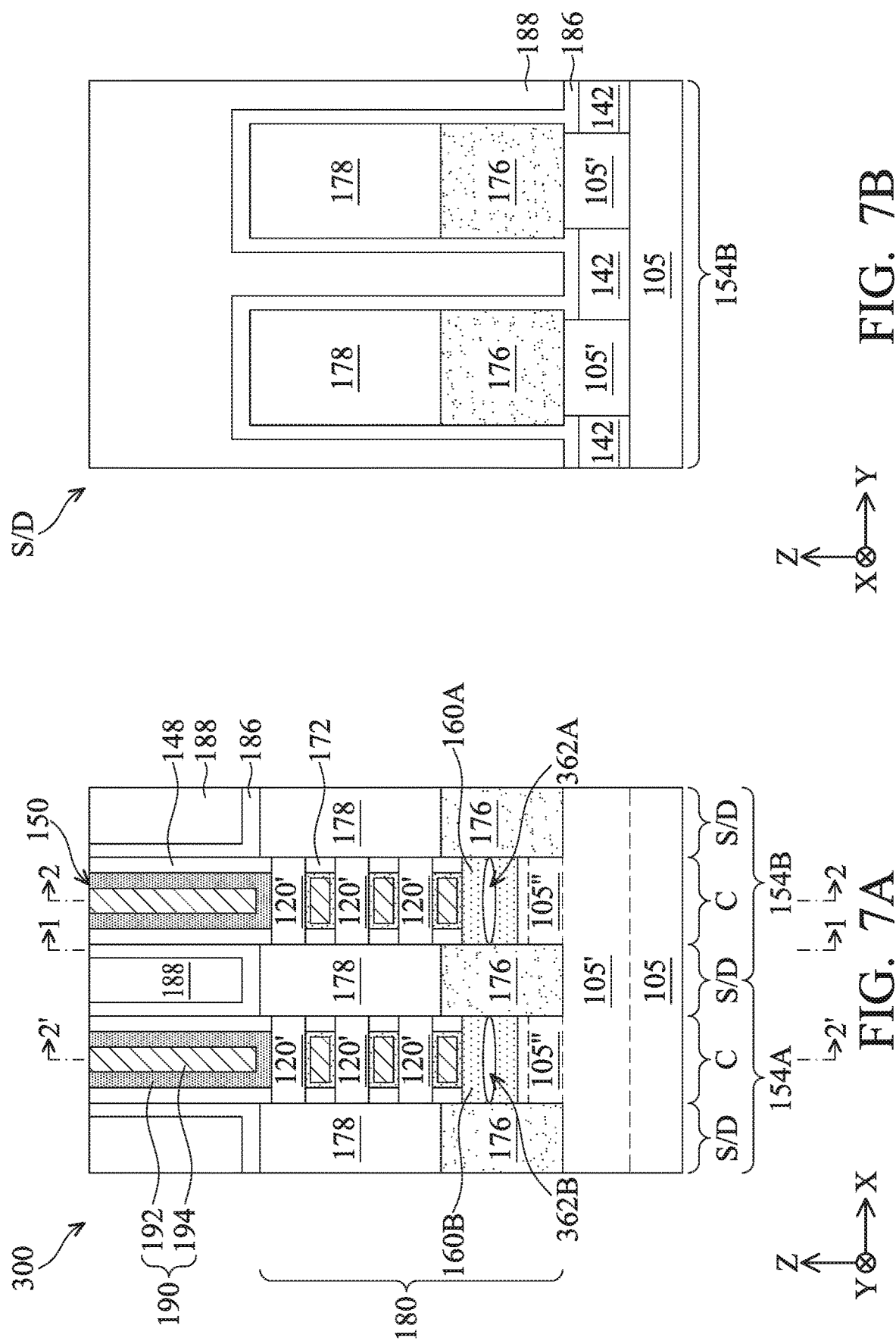

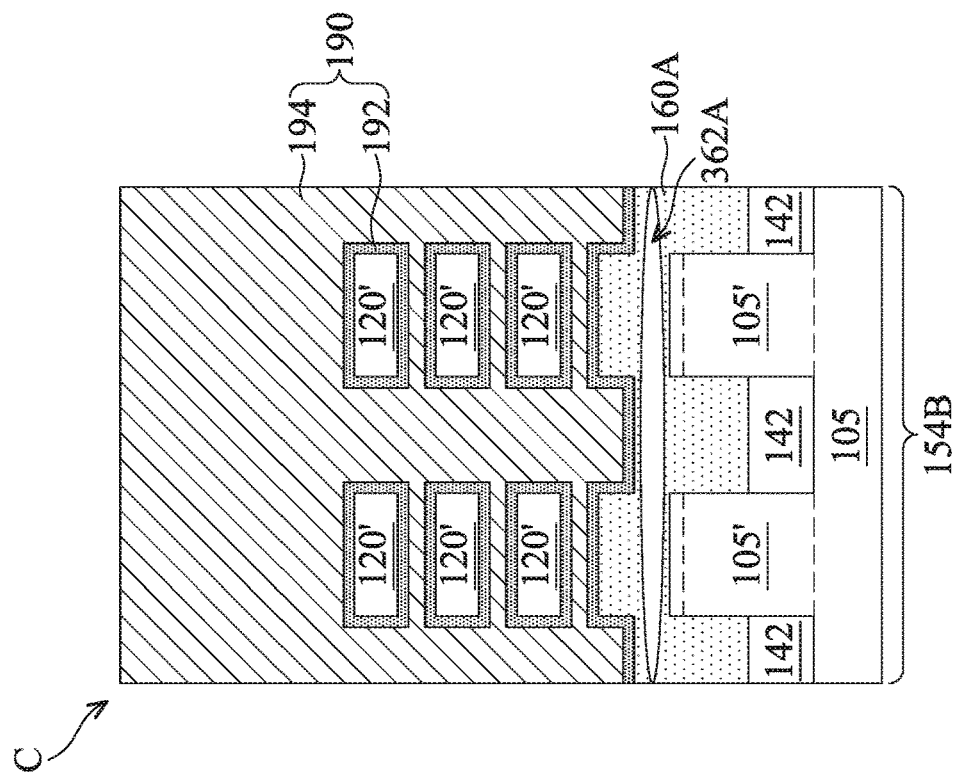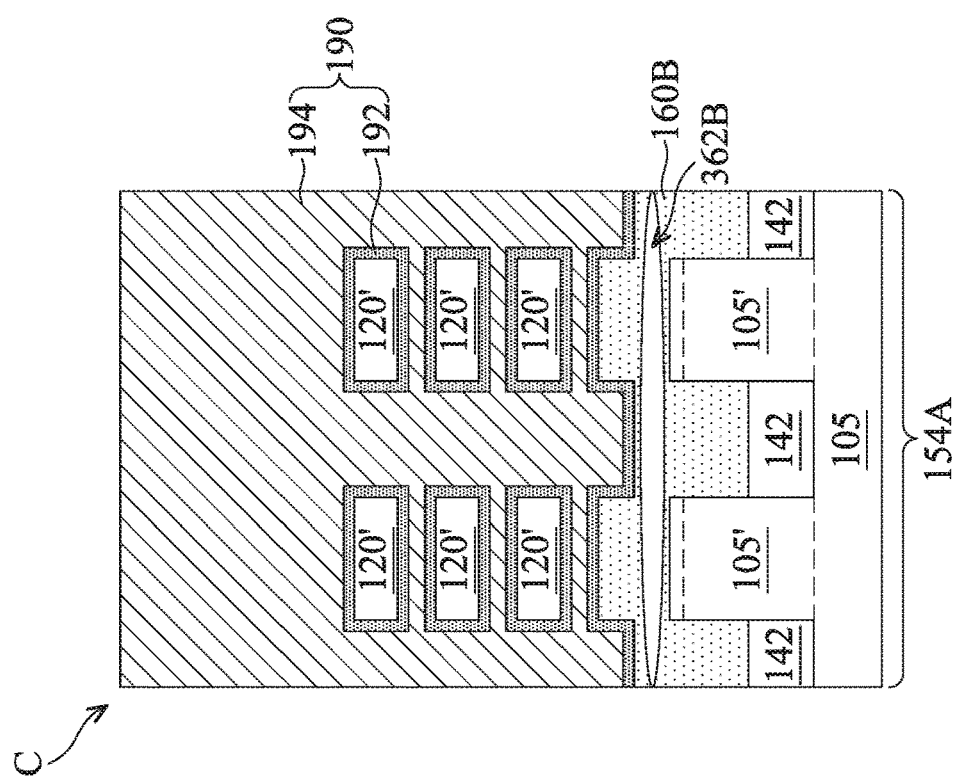
FIG. 7C

ISOLATION FOR MULTIGATE DEVICES

This application is a non-provisional application of and claims benefit of U.S. Provisional Patent Application Ser. No. 63/311,087, filed Feb. 17, 2022, the entire disclosure of which is incorporated herein by reference.

BACKGROUND

Recently, multigate devices, which have gates that extend, partially or fully, around a channel to provide access to the channel on at least two sides, have been introduced to improve gate control. Multigate devices enable aggressive scaling down of IC technologies, maintaining gate control and mitigating short-channel effects (SCEs), while seamlessly integrating with conventional IC manufacturing processes. As multigate devices continue to scale, advanced techniques are needed for optimizing multigate device reliability and/or performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3R are fragmentary cross-sectional views of the multigate device of FIGS. 2A-2R, in portion or entirety, according to various aspects of the present disclosure.

FIGS. 5A-5C are fragmentary cross-sectional views of the multigate device of FIGS. 2A-2R, in portion or entirety, according to various aspects of the present disclosure.

FIGS. 6A-6C are fragmentary cross-sectional views of another multigate device, in portion or entirety, according to various aspects of the present disclosure.

FIGS. 7A-7C are fragmentary cross-sectional views of another multigate device, in portion or entirety, according to various aspects of the present disclosure.

DETAILED DESCRIPTION

Figure 1:
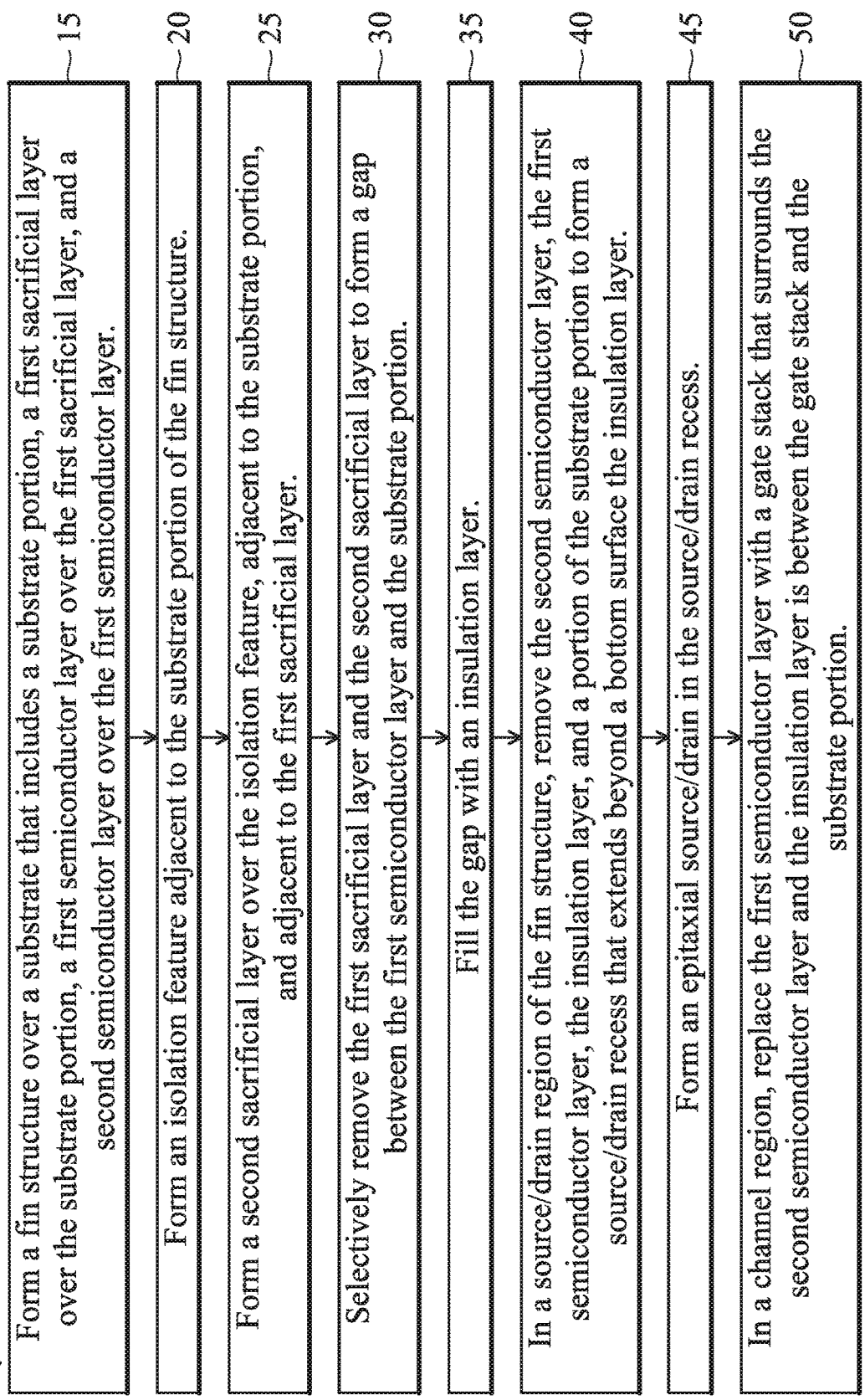
FIG. 1 is a flow chart of a method for fabricating a multigate device with improved bottom isolation according to various aspects of the present disclosure.

The present disclosure relates to integrated circuit devices, and more particularly, to isolation techniques for multigate devices, such as fin-like field-effect transistors (FETs), gate-all-around (GAA) FETs, other types of multigate devices, or combinations thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for case of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Multigate devices include a gate structure that extends, partially or fully, around a channel region to provide access to a channel region on at least two sides. One such multigate device is the gate-all around (GAA) device, which includes channel layers (regions) that are vertically or horizontally stacked and suspended in a manner over a substrate that allows a gate stack to wrap around (or surround) and engage the channel layers. The channel layers extend between a source region and a drain region (e.g., epitaxial source/drains), and voltage can be applied to the gate stack, the source region, and/or the drain region to control a flow of current between the source region and the drain region. GAA devices can significantly increase contact area between the gate stack and the channel regions, which has been observed to decrease subthreshold swing (SS), decrease short channel effects (SCEs), increase drive current, and/or improve channel control compared to other multigate devices, such as FinFETs.

However, leakage current of GAA devices has arisen as a significant challenge as integrated circuit (IC) technology nodes scale (i.e., by increasing device density (i.e., the number of interconnected devices in a given chip area) and/or decreasing geometry size (i.e., dimensions and/or sizes of device features and/or spacings therebetween)). For example, a parasitic transistor can form between the gate stack, an elevated portion of the substrate (over which the channel layers and gate stack are disposed), and the epitaxial source/drains, and current may undesirably flow/leak through the elevated portion of the substrate between the epitaxial source/drains. Since the gate stack wraps the elevated portion of the substrate in a conventional GAA device as opposed to surrounding it like the channel layers, the gate stack's control of the off-state leakage current in the elevated portion of the substrate is limited to three sides (e.g., tri-gate control), which has proved insufficient as IC technology nodes scale and has been observed to induce and/or exacerbate drain-induced-barrier-lowering (DIBL) in GAA devices.

Several approaches have been explored to reduce leakage current through the elevated portion of the substrate (hereinafter referred to as a mesa), such as reducing a height and/or other dimensions of the mesa, reducing dimensions of the channel layers, reducing depths (and thus volumes) of the epitaxial source/drains, covering the mesa with less conductive materials (e.g., configuring the epitaxial source/drains with bottom undoped epitaxial layers), forming antipunch through (APT) layers in the mesa, or combinations thereof. Though these approaches may reduce leakage current and/or DIBL, these approaches are limited by IC design and/or IC fabrication complexity and often degrade other electrical performance of the GAA device, for example, by increasing channel resistance ($R_{ch}$) and/or parasitic capacitance. Forming the GAA device on a semiconductor-on-insulator (SOI) substrate, such as a silicon-on-insulator substrate, is another approach to eliminating a current leakage path through the mesa. However, SOI substrates and corresponding fabrication thereof is cost-prohibitive.

The present disclosure thus proposes a bottom isolation technique (which can also be referred to as a bulk substrate isolation technique and/or a mesa isolation technique) that significantly reduces leakage current through a mesa with little to no effect on other electrical characteristics of a GAA device, such as channel resistance. GAA devices described herein have an insulation layer that electrically and physically isolates a gate stack from a semiconductor mesa extending from a bulk substrate. In a cross-sectional view of the GAA device along a length of the channel layers, the insulation layer is between the semiconductor mesa and the gate stack, the insulation layer is between the epitaxial source/drains, and the gate stack does not physically contact the semiconductor mesa. In a cross-sectional view of the GAA device along a width of the channel layers, the insulation layer wraps the semiconductor mesa, the insulation layer is between the semiconductor mesa and the gate stack, and the insulation layer is between the gate stack and isolation features (which are disposed over the substrate and adjacent to the semiconductor mesa). In some embodiments, the insulation layer is a dielectric layer, such as a silicon nitride layer. In some embodiments, the insulation layer is a low-k dielectric layer.

The insulation layer can substantially suppress and/or eliminate any parasitic transistor formed between the gate stack, epitaxial source/drains, and underlying semiconductor mesa, thereby reducing and/or blocking leakage current through the semiconductor mesa. Further, since the insulation layer isolates the semiconductor mesa from the gate stack, the semiconductor mesa is essentially grounded, the semiconductor mesa will not serve as a channel between epitaxial source/drains (and thus does not need to be controlled by the gate stack), and any leakage current flowing therethrough is negligible compared to conventional GAA devices (e.g., where the gate stack wraps the semiconductor mesa). GAA devices disclosed herein thus exhibit better off-state control and/or overall improved performance. Further, design of the channel layers and/or the gate stack can be configured independently of the semiconductor mesa. For example, dimensions of the channel layers and/or dimensions of the gate stack can be chosen without considering how such dimensions will reduce and/or negate mesa-related leakage current, such as where conventional GAA devices are designed with reduced-width channel layers to improve gate control and minimize effects of mesa-related leakage current.

The insulation layer can be formed by inserting a sacrificial layer between a bottommost semiconductor layer of a semiconductor layer stack, which is processed to form the channel layers, and a bulk substrate. The sacrificial layer is subsequently replaced with the insulation layer. A distance between a bottommost channel layer and the semiconductor mesa is increased by a thickness of the sacrificial layer/insulation layer, which correspondingly increases a step height between bottoms of the epitaxial source/drains and the bottommost channel layer. Increasing the step height allows for the epitaxial source/drains to have thicker undoped epitaxial portions without decreasing a volume of doped epitaxial portions of the epitaxial source/drains. In the GAA devices disclosed herein, the undoped portions cover sidewalls of the semiconductor mesa and sidewalls of the insulation layer, which reduces conductivity around the semiconductor mesa. Tops of the undoped portions are below the bottommost channel layer and above the insulation layer to optimize control of bottom leakage current without limiting a volume of the doped portions. The disclosed GAA devices can further implement an APT layer in the semiconductor mesa to further limit bottom leakage current, and a dopant concentration of the APT layer can be reduced compared to APT layers in conventional GAA devices, which can reduce out-diffusion of dopants and/or improve epitaxial material quality.

Parasitic capacitance can also arise between the substrate and/or mesa and the gate stack. For example, a capacitive element is intrinsically formed by the substrate/mesa (i.e., a first conductor), a gate electrode of the gate stack (i.e., a second conductor), and a gate dielectric of the gate stack (i.e., an insulator between the first conductor and the second conductor), which undesirably contributes bulk substrate-gate parasitic capacitance (CBG) to a GAA device. Capacitance is indirectly proportional to a distance between its conductors (i.e., capacitance decreases as distance between its conductors increases) and directly proportional to a dielectric constant of its insulator (i.e., capacitance decreases as a dielectric constant of its insulator decreases). GAA devices disclosed herein also reduce bulk substrate-gate parasitic capacitance by increasing a distance between the bulk substrate and the gate electrode of the gate stack and/or decreasing a dielectric constant of an insulator between the bulk substrate and the gate electrode of the gate stack. For example, adding the insulation layer between the semiconductor mesa and the gate stack increases a distance between the gate electrode of the gate stack and the bulk substrate, thereby reducing the bulk substrate-gate parasitic capacitance. In such example, an insulator of the capacitive element contributing the bulk substrate-gate parasitic capacitance is formed by the insulation layer and the gate dielectric, instead of the gate dielectric alone as in conventional GAA devices. Further, the insulation layer includes a dielectric material having a lower dielectric constant (e.g., a low-k dielectric layer) than the gate dielectric (e.g., a high-k dielectric layer), which decreases an overall dielectric constant of the insulator and thus further reduces bulk substrate-gate parasitic capacitance. In some embodiments, an air gap is formed within the insulation layer, which can further decrease the overall dielectric constant and correspondingly further reduce bulk substrate-gate parasitic capacitance.

Details of the proposed bottom isolation techniques for multigate devices and resulting multigate devices are described herein in the following pages. Different embodiments may have different advantages, and no particular advantage is required of any embodiment.

FIG. 1 is a flow chart of a method 10 for fabricating a multigate device with improved bottom isolation according to various aspects of the present disclosure. At block 15, method 10 includes forming a fin structure over a substrate. The fin structure includes a substrate portion, a first sacrificial layer over the substrate portion, a first semiconductor layer over the first sacrificial layer, and a second semiconductor layer over the first semiconductor layer. At block 20, method 10 includes forming an isolation feature adjacent to the substrate portion of the fin structure. At block 25, a second sacrificial layer is formed over the isolation feature. The second sacrificial layer is adjacent to the substrate portion and the first sacrificial layer. At block 30, method 10 includes selectively removing the first sacrificial layer and the second sacrificial layer to form a gap between the first semiconductor layer and the substrate portion. At block 35, the gap is filled with an insulation layer, such as a dielectric layer. At block 40, in a source/drain region of the fin structure, the second semiconductor layer, the first semiconductor layer, the insulation layer, and a portion of the substrate portion are removed to form a source/drain recess that extends beyond a bottom surface the insulation layer. At block 45, method 10 includes forming an epitaxial source/drain in the source/drain recess. At block 50, in a channel region of the fin structure, the first semiconductor layer is replaced with a gate stack. The gate stack surrounds the second semiconductor layer, and the insulation layer is between the gate stack and the substrate portion. FIG. 1 has been simplified for the sake of clarity to better understand the inventive concepts of the present disclosure. Additional steps can be provided before, during, and after method 10, and some of the steps described can be moved, replaced, or eliminated for additional embodiments of method 10.

Figures 2C, 2D:
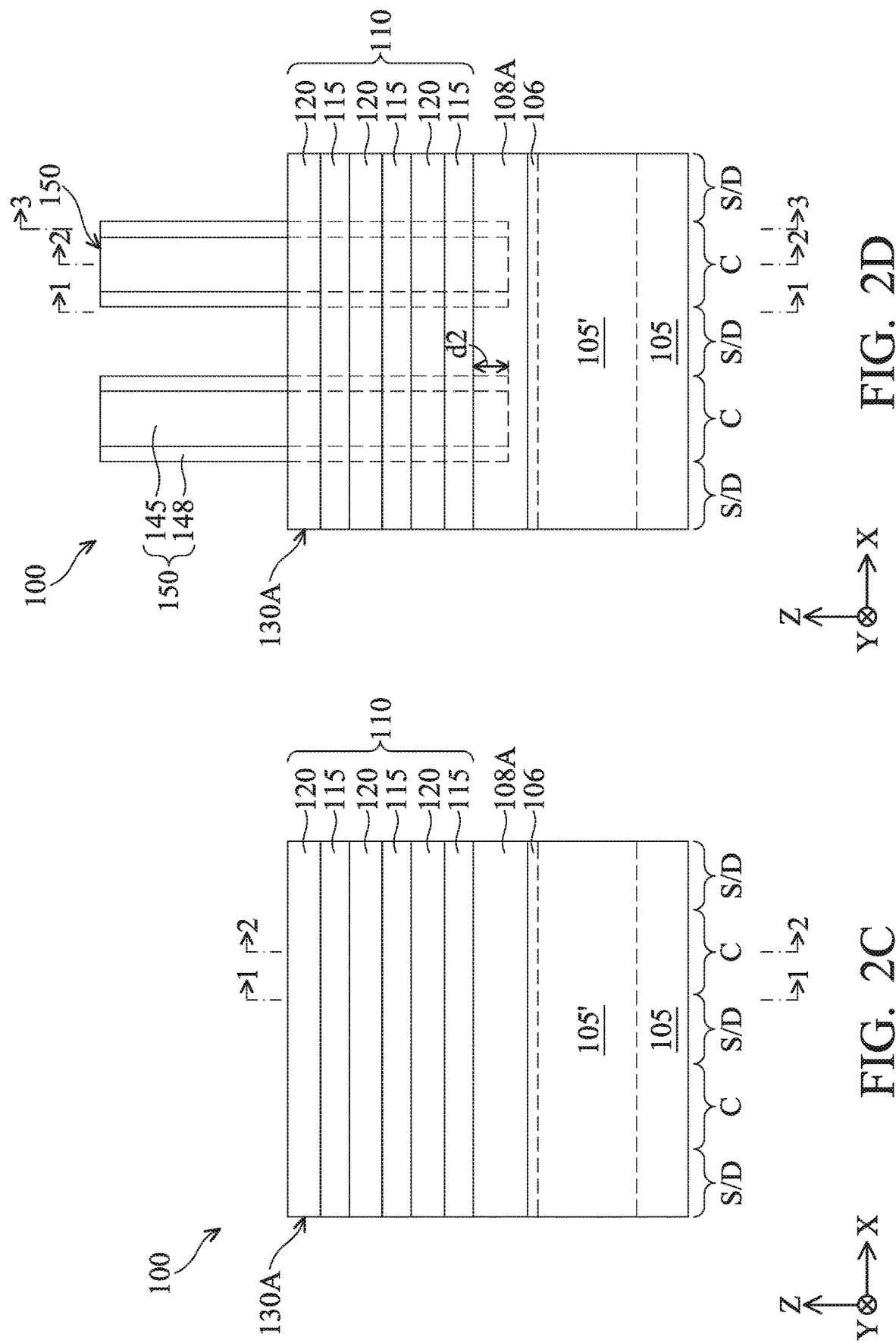
FIGS. 2A-2R are fragmentary cross-sectional views of a multigate device, in portion or entirety, at various fabrication stages, such as those associated with the method of FIG. 1, according to various aspects of the present disclosure.
Figure 4I:
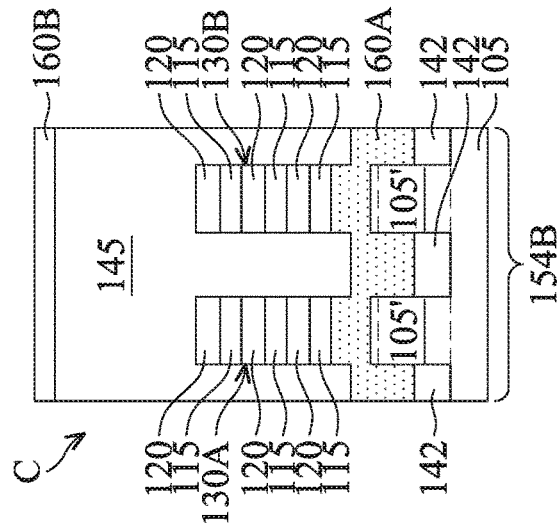
FIGS. 4A-4R are fragmentary cross-sectional views of the multigate device of FIGS. 2A-2R, in portion or entirety, according to various aspects of the present disclosure.
Figure 4J:
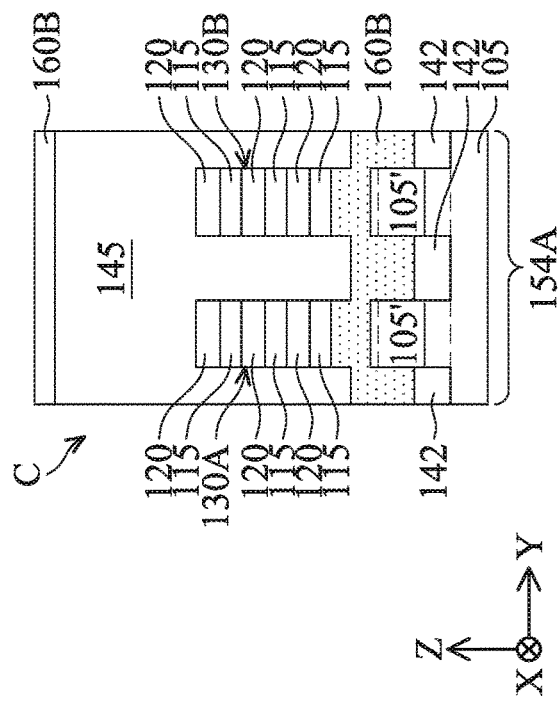
Figure 4K:
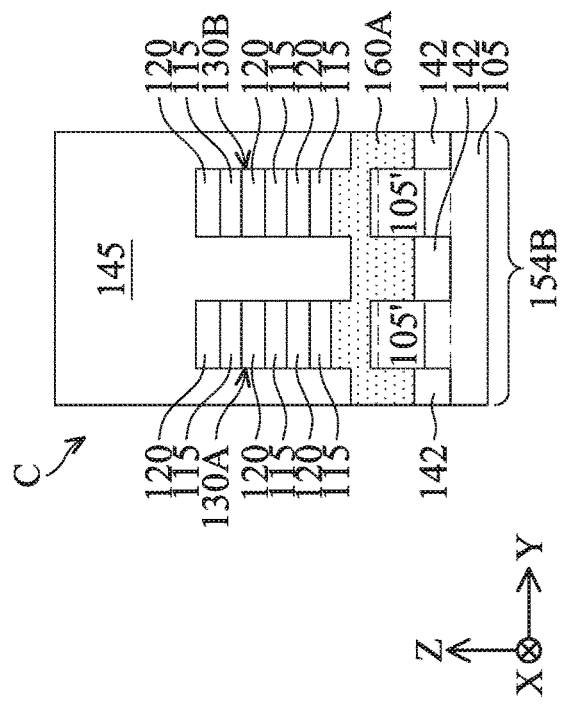
Figure 4L:
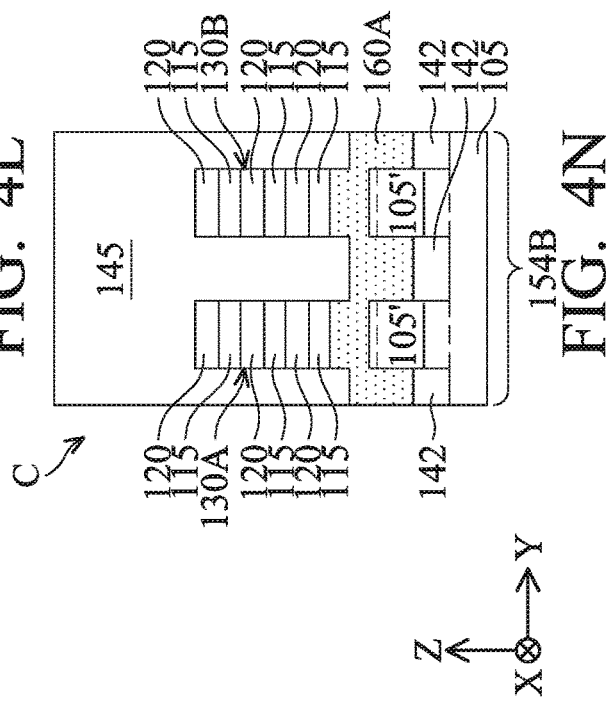
Figure 4M:
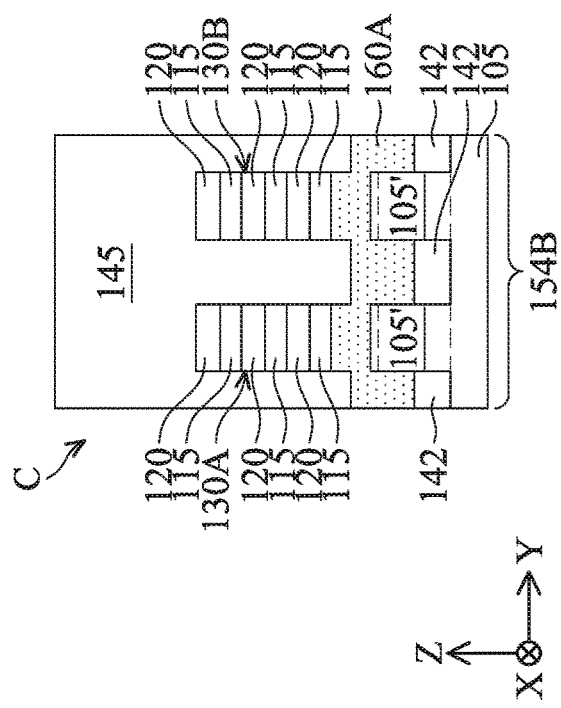
Figure 4N:
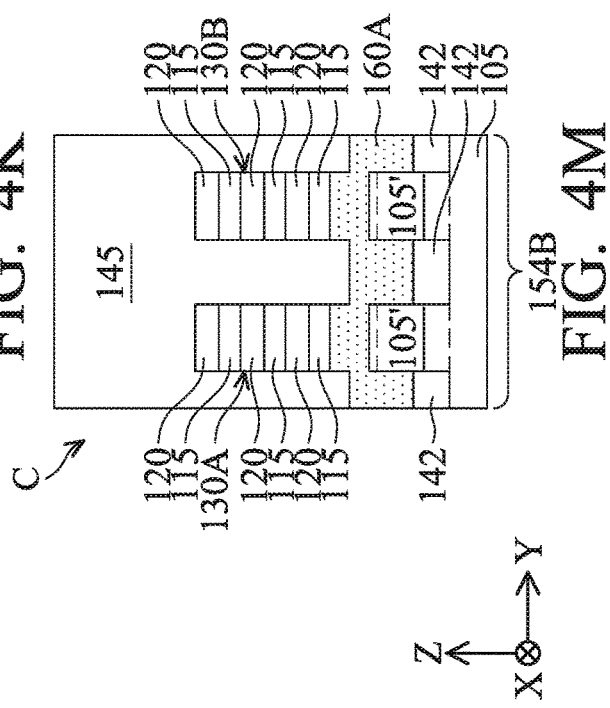
Figure 4P:
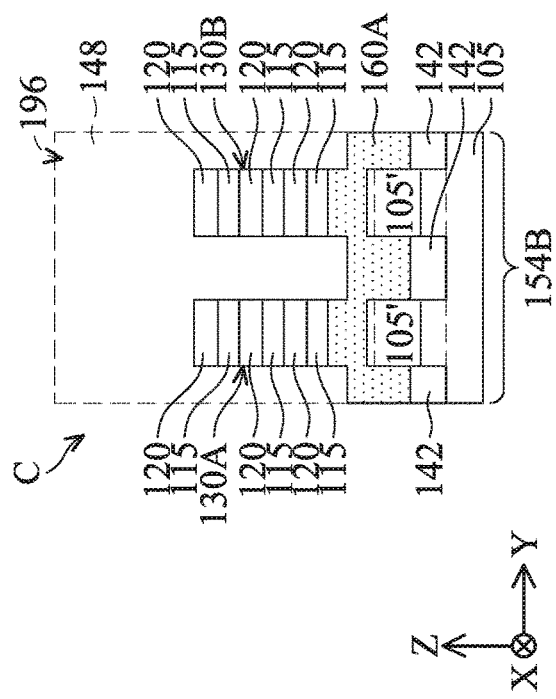
Figure 4R:
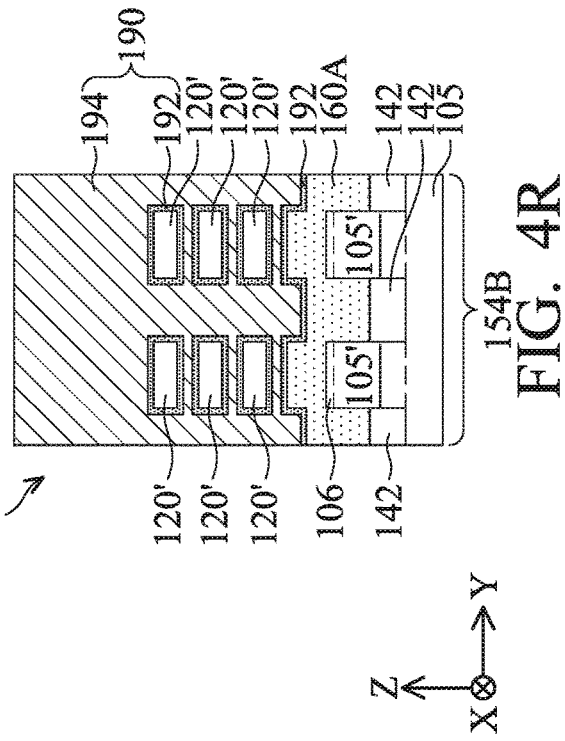

FIGS. 2A-2R, FIGS. 3A-3R, FIGS. 4A-4R, and FIGS. 5A-5C are fragmentary cross-sectional views of a multigate device 100, in portion or entirety, at various fabrication stages, such as those associated with method 10 in FIG. 1, according to various aspects of the present disclosure. FIGS. 3A-3R and FIGS. 4A-4R correspond with the fabrication stages of FIGS. 2A-2R, respectively. FIG. 5A corresponds with the fabrication stage of FIG. 2D, FIG. 5B corresponds with the fabrication stage of FIG. 2F, and FIG. 5C corresponds with the fabrication stage of FIG. 2H. FIGS. 3A-3D and FIGS. 4A-4D are taken along lines 1-1 and lines 2-2, respectively, of FIGS. 2A-2D; FIGS. 3E-3J are taken along lines 1-1 and lines 1'-1', respectively, of FIGS. 2E-2J; FIGS. 4E-4J are taken along lines 2-2 and lines 2'-2', respectively, of FIGS. 2E-2J; and FIGS. 3K-3R and FIGS. 4K-4R are taken along lines 1-1 and lines 2-2, respectively, of FIGS. 2K-2R. FIGS. 5A-5C are taken along lines 3-3 of FIG. 2D, FIG. 2F, and FIG. 2H, respectively. FIGS. 2A-2R are taken through multigate device 100 along a gate widthwise direction (i.e., metal gate x-cut views). FIGS. 3A-3R are taken (cut) through respective source/drain (S/D) regions of multigate device 100 along a gate lengthwise direction (i.e., source/drain y-cut views). FIGS. 4A-4R are taken through respective channel (C) regions of multigate device 100 along the gate lengthwise direction (i.e., channel y-cut views and/or metal gate y-cut views). FIGS. 5A-5C are taken through a gate spacer of a gate of multigate device 100 along the gate lengthwise direction. FIGS. 2A-2R, FIGS. 3A-3R, FIGS. 4A-4R, and FIGS. 5A-5C are discussed concurrently herein for case of description and understanding. FIGS. 2A-2R, FIGS. 3A-3R, FIGS. 4A-4R, and FIGS. 5A-5C have been simplified for the sake of clarity to better understand the inventive concepts of the present disclosure. Additional features can be added in multigate device 100, and some of the features described below can be replaced, modified, or eliminated in other embodiments of multigate device 100.

Multigate device 100 is fabricated to include at least one GAA transistor (i.e., a transistor having a gate that surrounds at least one suspended channel (for example, nanowires, nanosheets, nanobars, etc.), where the at least one suspended channel extends between epitaxial source/drains). Multigate device 100 may be configured with at least one p-type GAA transistor and/or at least one n-type GAA transistor. Multigate device 100 may be included in a microprocessor, a memory, other IC device, or combinations thereof. In some embodiments, multigate device 100 is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Turning to FIG. 2A, FIG. 3A, and FIG. 4A, multigate device 100 includes a substrate (wafer) 105. Substrate 105 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as silicon germanium (SiGe), GaAsP, AlInAs, AlGaAs, GaInAs, GaInP, GaInAsP, or combinations thereof; or combinations thereof. In the depicted embodiment, substrate 105 includes silicon. Substrate 105 can include various doped regions therein, such as p-type doped regions (e.g., p-wells), n-type doped regions (e.g., n-wells), or combinations thereof. N-wells include n-type dopants, such as phosphorus, arsenic, other n-type dopant, or combinations thereof. P-wells include p-type dopants, such as boron, indium, other p-type dopant, or combinations thereof. In some embodiments, doped regions formed in substrate 105 include a combination of p-type dopants and n-type dopants. The various doped regions can be formed directly on and/or in substrate 105, for example, to provide a p-well structure, an n-well structure, a dual-well structure, a raised structure, or combinations thereof. The various doped regions, such as p-wells and/or n-wells, are formed in substrate 105 by ion implantation processes, diffusion processes, other suitable doping processes, or combinations thereof.

An anti-punch through (APT) implantation process may be performed to form an anti-punch through (APT) layer 106 in substrate 105. APT layer 106 is a doped region in substrate 105 that is configured to prevent punch-through (i.e., prevent undesired merging of and/or negligible spacing between drain depletion regions and source depletion regions, where such can cause undesired conduction paths and/or leakage current between source/drains and thus impede switching functionality of a transistor) and/or unwanted dopant diffusion. In n-type regions of multigate device 100 (which correspond with n-channel devices having n-type source/drains disposed in a p-type substrate), APT layer 106 can include p-type dopants, such as boron and/or boron difluoride ($BF_2$). In p-type regions of multigate device 100 (which correspond with p-channel devices having p-type source/drains disposed in an n-type substrate), APT layer 106 can include n-type dopants, such as phosphorus and/or arsenic. Because the disclosed bottom isolation technique physically and electrically isolates a subsequently formed gate stack from substrate 105, a dopant concentration of APT layer 106 can be configured lower than a dopant concentration of an APT layer implemented in a conventional GAA device (i.e., where a gate stack directly contacts a bulk substrate). For example, a dopant concentration of APT layer 106 is less than about $1 \times 10^{14}$ cm$^{-3}$, and in some embodiments, is about $1 \times 10^{12}$ cm$^{-3}$ to about $1 \times 10^{14}$ cm$^{-3}$. Such a low APT dopant concentration may advantageously minimize junction leakage while preventing punch-through. APT layers having dopant concentrations greater than $1 \times 10^{15}$ cm$^{-3}$ may result in undesired out diffusion during subsequent processing, which can undesirably introduce dopants into semiconductor layers 120 (i.e., subsequently formed channels) and alter device characteristics, and/or provide inferior growth surfaces for subsequently formed epitaxial source/drains, which can degrade their quality.

A sacrificial layer 108A is over substrate 105, and a semiconductor layer stack 110 (including semiconductor layers 115 and semiconductor layers 120) is over sacrificial layer 108A. A composition of sacrificial layer 108A is different than a composition of semiconductor layers 115 and semiconductor layers 120, and a composition of semiconductor layers 115 is different than a composition of semiconductor layers 120. Composition differences between sacrificial layer 108A, semiconductor layers 115, and semiconductor layers 120 are configured and/or tuned to provide desired etching selectivity and/or different oxidation rates during subsequent processing. Composition differences include different materials, constituent atomic percentages, constituent weight percentages, thicknesses, and/or material characteristics that can provide etching selectivity to given etchants and/or different oxidation rates. Sacrificial layer 108A, semiconductor layers 115, and semiconductor layers 120 can include any combination of semiconductor materials that provides desired etching selectivity, desired oxidation rate differences, and/or desired performance characteristics (e.g., materials that maximize current flow), including any of the semiconductor materials disclosed herein.

In the depicted embodiment, sacrificial layer 108A and semiconductor layers 115 include the same material but different constituent atomic percentages to provide desired etching selectivity (i.e., sacrificial layer 108A can be etched with minimal to no etching of semiconductor layers 115 or vice versa), and semiconductor layers 115 and semiconductor layers 120 include different materials to provide desired etching selectivity and/or different oxidation rates. For example, sacrificial layer 108A includes silicon germanium having a first germanium concentration, semiconductor layers 115 include silicon germanium having a second germanium concentration, and semiconductor layers 120 include silicon. The first germanium concentration is greater than the second germanium concentration to provide high etch selectivity of sacrificial layer 108A over semiconductor layers 115 and semiconductor layers 120. For example, the first germanium concentration and the second germanium concentration are configured to provide an etch selectivity to a given etchant that is about 1:10 to about 1:50, so that the given etchant can etch/remove sacrificial layer 108A with minimal to no etching/removal of semiconductor layers 115. In some embodiments, sacrificial layer 108A has a germanium concentration that is greater than about 40 atomic percent (at %), and semiconductor layers 115 have a germanium concertation that is less than about 30 at %. For example, semiconductor layers 115 have a germanium concentration that is about 18 at % to about 25 at %. In such embodiments, etch rates of sacrificial layer 108A, semiconductor layers 115, and semiconductor layers 120 to a given etchant are different. In some embodiments, semiconductor layers 115 and semiconductor layers 120 include the same material but different constituent atomic percentages. For example, semiconductor layers 115 and semiconductor layers 120 include silicon germanium having different silicon atomic percentages and/or different germanium atomic percentages. In such embodiments, germanium atomic percentages of semiconductor layers 115 and semiconductor layers 120 are less than the germanium atomic percentage of sacrificial layer 108A.

Sacrificial layer 108A has a thickness t1 along the z-direction, semiconductor layers 115 have a thickness t2 along the z-direction, and semiconductor layers 120 have a thickness t3 along the z-direction. Thickness t1 is greater than thickness t2 and thickness t3, and thickness t2 and thickness t3 are the same or different. In some embodiments, thickness t1 is about 10 nm to about 20 nm. In some embodiments, thickness t2 is about 4 nm to about 8 nm. In some embodiments, thickness t3 is about 4 nm to about 8 nm. Semiconductor layers 115 and semiconductor layers 120 are stacked vertically (e.g., along the z-direction) in an interleaving and/or alternating configuration from a top surface of sacrificial layer 108A, and semiconductor layer stack 110 has a height h along the z-direction. In some embodiments, height h is about 50 nm to about 60 nm. In some embodiments, sacrificial layer 108A and semiconductor layer stack 110 are deposited over substrate 105 by epitaxially growing sacrificial layer 108A on substrate 105 and epitaxially growing semiconductor layers 115 and semiconductor layers 120 in the depicted interleaving and alternating configuration over sacrificial layer 108A. For example, a first one of semiconductor layers 115 is epitaxially grown on sacrificial layer 108A, a first one of semiconductor layers 120 is epitaxially grown on the first one of semiconductor layers 115, a second one of semiconductor layers 115 is epitaxially grown on the first one of semiconductor layers 120, and so on until semiconductor layer stack 110 has a desired number of semiconductor layers 115 and semiconductor layers 120 and/or semiconductor layer stack 110 has a desired height. In such embodiments, sacrificial layer 108A, semiconductor layers 115, and semiconductor layers 120 can be referred to as epitaxial layers.

Sacrificial layer 108A, semiconductor layers 115 and semiconductor layers 120 may be epitaxially grown by molecular beam epitaxy (MBE), chemical vapor deposition (CVD), metalorganic CVD (MOCVD), other suitable epitaxial growth process, or combinations thereof. In some embodiments, sacrificial layer 108A, semiconductor layers 115, and semiconductor layers 120 are formed by a selective CVD process, such as remote plasma CVD (RPCVD), which involves introducing a silicon-containing precursor and/or a germanium-containing precursor and a carrier gas into a process chamber. The silicon-containing precursor and/or the germanium-containing precursor interact with semiconductor surfaces of multigate device 100 to form sacrificial layer 108A, semiconductor layers 115, and semiconductor layers 120, respectively. The silicon-containing precursor includes $SiH_4$, $Si_2H_6$, DCS, $SiHCl_3$, $SiCl_4$, other suitable silicon-containing precursors, or combinations thereof. The germanium-containing precursor includes $GeH_4$, $Ge_2H_6$, $GeCl_4$, $GeCl_2$, other suitable germanium-containing precursors, or combinations thereof. The carrier gas may be an inert gas, such as $H_2$. In some embodiments, sacrificial layer 108A, semiconductor layers 115, and semiconductor layers 120 are epitaxially grown in a same process chamber and precursor characteristics are tuned to form sacrificial layer 108A, semiconductor layers 115, and semiconductor layers 120. For example, a silicon-containing precursor (e.g., $SiH_4$), a germanium-containing precursor (e.g., $GeH_4$), and a carrier precursor (e.g., $H_2$) are introduced into the process chamber when depositing sacrificial layer 108A and semiconductor layers 115, and the silicon-containing precursor and the carrier precursor are introduced into the process chamber when depositing semiconductor layers 120. A flow of the germanium-concentration precursor may be stopped when depositing semiconductor layers 120, and/or various parameters, such as a flow rate of the germanium-containing precursor, can be tuned to provide sacrificial layer 108A and semiconductor layers 115 with different germanium concentrations. In some embodiments, purging processes are performed between deposition of different semiconductor layers. For example, a purging process is performed between each deposition step to remove deposition gas/precursors of a preceding deposition step and any by-products therefrom from the process chamber before performing a subsequent deposition step, such as between depositing a respective semiconductor layer 115 and depositing a respective semiconductor layer 120 over the respective semiconductor layer 115.

In some embodiments, the selective CVD process introduces a dopant-containing precursor into the process chamber to facilitate in-situ doping of semiconductor layers 115 and/or semiconductor layers 120. The dopant-containing precursor includes boron (e.g., $B_2H_6$), phosphorous (e.g., $PH_3$), arsenic (e.g., $AsH_3$), other suitable dopant-containing precursors, or combinations thereof. In some embodiments, the selective CVD processes introduce an etchant-containing precursor into the process chamber to prevent or limit growth of silicon material and/or germanium material on dielectric surfaces and/or non-semiconductor surfaces. In such embodiments, parameters of the selective CVD processes are tuned to ensure net deposition of semiconductor material on semiconductor surfaces. The etchant-containing precursor includes $Cl_2$, HCl, other etchant-containing precursors that can facilitate desired semiconductor material (e.g., silicon and/or germanium) growth selectivity, or combinations thereof.

Turning to FIG. 2B, FIG. 3B, and FIG. 4B, semiconductor layer stack 110, sacrificial layer 108A, and substrate 105 are patterned to form fins, such as a fin 130A and a fin 130B, extending from substrate 105. Fin 130A and fin 130B each extend substantially parallel to one another along the x-direction, having a length in the x-direction, a width W1 in the y-direction, and a height in the z-direction. Fin 130A and fin 130B each include a substrate portion (i.e., a respective patterned, projecting portion of substrate 105, which can be referred to as a substrate extension 105', a fin portion of substrate 105, a substrate fin portion, an etched substrate portion, etc.), a sacrificial layer portion (i.e., a respective portion of sacrificial layer 108A) over the substrate portion, and a semiconductor layer stack portion (i.e., a respective portion of semiconductor layer stack 110) over the sacrificial layer portion. Fin 130A and fin 130B have a spacing S therebetween along the y-direction and a pitch P along the y-direction. A pitch generally refers to a sum of a width of the fins (e.g., width W1) and a spacing between directly adjacent fins (e.g., spacing S) (i.e., a lateral distance between edges of directly adjacent fins). In some embodiments, pitch P is about 60 nm to about 70 nm. In some embodiments, width W1 is about 20 nm to about 30 nm. In some embodiments, spacing S is about 30 nm to about 50 nm. In some embodiments, pitch is a lateral distance between centers of directly adjacent fins.

A lithography and/or etching process is performed to pattern semiconductor layer stack 110, sacrificial layer 108A, and substrate 105. The lithography process can include forming a resist layer over semiconductor layer stack 110 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 110, sacrificial layer 108A, and substrate 105 using the patterned resist layer as an etch mask. In some embodiments, the patterned resist layer is formed over a mask layer disposed over semiconductor layer stack 110, a first etching process removes portions of the mask layer to form a patterning layer (i.e., a patterned hard mask layer), and a second etching process removes portions of semiconductor layer stack 110, sacrificial layer 108A, and substrate 105 using the patterning layer as an etch mask. The etching process can include a dry etch, a wet etch, other suitable etch, or combinations thereof. After the etching process, the patterned resist layer is removed, for example, by a resist stripping process or other suitable process.

In some embodiments, fin 130A and fin 130B are formed by a multiple patterning process, such as a double patterning lithography (DPL) process (e.g., a lithography-etch-lithography-etch (LELE) process, a self-aligned double patterning (SADP) process, a spacer-is-dielectric (SID) process, other double patterning process, or combinations thereof), a triple patterning process (e.g., a lithography-etch-lithography-etch-lithography-etch (LELELE) process, a self-aligned triple patterning (SATP) process, other triple patterning process, or combinations thereof), and/or other multiple patterning process (e.g., self-aligned quadruple patterning (SAQP) process). Such processes can also provide fin 130A and fin 130B each with a respective semiconductor layer stack 110, a respective sacrificial layer 108A, and a respective substrate extension 105'. In some embodiments, directed self-assembly (DSA) techniques are implemented while patterning the various layers that form fin 130A and fin 130B.

Trenches 140 are between and/or surrounding fin 130A and fin 130B, and isolation features 142 are formed in trenches 140. Isolation features 142 fill lower portions of trenches 140 and surround portions of fin 130A and fin 130B. Portions of fin 130A and fin 130B that extend from top surfaces of isolation features 142 may be referred to as fin active regions. Isolation features 142 electrically isolate active device regions and/or passive device regions. For example, isolation features 142 separate and electrically isolate fin 130A and fin 130B, fin 130A from other device regions and/or devices of multigate device 100, and fin 130B from other device regions and/or devices of multigate device 100. Isolation features 142 include silicon oxide, silicon nitride, silicon oxynitride, other suitable isolation material (for example, including silicon, oxygen, nitrogen, carbon, or other suitable isolation constituent), or combinations thereof. Isolation features 142 may have a multilayer structure. For example, isolation features 142 can include a bulk dielectric (e.g., an oxide layer) over a dielectric liner (including, for example, silicon nitride, silicon oxide, silicon oxynitride, silicon oxycarbonitride, or combinations thereof). In another example, isolation features 142 include a dielectric layer over a doped liner, such as a boron silicate glass (BSG) liner and/or a phosphosilicate glass (PSG) liner. Dimensions and/or characteristics of isolation features 142 are configured to provide shallow trench isolation (STI) structures, deep trench isolation (DTI) structures, local oxidation of silicon (LOCOS) structures, other suitable isolation structures, or combinations thereof. In the depicted embodiment, isolation features 142 are STIs.

Isolation features 142 can be formed by depositing a liner layer (e.g., a dielectric layer) over multigate device 100 that partially fills trenches 140, depositing an oxide material over multigate device 100 (in particular, over the liner layer) that fills remainders of trenches 140, and performing a planarization process. The planarization process, such as a chemical mechanical polishing (CMP) process, is performed until reaching and exposing a planarization stop layer, such as semiconductor layers 120. In some embodiments, the planarization process removes mask layers, any of the liner layer, any of the oxide material, or combinations thereof that are above and/or over top surfaces of fin 130A and fin 130B. Remainders of the liner layer and the oxide material form liners and bulk dielectrics, respectively, of isolation features 142. The dielectric liner may cover sidewalls of trenches 140 (formed by sidewalls of fin 130A and fin 130B) and bottoms of trenches 140 (formed by substrate 105). The liner layer is formed by atomic layer deposition (ALD), CVD, physical vapor deposition (PVD), high density plasma CVD (HDPCVD), MOCVD, RPCVD, PECVD, LPCVD, atomic layer CVD (ALCVD), atmospheric pressure CVD (APCVD), sub-atmospheric CVD (SACVD), other suitable methods, or combinations thereof. The oxide material is formed by flowable CVD (FCVD), a high aspect ratio deposition (HARP) process, HDPCVD, other suitable process, or combinations thereof. In some embodiments, an annealing process is performed when forming isolation features 142.

Isolation features 142 are then recessed and/or etched back, such that fin 130A and fin 130B protrude from isolation features 142. In the depicted embodiment, isolation features 142 are etched back until isolation features 142 are a target distance (or depth) below sacrificial layers 108A, such as a distance d1 along the z-direction. Distance d1 is between bottom surfaces of sacrificial layers 108A and top surfaces of isolation features 142. In some embodiments, distance d1 is about 5 nm to about 20 nm. In such embodiments, a height of isolation features 142 along the z-direction is less than a height of substrate extensions 105' along the z-direction (e.g., relative to a top surface of substrate 105). In some embodiments, an etching process selectively removes isolation features 142 with respect to semiconductor layers of fin 130A and fin 130B. In other words, the etching process substantially removes isolation features 142 but does not remove, or does not substantially remove, semiconductor layers 120, semiconductor layers 115, sacrificial layers 108A, and substrate extensions 105'. For example, an etchant is selected for the etch process that etches dielectric materials (e.g., isolation features 142) at a higher rate than semiconductor materials (e.g., semiconductor layers 120, semiconductor layers 115, sacrificial layers 108A, and substrate extensions 105'). The etching process is a dry etch, a wet etch, other suitable etching process, or combinations thereof. In some embodiments, the etching process removes mask layers of fin 130A and fin 130B. In some embodiments, mask layers of fin 130A and fin 130B function as etch masks during the etching process.

Turning to FIG. 2C, FIG. 3C, and FIG. 4C, sacrificial layers 108B are formed over isolation features 142. Sacrificial layers 108B have a thickness t4 along the z-direction. Thickness t4 is greater than distance d1 to ensure that sacrificial layers 108B overlap (overlay) sacrificial layers 108A so that sacrificial layers 108B and sacrificial layers 108A combine to form a continuous sacrificial layer 108 along the y-direction as depicted in FIG. 3C and FIG. 4C. Sacrificial layers 108A and sacrificial layers 108B thus share interfaces 144, and an overlap ov between sacrificial layers 108A and sacrificial layers 108B corresponds with a dimension of interfaces 144 along the z-direction (e.g., length). In some embodiments, thickness t4 is about 20 nm to about 30 nm. Overlap ov is less than or equal to thickness t1 to ensure that sacrificial layers 108B are below bottommost semiconductor layers 115. In the depicted embodiment, overlap ov is less than thickness t1 of sacrificial layers 108A, and a distance d2 along the z-direction is between top surfaces of sacrificial layers 108A and top surfaces of sacrificial layers 108B. In some embodiments, overlap ov is about 10 nm to about 15 nm. In some embodiments, distance d2 is less than about 5 nm. In some embodiments, thickness t4 is less than a sum of distance d1 and distance d2 but greater than distance d1 so that sidewalls of substrate extensions 105' are covered by sacrificial layers 108B and isolation features 142.

A composition of sacrificial layers 108B is different than the composition of semiconductor layers 115 and the composition of semiconductor layers 120. Composition differences between sacrificial layers 108B, sacrificial layers 108A, semiconductor layers 115, and semiconductor layers 120 are configured to provide desired etching selectivity during subsequent processing. Composition differences include different materials, constituent atomic percentages, constituent weight percentages, thicknesses, and/or material characteristics that provide etching selectivity to a given etchant. In some embodiments, sacrificial layers 108B and sacrificial layers 108A include the same material with the same constituent atomic percentages, such as silicon germanium having the same germanium concentration. In some embodiments, sacrificial layers 108B and sacrificial layers 108A include the same material but with different constituent atomic percentages, such as silicon germanium having different germanium concentrations. In such embodiments, a germanium concentration of sacrificial layers 108B is greater a germanium concentration of semiconductor layers 115 to provide high etch selectivity of sacrificial layers 108B over semiconductor layers 115 and semiconductor layers 120 but is different than a germanium concentration of sacrificial layers 108A. In some embodiments, sacrificial layers 108B have a germanium concentration that is greater than about 40 at %. The germanium concentration of sacrificial layers 108B can be greater than or less than the germanium concentration of sacrificial layers 108A. In some embodiments, sacrificial layer 108A includes crystalline semiconductor material (e.g., crystalline silicon germanium), and sacrificial layers 108B include crystalline semiconductor material (e.g., crystalline silicon germanium having a different germanium percentage than sacrificial layer 108A) or amorphous semiconductor material (e.g., amorphous silicon germanium having a different germanium percentage than sacrificial layer 108A). In some embodiments, the germanium concentrations of sacrificial layers 108A and sacrificial layers 108B are tuned and/or chosen to based on pattern density, which can reduce etching loading effects. In some embodiments, sacrificial layers 108B and sacrificial layers 108A include different materials.

Sacrificial layers 108B can be formed by depositing a semiconductor material (e.g., silicon germanium having a germanium concentration greater than about 40 at %) over multigate device 100 that fills remainders of trenches 140 and then recessing and/or etching back the semiconductor material until the semiconductor material is below bottommost semiconductor layers 115. In some embodiments, the semiconductor material is etched back until sacrificial layers 108B have a target thickness (e.g., thickness t4), a target distance/depth (e.g., distance d2) below bottommost semiconductor layers 115, a target overlap between sacrificial layers 108A and sacrificial layers 108B (e.g., overlap ov), or combinations thereof. The semiconductor material can be deposited by ALD, CVD, PVD, HDPCVD, MOCVD, RPCVD, PECVD, LPCVD, ALCVD, APCVD, SACVD, other suitable deposition methods, or combinations thereof. In some embodiments, the semiconductor material is deposited by a blanket deposition process. The recessing and/or etching back can be a dry etch, a wet etch, other etching process, or combinations thereof. In some embodiments, the etching back is a selective etching process, such as described below with reference to FIG. 2F, FIG. 2H, FIG. 3F, FIG. 3H, FIG. 4F, and FIG. 4H. In some embodiments, to minimize and/or prevent removal of sacrificial layer 108A, the etching back is an anisotropic etch (for example, configured to remove material in the z-direction with minimal (to no) material removal in the x-direction and/or the y-direction. In some embodiments, distance d2 is about 0 nm to about 1 nm to minimize and/or prevent removal of sacrificial layer 108A. In some embodiments, before the etching back, a planarization process, such as CMP, is performed until reaching and exposing a planarization stop layer, such as semiconductor layers 120 of fin 130A and fin 130B. In some embodiments, the planarization process removes mask layers above and/or over top surfaces of fin 130A and fin 130B.

Turning to FIG. 2D, FIG. 3D, FIG. 4D, and FIG. 5A, dummy gates 145 are formed over portions of fin 130A and fin 130B and gate spacers 148 are formed adjacent to (i.e., along sidewalls of) dummy gates 145, thereby forming gate structures 150. Dummy gates 145 extend lengthwise in a direction that is different than (e.g., orthogonal to) the lengthwise direction of fin 130A and fin 130B. For example, dummy gates 145 extend substantially parallel to one another along the y-direction, having a length in the y-direction, a width in the x-direction, and a height in the z-direction. Dummy gates 145 are disposed over channel regions of multigate device 100 and between source/drain regions of multigate device 100. In the X-Z plane (FIG. 2D), dummy gates 145 are disposed over top surfaces of respective channel regions of fin 130A and fin 130B, such that dummy gates 145 interpose respective source/drain regions of fin 130A and fin 130B. In the Y-Z plane in channel regions of multigate device 100 (FIG. 4D and FIG. 5A), dummy gates 145 and gate spacers 148 are disposed on tops and sidewalls of fin 130A and fin 130B, such that dummy gates 145 wrap fin 130A and fin 130B. Dummy gates 145 and gate spacers 148 fill trenches 140 in channel regions. Because sacrificial layers 108A are between substrate extensions 105' and semiconductor layer stacks 110 of fin 130A and fin 130B and sacrificial layers 108B are over isolation features 142 and connected to sacrificial layers 108A, gate structures 150 (i.e., dummy gates 145 and gate spacers 148) do not physically contact substrate 105 and/or substrate extensions 105'. For example, gate structures 150 are separated from substrate 105 and/or substrate extensions 105' by sacrificial layer 108. Further, gate structures 150 extend vertically beyond semiconductor layer stacks 110. For example, gate structures 150 extend distance d2 along the z-direction below bottommost semiconductor layers 115 of semiconductor layer stacks 110 (FIG. 2D, FIG. 4D, and FIG. 5A).

Each of dummy gates 145 can include a stack of layers, such as a dummy gate dielectric, a dummy gate electrode, and a hard mask. The dummy gate dielectric includes a dielectric material, such as silicon oxide. The dummy gate electrode includes a suitable dummy gate material, such as polysilicon. The hard mask includes a suitable hard mask material, such as silicon nitride. In some embodiments, dummy gates 145 include numerous other layers, such as capping layers, interface layers, diffusion layers, barrier layers, or combinations thereof. Dummy gates 145 are formed by deposition processes, lithography processes, etching processes, other suitable processes, or combinations thereof. For example, a first deposition process forms a dummy gate dielectric layer over multigate device 100, a second deposition process forms a dummy gate electrode layer over the dummy gate dielectric layer, and a third deposition process forms a hard mask layer over the dummy gate electrode layer. The first, second, and third deposition processes include CVD, PVD, ALD, RPCVD, PECVD, HDPCVD, FCVD, HARP, LPCVD, ALCVD, APCVD, SACVD, MOCVD, plating, other suitable methods, or combinations thereof. A lithography patterning process and an etching process, such as those described herein, are then performed to pattern the hard mask layer, the dummy gate electrode layer, and the dummy gate dielectric layer. For example, the hard mask layer and the dummy gate electrode layer are removed from source/drain regions of multigate device 100, thereby forming dummy gate 145 having the dummy gate dielectric, the dummy gate electrode, and the hard mask in channel regions but not source/drain regions of fin 130A and fin 130B, such as depicted in FIG. 2D, FIG. 3D, and FIG. 4D. In some embodiments, the dummy gate dielectric layer is not removed from source/drain regions of multigate device 100 by the lithography patterning process and the etching process. In such embodiments, the dummy gate dielectric may span channel regions and source/drain regions of multigate device 100.

Gate spacers 148 are formed by any suitable process and include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, silicon oxycarbonitride, or combinations thereof). For example, a dielectric layer including silicon and nitrogen, such as a silicon nitride layer, is deposited over multigate device 100 and etched to form gate spacers 148. In some embodiments, gate spacers 148 include a multilayer structure, such as a first dielectric layer that includes silicon nitride and a second dielectric layer that includes silicon oxide. In some embodiments, gate spacers 148 include more than one set of spacers, such as seal spacers, offset spacers, sacrificial spacers, dummy spacers, main spacers, or combinations thereof. In such embodiments, the various sets of spacers can include different materials having different etch rates. For example, a silicon oxide layer can be deposited and etched to form a first spacer set adjacent to sidewalls of dummy gates 145, and a silicon nitride layer can be deposited and etched to form a second spacer set adjacent to the first spacer set. In some embodiments, fin spacers may be formed adjacent to (i.e., along sidewalls of) fin 130A and fin 130B in source/drain regions while forming gate spacers 148 and may include the same materials and/or layers as gate spacers 148. In some embodiments, fin spacers include different materials and/or layers than gate spacers 148.

Turning to FIG. 2E, FIG. 3E, and FIG. 4E, a lithography process is performed to form a patterned mask layer 152 (i.e., a hard mask and/or an etch mask). Patterned mask layer 152 covers a region 154A of multigate device 100, such as an n-type device region, and exposes a region 154B of multigate device 100, such as a p-type device region. For example, patterned mask layer 152 covers a respective gate structure 150, respective portions of fin 130A and fin 130B, and respective portions of substrate 105 in region 154A, while an opening 155 in patterned mask layer 152 exposes a respective gate structure 150, respective portions of fin 130A and fin 130B, and respective portions of substrate 105 in region 154B. In some embodiments, patterned mask layer 152 is a patterned resist layer. In some embodiments, patterned mask layer 152 is a patterned antireflective coating layer. In some embodiments, patterned mask layer 152 includes multiple layers. For example, patterned mask layer 152 may include a patterned resist layer disposed over a patterned bottom antireflective coating (BARC) layer.

The lithography process can include forming a resist layer over multigate device 100 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. The patterned resist layer includes a resist pattern that covers region 154A and exposes region 154B, thereby providing patterned mask layer 152.

Turning to FIG. 2F, FIG. 3F, FIG. 4F, and FIG. 5B, sacrificial layers 108A and sacrificial layers 108B are removed from region 154B to form gap 156 (also referred to as a void or an air gap). In the X-Z plane in region 154B (FIG. 2F), gap 156 extends continuously along the x-direction, and top surfaces of substrate extensions 105' are separated from (and thus does not physically contact) bottommost semiconductor layers 115 and gate structures 150. In the Y-Z plane in the source/drain regions of region 154B (FIG. 3F), gap 156 extends continuously along the y-direction, gap 156 exposes top surfaces of isolation features 142, the top surfaces of substrate extensions 105' are separated from (and thus do not physically contact) bottommost semiconductor layers 115. In the Y-Z plane in the channel regions of region 154B (FIG. 4F and FIG. 5B), gap 156 extends continuously along the y-direction and the top surfaces of substrate extensions 105' are separated from (and thus do not physically contact) bottommost semiconductor layers 115, dummy gates 145, and gate spacers 148. Accordingly, in region 154B, semiconductor layer stacks 110 float above substrate extensions 105' and portions of gate structures 150 (i.e., dummy gates 145 and gate spacers 148) float above substrate extensions 105' and isolation features 142. Portions of gap 156 between bottommost semiconductor layers 115 and substrate extensions 105' have a spacing s1 along the z-direction (FIG. 2F, FIG. 3F, FIG. 4F, and FIG. 5B). Portions of gap 156 between gate structures 150 (i.e., dummy gates 145 and gate spacers 148) and isolation features 142 have a spacing s2 along the z-direction (FIG. 4F and FIG. 5B). Portions of gap 156 between gate structures 150 and substrate extensions 105' have a spacing s3 along the z-direction (FIG. 2F, FIG. 4F, and FIG. 5B).

Spacing s1 is about equal to thickness t1 of sacrificial layers 108A, and spacing s2 is about equal to thickness t4 of sacrificial layers 108B. It is noted that thickness t1 is configured to ensure that spacing s1 is large enough to allow a subsequently deposited insulating material to fill gap 156 while considering subsequent epitaxial source/drain growth. For example, if thickness t1 of sacrificial layers 108A is less than 10 nm, gaps formed by removing sacrificial layers 108A, such as gap 156, may be too thin, making it difficult to fill the gaps with an insulating material. However, if thickness t1 of sacrificial layers 108A is greater than 10 nm, sacrificial layers 108A may induce larger than desirable strain into fin 130A and fin 130B, which can cause defects when forming sacrificial layers 108B, and/or insulation layers that replace sacrificial layers 108A, such as insulation layers 160A, may form a larger than desirable portion of subsequently formed source/drain recesses, which can negatively impact subsequent epitaxial source/drains (e.g., by causing discontinuities therein). It is further noted that thickness t4 is configured to provide spacing s2 and spacing s3 (which corresponds with overlap ov) that are large enough to allow a subsequently deposited insulating material to wrap substrate extensions 105' and cover sidewalls thereof, so that subsequently formed insulation layers can sufficiently reduce bulk substrate-gate capacitance, while considering subsequent channel release and gate replacement processing. For example, if thickness t4 of sacrificial layers 108B is less than 20 nm, portions of substrate extensions 105' may be covered by dummy gates 145 and thus subsequently formed gate stacks will not be physically isolated from substrate extensions 105'. However, if thickness t4 of sacrificial layers 108B is greater than 30 nm, subsequently formed insulation layers may extend along sidewalls of semiconductor layer stacks 110, which can increase complexity of replacing semiconductor layers 115 with a gate stack (i.e., channel release and gate replacement). In some embodiments, spacing s2 is greater than spacing s1. Spacing s3 is less than spacing s1 and spacing s2. In some embodiments, spacing s3 is about equal to overlap ov between sacrificial layers 108A and sacrificial layers 108B. In some embodiments, spacing s3 is a difference between thickness t1 (or spacing s1) and distance d2.

Sacrificial layers 108A and sacrificial layers 108B are removed from region 154B by any suitable process. In some embodiments, an etching process selectively removes sacrificial layers 108A and sacrificial layers 108B with respect to substrate extensions 105', semiconductor layers 115, semiconductor layers 120, isolation features 142, dummy gates 145, gate spacers 148, other device features, or combinations thereof. In other words, the etching process substantially removes sacrificial layer 108 but does not remove, or does not substantially remove, substrate extensions 105', semiconductor layers 115, semiconductor layers 120, isolation features 142, dummy gates 145, and gate spacers 148. For example, an etchant is selected for the etch process that etches silicon germanium having a germanium concentration greater than about 40 at % (e.g., sacrificial layers 108A and sacrificial layers 108B) at a higher rate than silicon germanium having a germanium concentration less than 30 at % (e.g., semiconductor layers 115), silicon (e.g., semiconductor layers 120 and substrate extensions 105'), polysilicon (e.g., dummy gates 145), and dielectric materials (e.g., isolation features 142 and gate spacers 148).

The etching process is a dry etch, a wet etch, other etching process, or combinations thereof. Various etch parameters are tuned to control selective etching of sacrificial layer 108, such as etch gas composition, carrier gas composition, etch gas flow rate, carrier gas flow rate, etch solution composition, etch time, etch pressure, etch temperature, source power, radio frequency (RF) and/or direct current (DC) bias voltage, RF and/or DC bias power, other etch parameters, or combinations thereof. In some embodiments, the etching process is a wet etch that utilizes an etching solution that includes HF, $CH_3COOH$, $H_2O_2$, $HNO_3$, tetramethylammonium hydroxide (TMAH), tetraethylammonium hydroxide (TEAH), $NH_4OH$, KOH, other suitable wet etchant constituent, or combinations thereof to selectively remove sacrificial layer 108. A concentration of constituents of the etching solution, an etch temperature, an etch time (i.e., how long submersed in the etching solution), or combinations thereof are tuned to achieve desired etch selectivity. In some embodiments, the etching process is a multistep etch process, such as a dry etch followed by a wet etch, which can improve etch efficiency. In such embodiments, the dry etch can utilize an etch gas that includes HCl, $CF_4$, $C_4F_8$, $NF_3$, $NH_3$, other suitable etch gas precursor for selectively removing silicon germanium, or combinations thereof. An etch gas flow rate, an etch pressure, a concentration of constituents of the etching solution, an etch temperature, an etch time, or combinations thereof are tuned to achieve desired etch selectivity. In some embodiments, the etching process may slightly remove portions of sacrificial layer 108 under patterned mask layer 152, such as where an etch time is tuned to ensure complete removal of sacrificial layer 108 from region 154B. In such embodiments, as depicted in FIG. 2F, the etching process may partially etch sacrificial layer 108A in region 154A, such that sacrificial layer 108A in region 154A has a curved surface, such as a concave surface 158, and gap 156 slightly, laterally extends from region 154B into region 154A and under patterned mask layer 152. After the etching process, patterned mask layer 152 is removed, for example, by a resist stripping process or other suitable process. In some embodiments, patterned mask layer 152 is partially removed by the etching process.

Turning to FIG. 2G, FIG. 3G, and FIG. 4G, an insulation layer 160A is deposited over multigate device 100 by ALD, CVD, PVD, RPCVD, PECVD, HDPCVD, FCVD, HARP, LPCVD, ALCVD, APCVD, SACVD, MOCVD, other suitable method, or combinations thereof. In region 154B, insulation layer 160A fills gap 156. Insulation layer 160A is between semiconductor layer stacks 110 (in particular, bottommost semiconductor layers 115) and substrate extensions 105', gate structures 150 and substrate extensions 105', and gate structures 150 and isolation features 142. Where gap 156 extends into region 154A, insulation layer 160A also extends slightly, laterally into region 154A. In embodiments where sacrificial layers 108A have concave surface 158, insulation layer 160A has a convex surface 162 that interfaces with concave surface 158 (i.e., insulation layer 160A and sacrificial layer 108A have a curved interface). In some embodiments, to ensure adequate filling of spacing s1, spacing s2 (which is greater than spacing s1), and spacing s3 (which is less than spacing s1) of gap 156, insulation layer 160A is deposited by ALD or FCVD, both of which have excellent gap fill capabilities. Insulation layer 160A also covers top surfaces of semiconductor layer stacks 110 (in particular, top surfaces of topmost semiconductor layers 120) (FIG. 2G), tops and sidewalls of gate structures 150 (FIG. 2G and FIG. 4G), and tops and sidewalls of semiconductor layer stacks 110 (FIG. 3G). In the source/drain regions (FIG. 3G), insulation layer 160A surrounds semiconductor layer stacks 110 of fin 130A and fin 130B in region 154B and wraps semiconductor layer stacks 110 of fin 130A and fin 130B in region 154A. Further, in region 154A (FIG. 3G), insulation layer 160A covers portions of sidewalls of sacrificial layers 108A not overlapped by sacrificial layers 108B and top surfaces of sacrificial layers 108B.

Insulation layer 160A includes a material that can electrically isolate substrate extensions 105' from bottommost semiconductor layers 115 and/or gate structures 150. For example, insulation layer 160A is a dielectric layer. In the depicted embodiment, insulation layer 160A includes silicon and nitrogen, such as silicon nitride (SiN), silicon carbonitride (SiCN), silicon oxynitride (SiON), silicon oxycarbonitride (SiCON), other silicon-and-nitrogen containing dielectric material, or combinations thereof. In some embodiments, insulation layer 160A includes silicon and carbon, such as silicon carbide (SiC), carbon-doped silicon oxide (SiCO), other silicon-and-carbon containing dielectric material, or combinations thereof. In some embodiments, insulation layer 160A includes a low-k dielectric material, such as fluorosilicate glass (FSG), carbon-doped oxide, porous carbon-doped oxide, Black Diamond® (Applied Materials of Santa Clara, California), xerogel, aerogel, amorphous fluorinated carbon, parylene, benzocyclobutene (BCB), SiLK (Dow Chemical, Midland, Michigan), polyimide, other low-k dielectric material including those described herein, or combinations thereof.

Turning to FIG. 2H, FIG. 3H, FIG. 4H, and FIG. 5C, a trimming process is performed on insulation layer 160A to expose semiconductor layer stacks 110 of fin 130A and fin 130B in source/drain regions. In region 154A, the trimming process removes insulation layer 160A from tops of semiconductor layer stacks 110, sidewalls of semiconductor layer stacks 110, sidewalls of sacrificial layers 108A, and tops of sacrificial layers 108B. In region 154B, the trimming process removes insulation layer 160A from tops of semiconductor layer stacks 110, sidewalls of semiconductor layer stacks 110, sidewalls of substrate extensions 105', and tops of isolation features 142. Accordingly, after the trimming process, region 154A no longer includes insulation layer 160A, such that sacrificial layers 108A and sacrificial layers 108B are exposed therein. In region 154B, insulation layers 160A are between bottommost semiconductor layers 115 and substrate extensions 105' (FIG. 2H and FIG. 3H) and between gate structures 150 and isolation features 142 (FIG. 2H and FIG. 4H). For example, insulation layers 160A have a thickness t5 between bottommost semiconductor layers 115 and substrate extensions 105' in fin 130A and fin 130B, and insulation layers 160A have a thickness t6 between gate structures 150 and isolation features 142. Thickness t5 is about equal to spacing s1 and/or thickness t1 of sacrificial layers 108A. In some embodiments, thickness t5 is about 10 nm to about 20 nm. Thickness t6 is about equal to spacing s2 (and/or thickness t4 of sacrificial layers 108B). In some embodiments, thickness t6 is about 20 nm to about 30 nm. A distance d3 is between tops of substrate extensions 105' and bottoms of gate structures 150 (FIG. 2H and FIG. 4H). Distance d3 is about equal to spacing s3. In some embodiments, distance d3 is about equal to overlap ov. In some embodiments, distance d3 is a difference between thickness t5 and distance d2. In some embodiments, distance d3 is about 10 nm to about 15 nm.

Insulation layer 160A is trimmed by any suitable process. In some embodiments, an etching process selectively removes insulation layer 160A with respect to substrate extensions 105', sacrificial layers 108A, sacrificial layers 108B, semiconductor layers 115, semiconductor layers 120, isolation features 142, dummy gates 145, gate spacers 148, other device features, or combinations thereof. In other words, the etching process substantially removes insulation layer 160A but does not remove, or does not substantially remove, substrate extensions 105', sacrificial layers 108A, sacrificial layers 108B, semiconductor layers 115, semiconductor layers 120, isolation features 142, dummy gates 145, and gate spacers 148. For example, an etchant is selected for the etch process that etches silicon-and-nitrogen containing dielectric material (e.g., insulation layers 160A) at a higher rate than other dielectric materials (e.g., isolation features 142 and gate spacers 148), semiconductor materials (e.g., substrate extensions 105', sacrificial layers 108A, sacrificial layers 108B, semiconductor layers 115, and semiconductor layers 120), and polysilicon (e.g., dummy gates 145). In another example, an etchant is selected for the etch process that etches silicon-and-carbon containing dielectric material at a higher rate than other dielectric materials, semiconductor materials, and polysilicon. In another example, an etchant is selected for the etch process that etches low-k dielectric material at a higher rate than other dielectric, semiconductor materials, and polysilicon. The etching process is a dry etch, a wet etch, other suitable etching process, or combinations thereof. In some embodiments, the etching process is an anisotropic etch process having a vertical etch rate that is greater than a horizonal etch rate. In some embodiments, the horizonal etch rate is about zero. The anisotropic etch process can thus remove material in the vertical direction (i.e., the z-direction) with minimal to no material removal in the horizontal direction (i.e., the x-direction and/or the y-direction). Various etch parameters are tuned to control direction and/or selectivity of the etching process, such as etch gas composition, carrier gas composition, etch gas flow rate, carrier gas flow rate, etch solution composition, etch time, etch pressure, etch temperature, source power, RF and/or DC bias voltage, RF an/or DC bias power, other etch parameters, or combinations thereof.

Further processing in FIG. 2H, FIG. 3H, FIG. 4H, and FIG. 5C includes removing sacrificial layers 108A and sacrificial layers 108B from region 154A, thereby forming gap 166 in region 154A. In the X-Z plane in region 154A (FIG. 2H), gap 166 extends continuously along the x-direction, and top surfaces of substrate extensions 105' are separated from (and thus does not physically contact) bottommost semiconductor layers 115 and gate structures 150. Gap 166 also exposes convex surface 162 of insulator layer 160A. In the Y-Z plane in the source/drain regions of region 154A (FIG. 3H), gap 166 extends continuously along the y-direction, gap 166 exposes top surfaces of isolation features 142, and the top surfaces of substrate extensions 105' are separated from (and thus do not physically contact) bottommost semiconductor layers 115. In the Y-Z plane in the channel regions of region 154A (FIG. 4H), gap 166 extends continuously along the y-direction, and the top surfaces of substrate extensions 105' are separated from (and thus do not physically contact) bottommost semiconductor layers 115 and dummy gates 145. Accordingly, in region 154A, semiconductor layer stacks 110 float above substrate extensions 105' and portions of gate structures 150 float above substrate extensions 105' and isolation features 142. Similar to gap 156 formed in region 154B, portions of gap 166 between bottommost semiconductor layers 115 and substrate extensions 105' have spacing s1, portions of gap 166 between dummy gates 145 and isolation features 142 have spacing s2, and portions of gap 166 between gate structures 150 and substrate extensions 105' have spacing s3.

Sacrificial layer 108 is removed from region 154A by any suitable process. In some embodiments, an etching process selectively removes sacrificial layers 108A and sacrificial layers 108B with respect to substrate extensions 105', semiconductor layers 115, semiconductor layers 120, isolation features 142, dummy gates 145, gate spacers 148, insulation layers 160A, other device features, or combinations thereof. In other words, the etching process substantially removes sacrificial layer 108 from region 154A but does not remove, or does not substantially remove, substrate extensions 105', semiconductor layers 115, semiconductor layers 120, isolation features 142, dummy gates 145, gate spacers 148, and insulation layers 160A. For example, an etchant is selected for the etch process that etches silicon germanium having a germanium concentration greater than about 40 at % (e.g., sacrificial layers 108A and sacrificial layers 108B) at a higher rate than silicon germanium having a germanium concentration less than 30 at % (e.g., semiconductor layers 115), silicon (e.g., semiconductor layers 120 and substrate extensions 105'), polysilicon (e.g., dummy gates 145), and dielectric materials (e.g., isolation features 142, gate spacers 148, and insulation layers 160A). The etching process is a dry etch, a wet etch, other suitable etching process, or combinations thereof. Various etch parameters are tuned to control selective etching of sacrificial layers 108A and sacrificial layers 108B, such as etch gas composition, carrier gas composition, etch gas flow rate, carrier gas flow rate, etch solution composition, etch time, etch pressure, etch temperature, source power, RF and/or DC bias voltage, RF an/or DC bias power, other etch parameters, or combinations thereof. In some embodiments, the etching process is a dry etch that utilizes an etch gas that includes HCl, $CF_4$, $C_4F_8$, $NF_3$, $NH_3$, other suitable etch gas precursor for selectively removing silicon germanium, or combinations thereof, where an etch gas flow rate, an etch pressure, an etch temperature, an etch time, or combinations thereof are tuned to achieve desired etch selectivity.

In some embodiments, trimming insulation layer 160A and removing sacrificial layer 108 separate, distinct processes. For example, a first etching process trims insulation layer 160A in region 154A and region 154B and a second etching process removes sacrificial layer 108. In some embodiments, trimming insulation layers 160A and removing sacrificial layer 108 are a single process, such as an etching process that uses an etchant that can substantially remove insulation layers 160A, sacrificial layers 108A, and sacrificial layers 108B with minimal to no removal of semiconductor layers 115, semiconductor layers 120, substrate extensions 105', dummy gates 145, isolation features 142, and gate spacers 148. In some embodiments, removing sacrificial layer 108 includes, before performing the etching process, forming a patterned mask layer over multigate device 100 that covers region 154B and exposes region 154A. The patterned mask layer may be configured and/or formed like patterned mask layer 152. In such embodiments, the patterned mask layer is removed after the etching process.

Turning to FIG. 2I, FIG. 3I, and FIG. 4I, an insulation layer 160B is deposited over multigate device 100 by ALD, CVD, PVD, RPCVD, PECVD, HDPCVD, FCVD, HARP, LPCVD, ALCVD, APCVD, SACVD, MOCVD, other suitable method, or combinations thereof. Insulation layer 160B fills gap 166. Insulation layer 160B is between semiconductor layer stacks 110 (in particular, bottommost semiconductor layers 115) and substrate extensions 105', gate structures 150 and substrate extensions 105', and gate structures 150 and isolation features 142. In embodiments where insulation layers 160A have convex surfaces 162, insulation layer 160B has concave surfaces that interface with convex surfaces 162, such that insulation layer 160B and insulation layers 160A have curved interfaces 168. In some embodiments, to ensure adequate filling of spacing s1, spacing s2, and spacing s3 of gap 166, insulation layer 160B is deposited by ALD or FCVD. Insulation layer 160B also covers top surfaces of semiconductor layer stacks 110 (in particular, top surfaces of topmost semiconductor layers 120) (FIG. 2I), tops and sidewalls of gate structures 150 (FIG. 2I and FIG. 4I), and tops and sidewalls of semiconductor layer stacks 110 (FIG. 3I). In the source/drain regions (FIG. 3I), insulation layer 160B surrounds semiconductor layer stacks 110 of fin 130A and fin 130B in region 154A and wraps semiconductor layer stacks 110 of fin 130A and fin 130B in region 154B. Further, in region 154B (FIG. 3I), insulation layer 160B covers sidewalls of insulation layers 160A and portions of sidewalls of substrate extensions 105' that are not covered by isolation features 142.

Insulation layer 160B includes a material that can electrically isolate substrate extensions 105' from bottommost semiconductor layers 115 and/or gate structures 150. Insulation layer 160B can include the same material or a different material than insulation layers 160A. In the depicted embodiment, insulation layer 160B and insulation layers 160A include the same dielectric material. Using the same material for insulation layer 160B and insulation layers 160A can improve uniformity. For example, insulation layer 160B and insulation layers 160A are dielectric layers that include silicon and nitrogen, such as SiN, SiCN, SiON, SiCON, other silicon-and-nitrogen containing dielectric material, or combinations thereof. In some embodiments, insulation layer 160B includes silicon and carbon, such as SiC, SiCO, other silicon-and-carbon containing dielectric material, or combinations thereof. In some embodiments, insulation layer 160B includes a low-k dielectric material.

Turning to FIG. 2J, FIG. 3J, and FIG. 4J, a trimming process is performed on insulation layer 160B to expose semiconductor layer stacks 110 of fin 130A and fin 130B in source/drain regions. The trimming process removes insulation layer 160B from tops of semiconductor layer stacks 110, sidewalls of semiconductor layer stacks 110, sidewalls of substrate extensions 105', and tops of isolation features 142. Accordingly, after the trimming process, region 154B no longer includes insulation layer 160B, while in region 154A, insulation layers 160B are between bottommost semiconductor layers 115 and substrate extensions 105' (FIG. 2J, FIG. 3J, and FIG. 4J) and between gate structures 150 and isolation features 142 (FIG. 2J and FIG. 4J). For example, in region 154A, fin 130A and fin 130B include insulation layers 160B having a thickness t7 between bottommost semiconductor layers 115 and substrate extensions 105', and insulation layers 160B have a thickness 18 between gate structures 150 and isolation features 142. Thickness t7 is about equal to spacing s1 (and/or thickness t1 of sacrificial layers 108A), and thickness t8 is about equal to spacing s2 (and/or thickness t4 of sacrificial layers 108B). Thickness t7 can be equal to, less than, or greater than thickness t5, and thickness 18 can be equal to, less than, or greater than thickness t6. In some embodiments, thickness t7 is about 10 nm to about 20 nm. In some embodiments, thickness 18 is about 20 nm to about 30 nm. A distance d4 is between tops of substrate extensions 105' and bottoms of gate structures 150 (FIG. 2J and FIG. 4J). Distance d4 is about equal to spacing s3. Distance d4 can be equal to, less than, or greater than distance d3. In some embodiments, distance d4 is about equal to overlap ov. In some embodiments, distance d4 is a difference between thickness t5 and distance d2. In some embodiments, distance d4 is about 10 nm to about 15 nm.

Insulation layer 160B is trimmed by any suitable process. In some embodiments, an etching process selectively removes insulation layer 160B with respect to substrate extensions 105', semiconductor layers 115, semiconductor layers 120, isolation features 142, dummy gates 145, gate spacers 148, other device features, or combinations thereof. In other words, the etching process substantially removes insulation layer 160B but does not remove, or does not substantially remove, substrate extensions 105', semiconductor layers 115, semiconductor layers 120, isolation features 142, dummy gates 145, and gate spacers 148. For example, an etchant is selected for the etch process that etches silicon-and-nitrogen containing dielectric material (e.g., insulation layer 160B) at a higher rate than other dielectric materials (e.g., isolation features 142 and gate spacers 148), semiconductor materials (e.g., substrate extensions 105', semiconductor layers 115, and semiconductor layers 120), and polysilicon (e.g., dummy gates 145). In another example, an etchant is selected for the etch process that etches silicon-and-carbon containing dielectric material at a higher rate than other dielectric materials, semiconductor materials, and polysilicon. In another example, an etchant is selected for the etch process that etches low-k dielectric material at a higher rate than other dielectric materials, semiconductor materials, and polysilicon. The etching process is a dry etch, a wet etch, other suitable etching process, or combinations thereof. In some embodiments, the etching process is an anisotropic etch process having a vertical etch rate that is greater than a horizonal etch rate, and the anisotropic etch process is configured to remove material in the vertical direction with minimal (to no) material removal in the horizontal direction. In some embodiments, the horizonal etch rate is about zero. Various etch parameters are tuned to control direction and/or selectivity of the etching process, such as etch gas composition, carrier gas composition, etch gas flow rate, carrier gas flow rate, etch solution composition, etch time, etch pressure, etch temperature, source power, RF and/or DC bias voltage, RF an/or DC bias power, other etch parameters, or combinations thereof.

Turning to FIG. 2K, FIG. 3K, and FIG. 4K, source/drain recesses 170 are formed in source/drain regions of multigate device 100. For example, in source/drain regions, an etching process removes semiconductor layer stacks 110, insulation layers 160A, insulation layers 160B, and some, but not all, of substrate extensions 105'. To ensure high quality growth of epitaxial source/drains, the etching process is performed until source/drain recesses 170 extend beyond insulation layers 160A and/or insulation layers 160B and expose substrate extensions 105', such that source/drain recesses 170 have bottoms formed by semiconductor surfaces, from which epitaxial material can readily grow. Substrate extensions 105' (i.e., semiconductor surfaces, such as silicon surfaces) provide a better epitaxial growth surface than insulation layers 160A and/or insulation layers 160B (i.e., dielectric surfaces). In FIG. 2K, source/drain recesses 170 extend a distance (depth) d5 below semiconductor layer stacks 110 (in particular, bottommost semiconductor layers 115) in channel regions. Depth d5 is greater than or equal to thickness t5 and/or thickness t7 to ensure exposure of semiconductor extension 105'. In some embodiments, distance d5 is about 15 nm to about 30 nm. Because portions of substrate extensions 105' in channel regions are covered and protected during the etching process, substrate extensions 105' have recessed portions in source/drain regions and non-recessed portions in channel regions. Portions of the non-recessed portions in channel regions, which are above the recessed portions of substrate extensions 105' in source/drain regions, are designated as mesas 105" (also referred to as substrate mesas, semiconductor mesas, mounds, extensions, or combinations thereof). In the X-Z plane (FIG. 2K), each source/drain recess 170 has a bottom formed by substrate extensions 105' and sidewalls formed by semiconductor layer stacks 110 (e.g., semiconductor layers 115 and semiconductor layers 120), insulation layers 160A and/or insulation layers 160B, and mesas 105". In the Y-Z plane (FIG. 3K), each source/drain recess 170 has a bottom formed by substrate extensions 105'. In the depicted embodiment, top surfaces of source/drain recesses 170 are above top surfaces of isolation features 142. In some embodiments, top surfaces of source/drain recesses 170 are below top surfaces of isolation features 142 or at the same height of top surfaces of isolation features 142 relative to the top surface of substrate 105.

The source/drain etching process can include a dry etch, a wet etch, other suitable etching process, or combinations thereof. In some embodiments, the etching process is a multistep etch process. For example, the etching process may alternate etchants to separately and alternately remove semiconductor layers 115, semiconductor layers 120, insulation layers 160A and/or insulation layers 160B, substrate extensions 105', or combinations thereof. In some embodiments, parameters of the etching process are configured to selectively etch semiconductor layer stacks 110 and/or substrate extensions 105' with minimal (to no) etching of gate structures 150 (i.e., dummy gates 145 and gate spacers 148). In some embodiments, parameters of the etching process are configured to selectively etch insulation layers 160A and/or insulation layers 160B with minimal (to no) etching of gate structures 150, semiconductor layer stacks 110, substrate extensions 105, or combinations thereof. In some embodiments, a lithography process, such as those described herein, is performed to form a patterned mask layer that covers gate structures 150, and the etching process uses the patterned mask layer as an etch mask.

Turning to FIG. 2L, FIG. 3L, and FIG. 4L, inner spacers 172 are formed under gate structures 150 (e.g., under gate spacers 148). Inner spacers 172 separate semiconductor layers 120 from one another, separate bottommost semiconductor layer 120 from insulation layer 160B in region 154A, separate bottommost semiconductor layer 120 from insulation layer 160A in region 154B, and abut sidewalls of semiconductor layers 115 under dummy gates 145. Inner spacers 172 have a width W2 along the x-direction. In some embodiments, width W2 is about 3 nm to about 8 nm. Inner spacers 172 include a dielectric material that includes silicon, oxygen, carbon, nitrogen, other suitable material, or combinations thereof (for example, silicon oxide, silicon nitride, silicon oxynitride, silicon carbide, silicon oxycarbonitride, or combinations thereof). In the depicted embodiment, inner spacers 172 include a silicon-and-carbon containing dielectric material, such as SiOC and/or SiOCN. In some embodiments, the spacer layer includes a low-k dielectric material, such as those described herein. In some embodiments, the dielectric material includes dopants (e.g., p-type dopants and/or n-type dopants).

In some embodiments, forming inner spacers 172 includes a first etching process, a deposition process, and a second etching process. The first etching process selectively etches semiconductor layers 115 exposed by source/drain recesses 170 with minimal (to no) etching of semiconductor layers 120, substrate extensions 105', mesas 105", gate structures 150, insulation layers 160A, insulation layers 160B, other device features, or combinations thereof. The first etching process thus forms gaps between semiconductor layers 120, gaps between bottommost semiconductor layers 120 and insulation layers 160B in region 154A, and gaps between bottommost semiconductor layers 120 and insulation layers 160A in region 154B. The gaps are under gate spacers 148, such that portions of semiconductor layers 120 are suspended under gate spacers 148 and separated from one another, insulation layers 160A, insulation layers 160B, or combinations thereof by the gaps. In some embodiments, the gaps extend slightly, laterally under dummy gates 145. The first etching process is configured to laterally etch (e.g., along the x-direction and/or the y-direction) semiconductor layers 115, thereby reducing lengths of semiconductor layers 115. The first etching process is a dry etch, a wet etch, other suitable etching process, or combinations thereof. In some embodiments, the first etching process is an anisotropic etch process having a horizontal etch rate that is greater than a vertical etch rate (in some embodiments, the vertical etch rate equals zero). The anisotropic etch process can thus remove material in the horizontal direction (i.e., the x-direction and/or the y-direction) with minimal (to no) material removal in the vertical direction (i.e., the z-direction).

The deposition process forms a spacer layer over gate structures 150 and over features forming source/drain recesses 170 (e.g., substrate extensions 105', mesas 105", semiconductor layers 115, semiconductor layers 120, insulation layers 160A, insulation layers 160B, or combinations thereof). The deposition process can include CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills source/drain recesses 170. The deposition process is configured to ensure that the spacer layer fills the gaps between semiconductor layers 120, bottommost semiconductor layers 120 and insulation layers 160B, and bottommost semiconductor layers 120 and insulation layers 160A. The spacer layer (and thus inner spacers 172) includes a material that is different than a material of semiconductor layers 120, a material of substrate extensions 105' and mesas 105", a material of gate structures 150, or combinations thereof to achieve etching selectivity during the second etching process. The material of the spacer layer may also be different than a material of insulation layers 160A and/or a material of insulation layers 160B to ensure minimal (to no) etching of insulation layers 160A and/or insulation layers 160B during the second etching process.

After deposition, the second etching process selectively etches the spacer layer to form inner spacers 172, which fill the gaps, with minimal (to no) etching of semiconductor layers 120, substrate extensions 105', mesas 105", gate structures 150, insulation layers 160A, insulation layers 160B, or combinations thereof. In some embodiments, the second etching process completely removes the spacer layer from substrate extensions 105' in the source/drain regions to ensure source/drain recesses 170 have bottoms formed by semiconductor surfaces, from which epitaxial source/drains can be subsequently grown. The second etching process is a dry etch, a wet etch, other suitable etching process, or combinations thereof.

Figure 2N:
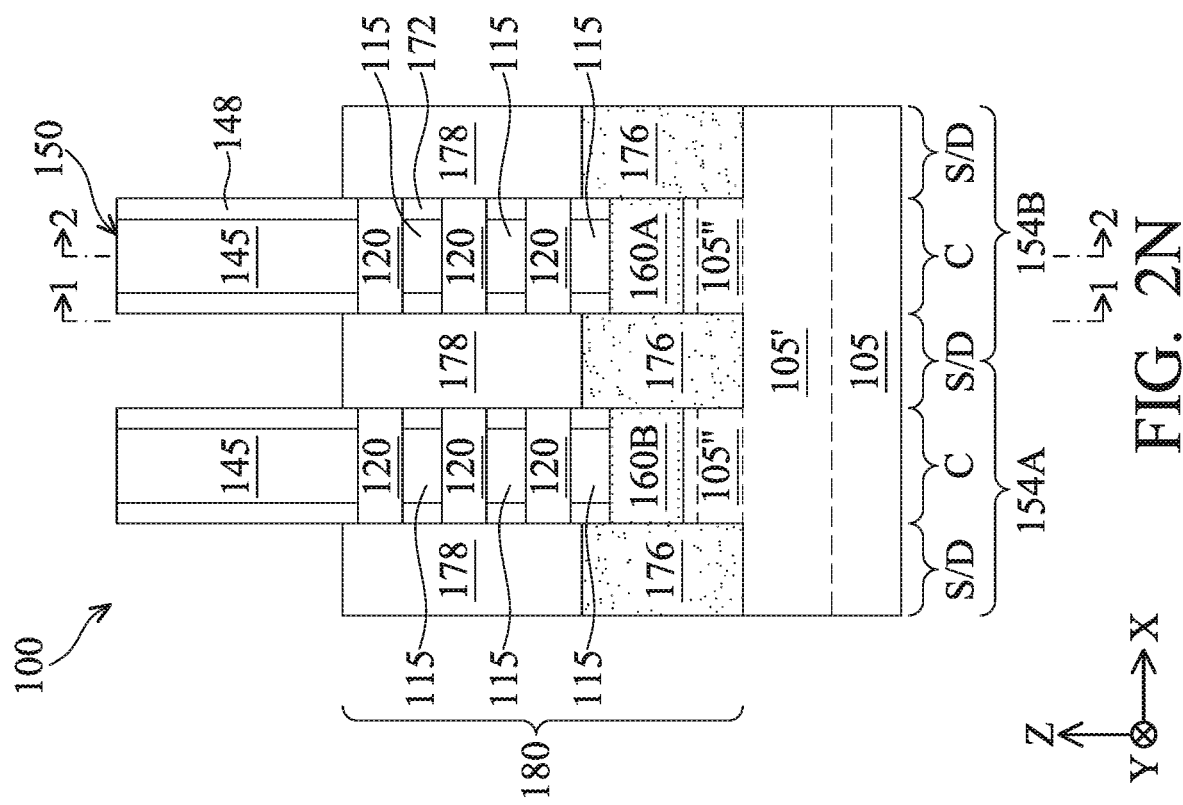
Figure 2M:
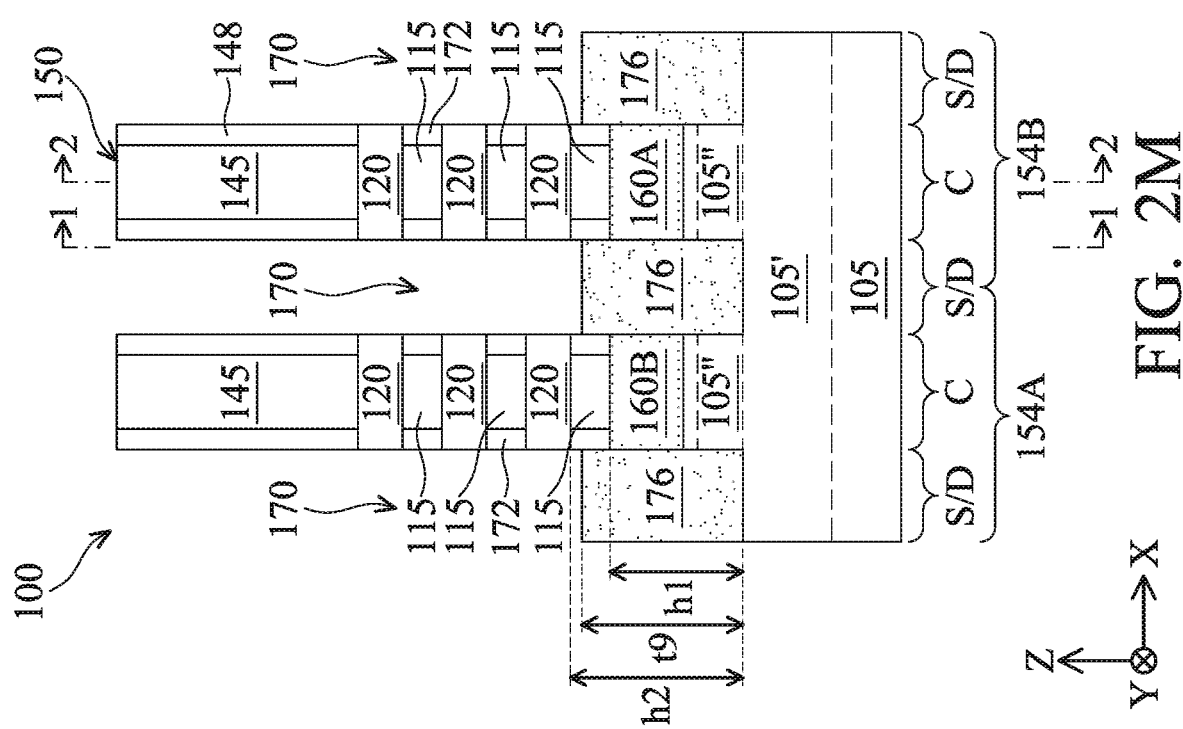

Turning to FIG. 2M, FIG. 3M, and FIG. 4M, undoped or unintentionally doped (UID) epitaxial layers 176 are formed in source/drain recesses 170. Undoped epitaxial layers 176 are substantially free of dopants. Undoped epitaxial layers 176 include silicon, germanium, silicon germanium, other suitable semiconductor materials, or combinations thereof. In the depicted embodiment, undoped epitaxial layers 176 include silicon that is substantially free of n-type dopants and p-type dopants or silicon germanium that is substantially free of n-type dopants and p-type dopants. For purposes of the present disclosure, semiconductor materials having dopant concentrations less than about $1 \times 10^{16}$ cm$^{-3}$ are considered undoped and/or UID. Undoped epitaxial layers 176 have a thickness 19 along the z-direction between tops thereof and bottoms of source/drain recesses 170 (which are formed by surfaces of recessed portions of substrate extensions 105'). Thickness 19 is greater than a height h1 of top surfaces of insulation layers 160A/insulation layers 160B above bottoms of source/drain recesses 170 and less than a height h2 of bottommost semiconductor layers 120 (i.e., bottom surfaces thereof) above bottoms of source/drain recesses 170. Accordingly, undoped epitaxial layers 176 are below bottommost semiconductor layers 120, which will provide channel layers of multigate device 100. In some embodiments, thickness t9 is about 20 nm to about 30 nm. If thickness t9 is less than 20 nm, undoped epitaxial layers 176 may not adequately isolate sidewalls of mesas 105", such that leakage current may arise in mesa 105" under insulation layers 160A/insulation layers 160B. In some embodiments, thickness t9 less than 20 nm exposes sidewalls of mesas 105", and doped epitaxial layers subsequently formed in source/drain recesses 170 undesirably cover and/or physically contact mesas 105". If thickness is greater than 30 nm, undoped epitaxial layers 176 may fully or partially cover sidewalls of bottommost semiconductor layers 120, which degrades and/or prevents bottommost semiconductor layers 120 as serving as channels for multigate device 100. In some embodiments, height h1 is about equal to distance d5. In some embodiments, height h1 is about 15 nm to about 30 nm.

Turning to FIG. 2N, FIG. 3N, and FIG. 4N, epitaxial layers 178 are formed over undoped epitaxial layers 176 in source/drain recesses 170. Epitaxial layers 178 fill source/drain recesses 170, such that epitaxial layers 178 and undoped epitaxial layers 176 combine to form epitaxial source/drains 180. Epitaxial layers 178 cover sidewalls of semiconductor layers 120 (FIG. 2N). Epitaxial layers 178 include silicon, germanium, silicon germanium, other suitable semiconductor materials, or combinations thereof. Epitaxial layers 178 are doped with n-type dopants and/or p-type dopants. In some embodiments, a dopant concentration of epitaxial layers 178 is greater than about $5 \times 10^{20}$ cm$^{-3}$, and in some embodiments, is about $5 \times 10^{20}$ cm$^{-3}$ to about $5 \times 10^{21}$ cm$^{-3}$. In p-type transistor regions, epitaxial layers 178 can include a semiconductor material (e.g., silicon germanium) doped with p-type dopants, such as boron, indium, other p-type dopant, or combinations thereof. In n-type transistor regions, epitaxial layers 178 can include a semiconductor material (e.g., silicon) doped with n-type dopants, such as phosphorus, arsenic, other n-type dopant, or combinations thereof. In some embodiments, p-type epitaxial source/drains and n-type epitaxial source/drains include the same semiconductor material. In some embodiments, p-type epitaxial source/drains and n-type epitaxial source/drains include different semiconductor materials. In some embodiments, p-type epitaxial source/drains and/or n-type epitaxial source/drains have multi-layer structures. For example, epitaxial layers 178 can include a first epitaxial layer, a second epitaxial layer, and a third epitaxial layer, where the first epitaxial layer is between semiconductor layers 120 and the second epitaxial layer, the second epitaxial layer is between the first epitaxial layer and the third epitaxial layer, and the third epitaxial layer is a cap layer. In some embodiments, epitaxial layers 178 include materials and/or dopants that achieve desired tensile stress and/or compressive stress in semiconductor layers 120. The first epitaxial layer may wrap the second epitaxial layer. Lightly doped source/drain (LDD) regions, heavily doped source/drain (HDD) regions, other doped regions, or combinations thereof may be disposed in epitaxial layers 178. Such doped regions may extend into semiconductor layers 120, for example, under gate spacers 148.

Undoped epitaxial layers 176 can grow from substrate extensions 105' and mesas 105", and epitaxial layers 178 can grow from semiconductor layers 120 and undoped epitaxial layers 176. Undoped epitaxial layers 176 and/or epitaxial layers 178 can be formed by epitaxy processes that implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy processes can use gaseous and/or liquid precursors that interact with the composition of substrate extensions 105', mesas 105", semiconductor layers 120, undoped epitaxial layers 176, or combinations thereof. In some embodiments, epitaxial growth conditions, such as epitaxial growth precursors, epitaxial growth temperature, epitaxial growth time, epitaxial growth pressure, and/or other suitable epitaxial growth parameter, is tuned to achieve epitaxial growth on semiconductor surfaces with minimal (to no) growth on dielectric surfaces and/or non-semiconductor surfaces. In some embodiments, epitaxial layers 178 are doped during deposition by adding dopants to a source material of the epitaxy process. In some embodiments, epitaxial growth parameters are controlled to prevent merger of epitaxial source/drains along the y-direction, such as merger between n-type epitaxial source/drains and p-type epitaxial source/drains. In some embodiments, epitaxial layers 178 are doped by an ion implantation process after a deposition process. In some embodiments, annealing processes are performed to activate dopants in epitaxial layers 178 and/or other source/drain regions, such as HDD regions and/or LDD regions. In some embodiments, epitaxial source/drains 180 in region 154A and epitaxial source/drains 180 in region 154B are formed in separate processing sequences, for example, by masking region 154A when forming epitaxial source/drains for n-type transistors in region 154B and masking region 154B when forming epitaxial source/drains for p-type transistors in region 154A.

Figure 4O:
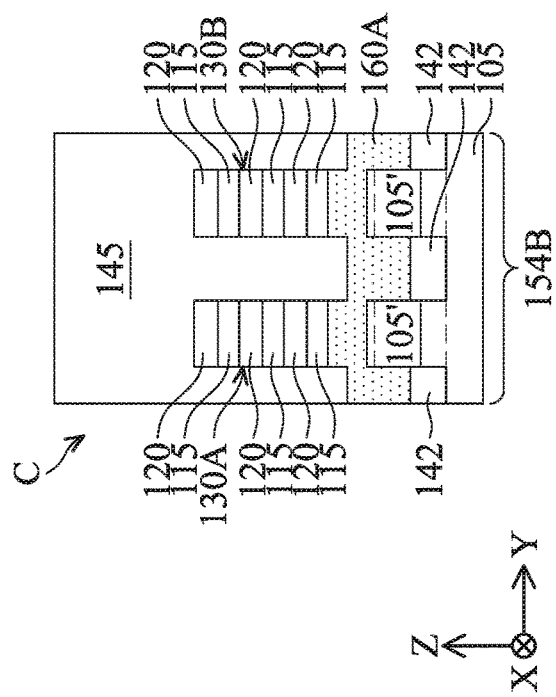
Figure 4Q:
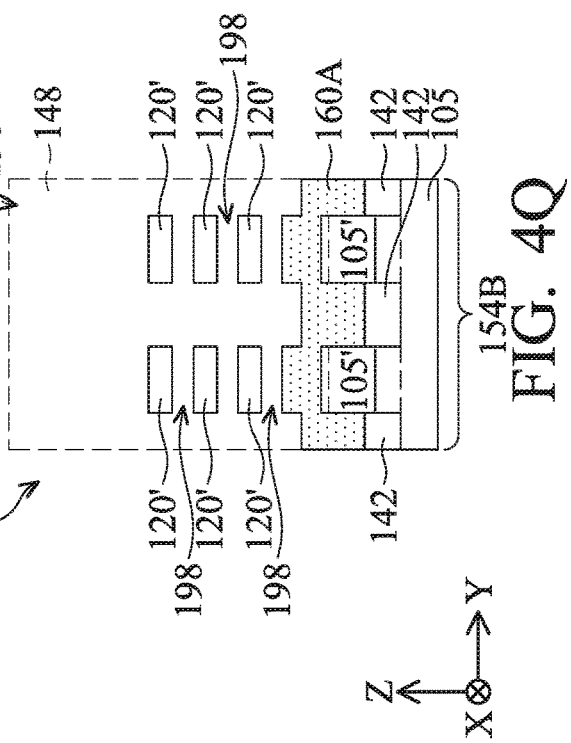

Turning to FIG. 2O, FIG. 3O, and FIG. 4O, a dielectric layer is formed over multigate device 100. In the depicted embodiment, the dielectric layer has a multilayer structure, such as a contact etch stop layer 186 and an interlayer dielectric (ILD) layer 188. ILD layer 188 and CESL 186 are disposed over epitaxial source/drain features 180. In the X-Z plane (FIG. 2O), ILD layer 188 and CESL 186 fill spaces between adjacent gate structures 150, CESL 186 is between ILD layer 188 and gate spacers 148, and CESL 186 is between ILD layer 188 and epitaxial source/drains 180. In the Y-Z plane (FIG. 3O), ILD layer 188 and CESL 186 fill spaces between adjacent epitaxial source/drains 180, CESL 186 is between ILD layer 188 and isolation features 142, and CESL 186 is between ILD layer 188 and epitaxial source/drains 180.

ILD layer 188 includes a dielectric material, such as silicon oxide, tetraethylorthosilicate (TEOS) oxide, PSG, BSG, BPSG, FSG, carbon-doped oxide, Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other dielectric material, or combinations thereof. In some embodiments, ILD layer 188 includes a low-k dielectric material, such as carbon-doped oxide, or an extreme low-k dielectric material (e.g., k≤2.5), such as porous carbon-doped oxide and/or porous silicon dioxide. CESL 186 includes a material different than ILD layer 188, such as a dielectric material that is different than the dielectric material of ILD layer 188. For example, where ILD layer 188 includes a low-k dielectric material, such as porous silicon oxide, CESL 186 can include silicon and nitrogen, such as silicon nitride, silicon carbonitride, or silicon oxycarbonitride. CESL 186 and/or ILD layer 188 may have a multilayer structure.

Forming the dielectric layer can include depositing CESL 186 over multigate device 100, depositing ILD layer 188 over CESL 186, and performing a CMP and/or other planarization process until reaching (exposing) tops of dummy gates 145 (e.g., top surfaces thereof). In some embodiments, the planarization process removes hard masks of dummy gates 145 to expose underlying dummy gate electrodes, such as polysilicon gate electrodes. CESL 186 and ILD layer 188 are formed by CVD, PVD, ALD, HDPCVD, HARP, FCVD, MOCVD, RPCVD, PECVD, LPCVD, ALCVD, APCVD, other suitable methods, or combinations thereof. In some embodiments, ILD layer 188 is formed by FCVD, HARP, HDPCVD, or combinations thereof.

Turning to FIGS. 2P-2R, FIGS. 3P-3R, and FIGS. 4P-4R, a gate replacement process is performed to replace dummy gates 145 with gate stacks 190, each of which includes a gate dielectric 192 and a gate electrode 194. For example, in FIG. 2P, FIG. 3P, and FIG. 4P, dummy gates 145 are removed to form gate openings 196 that expose channel regions of fin 130A and fin 130B. In the X-Z plane (FIG. 2P), gate openings 196 are between gate spacers 148 and expose topmost semiconductor layers 120. In the Y-Z plane (FIG. 4P), gate openings 196 expose semiconductor layers 120, semiconductor layers 115, insulation layers 160A, and insulation layers 160B. In some embodiments, an etching process selectively removes dummy gates 145 with respect to semiconductor layers 115, semiconductor layers 120, gate spacers 148, insulation layers 160A, insulation layers 160B, CESL 186, ILD layer 188, other device features, or combinations thereof. In other words, the etching process removes dummy gates 145 with minimal (to no) removal of semiconductor layers 115, semiconductor layers 120, gate spacers 148, insulation layers 160A, insulation layers 160B, CESL 186, and ILD layer 188. The etching process is a dry etch, a wet etch, other suitable etching process, or combinations thereof.

Before forming gate stacks 190 in gate openings 196, a channel release process is performed to form suspended channel layers. For example, in FIG. 2Q, FIG. 3Q, and FIG. 4Q, semiconductor layers 115 exposed by gate openings 196 are selectively removed to form gaps 198, thereby suspending semiconductor layers 120 in channel regions of multigate device 100. Gaps 198 are between semiconductor layers 120, between semiconductor layers 120 and insulation layers 160A, and between semiconductor layers 120 and insulation layers 160B. In the depicted embodiment, each channel region has three suspended semiconductor layers 120, which are referred to hereafter as channel layers 120'. Channel layers 120' are vertically stacked along the z-direction and provide three channels, respectively, through which current can flow between respective epitaxial source/drain features 118. In some embodiments, an etching process selectively removes semiconductor layers 115 with minimal (to no) etching of semiconductor layers 120, gate spacers 148, insulation layers 160A, insulation layers 160B, inner spacers 172, ILD layer 188, or combinations thereof. In some embodiments, an etchant is selected for the etch process that etches silicon germanium (i.e., semiconductor layers 115) at a higher rate than silicon (i.e., semiconductor layers 120) and dielectric materials (i.e., gate spacers 148, insulation layers 160A, insulation layers 160B, inner spacers 172, ILD layer 188, or combinations thereof) (i.e., the etchant has a high etch selectivity with respect to silicon germanium). The etching process is a dry etch, a wet etch, other suitable etching process, or combinations thereof. In some embodiments, before performing the etching process, an oxidation process converts semiconductor layers 115 into silicon germanium oxide features, and the etching process then removes the silicon germanium oxide features. In some embodiments, during and/or after removing semiconductor layers 115, an etching process is performed to modify a profile of semiconductor layers 120 to achieve target dimensions and/or target shapes for channel layers 120'. For example, channel layers 120' can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures)), or any other suitable shaped profile. In some embodiments, channel layers 120' have nanometer-sized dimensions and can be referred to as "nanostructures," alone or collectively. In some embodiments, channel layers 120' have sub-nanometer dimensions and/or other suitable dimensions.

In FIG. 2R, FIG. 3R, and FIG. 4R, processing includes forming gate stacks 190 (also referred to as high-k/metal gates) that fill gate openings 196 and gaps 198. Gate stacks 190 and gate spacers 148 are collectively referred to as gate structures 150. Where multigate device 100 includes at least one GAA transistor, such as the present embodiment, gate stacks 190 surround channel layers 120'. Gate stacks 190 are disposed between channel layers 120', between channel layers 120' and insulation layers 160A, and between channel layers 120' and insulation layers 160B (FIG. 2P and FIG. 4P). In the Y-Z plane (FIG. 2P), gate stacks 190 are disposed between respective gate spacers 148 and respective inner spacers 172. Gate stacks 190 are configured to achieve desired functionality according to design requirements of multigate device 100, and gate stacks 190 may include the same or different layers and/or materials. As noted, gate stacks 190 include a respective gate dielectric 192, each of which can include a gate dielectric layer, and a respective gate electrode 194, each of which can include a work function layer and a bulk (or fill) conductive layer. Gate stacks 190 may include numerous other layers, for example, capping layers, interface layers, diffusion layers, barrier layers, hard mask layers, or combinations thereof. In some embodiments, gate dielectrics 192 include a gate dielectric layer disposed over an interfacial layer (including a dielectric material, such as silicon oxide), and gate electrodes 194 are disposed over gate dielectrics 192. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSION, HfTaO, HTIO, HfZrO, zirconium oxide, aluminum oxide, hafnium dioxide-alumina ($HfO_2$—$Al_2O_3$) alloy, other suitable high-k dielectric materials, or combinations thereof. In some embodiments, the gate dielectric layer is a high-k dielectric layer. Gate electrodes 194 include a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, Cu, Ti, Ta, polysilicon, metal alloys, other suitable materials, or combinations thereof. In some embodiments, forming gate stacks 190 includes depositing a gate dielectric layer over multigate device 100 that partially fills gate openings (e.g., gate openings 196 and gaps 198), depositing a gate electrode layer over the gate dielectric layer that fills remainders of the gate openings, and performing a planarization process, such as CMP, on the gate electrode layer and/or the gate dielectric layer. The deposition processes can include CVD, PVD, ALD, RPCVD, PECVD, HDPCVD, FCVD, HARP, LPCVD, ALCVD, APCVD, SACVD, MOCVD, plating, other suitable methods, or combinations thereof.

In some embodiments, multigate device 100 includes at least one transistor that includes a channel (e.g., channel layers 120'), source/drains (e.g., epitaxial source/drains 180), and a gate (e.g., gate stacks 190). The gate engages the channel defined between the source/drains, and current can flow between the source/drains (e.g., between source and drain or vice versa) during operation, and the gate and the channel are disposed over an elevated portion (e.g., substrate extensions 105'/mesas 105") of a bulk substrate (e.g., substrate 105'). Because the elevated portion of the bulk substrate is physically and electrically isolated from the gate by an insulation layer (e.g., insulation layer 160A/insulation layer 160B) and undoped portions of the epitaxial source/drains (e.g., undoped epitaxial layers 176), such as described herein, the transistor exhibits minimal to no leakage current through the bulk substrate, exhibits reduced parasitic capacitance, and improved performance compared to conventional GAA transistors.

In some embodiments, fabrication of multigate device 100 can include forming various contacts to facilitate operation of the transistors of multigate device 100. For example, one or more dielectric layers (e.g., similar to ILD layer 188 and/or CESL 186) can be formed over gate structures (including gate stacks 190 and gate spacers 148) and ILD layer 188. Contacts can then be formed in ILD layer 188/CESL 186 and/or dielectric layers disposed over thereover. For example, contacts are respectively formed that physically and/or electrically couple with gate stacks 190 and at least one epitaxial source/drain 180 of multigate device 100. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some embodiments, dielectric layers disposed over ILD layer 188/CESL 186 and the contacts (for example, the gate contact and the source/drain contacts extending through ILD layer 188, CESL 186, and/or dielectric layers disposed thereover) are a portion of the MLI feature disposed over substrate 105. The MLI feature can include a combination of metal layers and dielectric layers configured to form vertical interconnect features, such as contacts and/or vias, and/or horizontal interconnect features, such as lines. The various conductive features include materials similar to the contacts. In some embodiments, a damascene process and/or dual damascene process is used to form the MLI feature.

Figures 6A, 6B:
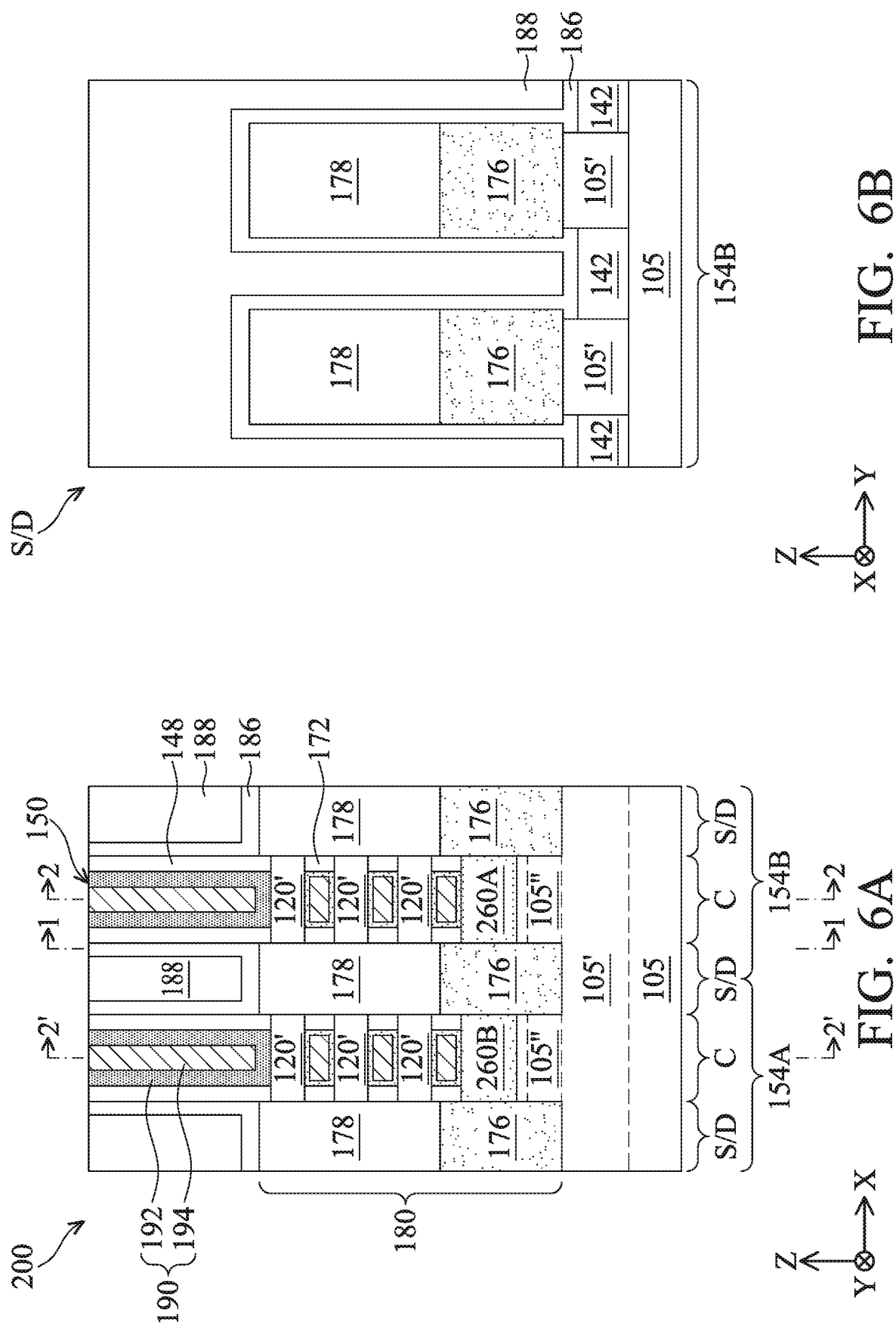

FIGS. 6A-6C are fragmentary cross-sectional views of a multigate device 200, in portion or entirety, according to various aspects of the present disclosure. For clarity and simplicity, similar features of multigate device 200 in FIGS. 6A-6C and multigate device 100 in FIGS. 2A-2R, FIGS. 3A-3R, FIGS. 4A-4R, and FIGS. 5A-5C are identified by the same reference numerals. FIG. 6B is taken along line 1-1 of FIG. 6A. FIG. 6C is taken along lines 2-2 and lines 2'-2' of FIG. 6A. FIGS. 6A-6C have been simplified for the sake of clarity to better understand the inventive concepts of the present disclosure. Additional features can be added in multigate device 200, and some of the features described below can be replaced, modified, or eliminated in other embodiments of multigate device 200.

Multigate device 200 is similar in many respects to multigate device 100. In FIGS. 6A-6C, multigate device 200 is configured and fabricated similar to multigate device 100, except multigate device 200 includes a fill layer 260A in region 154B and a fill layer 260B in region 154A. Fill layer 260A and fill layer 260B include different materials, and the materials are selected to optimize capacitance reduction, other performance parameter, fabrication thereof, or combinations thereof of their respective regions based on the devices and/or the structures fabricated therein. In some embodiments, fill layer 260A and fill layer 260B include dielectric materials having different dielectric constants. For example, where region 154A is a p-type device region having a p-type transistor therein and region 154B is an n-type device region having an n-type transistor therein, a dielectric material and/or dielectric constant of fill layer 260A is selected that reduces parasitic capacitance in the n-type device region and a dielectric material and/or dielectric constant of fill layer 260B is selected that reduces capacitance in the p-type device region. In some embodiments, since mesa leakage affects n-type devices more than p-type devices (i.e., performance of p-type devices is more immune and/or less susceptible to mesa leakage), fill layer 260A (in region 154B, such as an n-type device region) can include a dielectric material, such as silicon nitride, and fill layer 260B (in region 154A, such as a p-type device region) can include a semiconductor material, such as silicon. Providing the n-type device region with an insulation layer (i.e., fill layer 260A) between substrate extensions 105'/mesas 105" and gate stack 190 can reduce parasitic capacitance, suppress mesa leakage, improve DIBL control, or combinations thereof of n-type transistors in region 154B. Providing the p-type device region with a semiconductor layer (i.e., fill layer 260B) between substrate extensions 105'/mesas 105" and gate stack 190 provides gate control of "mesa channels" (e.g., because gate stack 190 wraps between substrate extensions 105'/mesas 105"), which can boost on-state performance of p-type transistors in region 154A. In such embodiments, APT layers 106 can sufficiently block bottom leakage in the p-type device region.

FIGS. 7A-7C are fragmentary cross-sectional views of a multigate device 300, in portion or entirety, according to various aspects of the present disclosure. For clarity and simplicity, similar features of multigate device 300 in FIGS. 7A-7C and multigate device 100 in FIGS. 2A-2R, FIGS. 3A-3R, FIGS. 4A-4R, and FIGS. 5A-5C are identified by the same reference numerals. FIG. 7B is taken along line 1-1 of FIG. 7A. FIG. 7C is taken along lines 2-2 and lines 2'-2' of FIG. 7A. FIGS. 7A-7C have been simplified for the sake of clarity to better understand the inventive concepts of the present disclosure. Additional features can be added in multigate device 300, and some of the features described below can be replaced, modified, or eliminated in other embodiments of multigate device 300.

Multigate device 300 is similar in many respects to multigate device 100. In FIGS. 7A-7C, multigate device 300 is configured and fabricated similar to multigate device 100, except multigate device 300 includes an air gap 362A within insulation layer 160A and an air gap 362B within insulation layer 160B. In the X-Z plane (FIG. 7A), air gap 362A and air gap 362B extend between undoped epitaxial layers 176. In the Y-Z plane (FIG. 7C), air gap 362A and air gap 362B each extend continuously along the y-direction. For example, air gap 362B and air gap 362A extend over substrate extensions 105' and isolation features 142. Because air has a dielectric constant that is about one (k≈1), which is lower than dielectric constants of dielectric, insulating materials (for example, silicon nitride), air gap 362A and air gap 362B can further reduce parasitic capacitance between gates 190 and substrate extensions 105'/mesas 105", which can further improve performance of multigate device 300. In some embodiments, in the X-Z plane, air gap 362A and air gap 362B are surrounded by insulation layer 160A and insulation layer 160B, respectively. Air gap 362A and air gap 362B may be formed during deposition of insulation layer 160B and insulation layer 160A, respectively. In some embodiments, thickness t1 of sacrificial layer 108A and/or thickness t4 of sacrificial layers 108B is reduced to facilitate formation of air gap 362A and air gap 362B.

Multigate device 200 and/or multigate device 300 can include at least one GAA transistor, such as at least one p-type GAA transistor and/or at least one n-type GAA transistor. Multigate device 200 and/or multigate device 300 may be included in a microprocessor, a memory, other IC device, or combinations thereof. In some embodiments, multigate device 200 and/or multigate device 300 is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof.

Bottom isolation techniques for enhancing performance and/or reliability of multigate devices, such as GAA FETs, are disclosed herein. The present disclosure provides for many different embodiments. An exemplary semiconductor structure includes a semiconductor mesa, a semiconductor layer disposed over the semiconductor mesa, a gate stack that surrounds the semiconductor layer, and a dielectric layer disposed between the gate stack and the semiconductor mesa. The dielectric layer wraps the semiconductor mesa. In some embodiments, an air gap disposed in the dielectric layer.

In some embodiments, the semiconductor structure further includes an epitaxial source/drain structure having a doped portion disposed over an undoped portion. The doped portion is disposed adjacent to the semiconductor layer. The undoped portion is disposed adjacent to the dielectric layer and the semiconductor mesa. In some embodiments, a top surface of the undoped portion of the epitaxial source/drain structure is between a top surface of the dielectric layer and a bottom surface of the semiconductor layer.

In some embodiments, a first thickness of the dielectric layer is greater than a second thickness of the semiconductor layer. In some embodiments, the dielectric layer has a first dimension along a first direction and a second dimension along a second direction that is different than the first direction, and the semiconductor layer has a third dimension along the first direction and a fourth dimension along the second direction. The first dimension is about equal to the third dimension. The second dimension is greater than the fourth dimension.

In some embodiments, the semiconductor structure further includes an isolation feature disposed adjacent to the semiconductor mesa. The dielectric layer is between the isolation feature and the gate stack. In some embodiments, a first thickness of the dielectric layer between the gate stack and the semiconductor mesa is less than a second thickness of the dielectric layer between the gate stack and the isolation feature.

An exemplary device includes a first epitaxial source/drain and a second epitaxial source/drain disposed over a substrate. An elevated portion of the substrate is between the first epitaxial source/drain and the second epitaxial source/drain. The device further includes an insulation layer disposed over the elevated portion of the substrate and between the first epitaxial source/drain and the second epitaxial source/drain. The device further includes a channel layer disposed over the elevated portion of the substrate and between the first epitaxial source/drain and the second epitaxial source/drain. The device further includes a gate disposed over the elevated portion of the substrate and between the first epitaxial source/drain and the second epitaxial source/drain. The gate wraps around the channel layer. The gate includes a gate electrode and a gate electrode. The insulation layer is between the gate and the elevated portion of the substrate. The device can further include an isolation feature disposed over the substrate. In some embodiments, the elevated portion of the substrate extends through the isolation feature, the insulation layer is between a first portion of the gate and the elevated portion of the substrate and between a second portion of the gate and the isolation feature, and a bottom surface of the second portion of the gate is above a top surface of the elevated portion of the substrate.

In some embodiments, the first epitaxial source/drain and the second epitaxial source/drain each include an undoped epitaxial layer. A top surface of the undoped epitaxial layer is below a bottom surface of the channel layer, and a bottom surface of the undoped epitaxial layer is below a bottom surface of the insulation layer. In some embodiments, the insulation layer includes silicon and nitrogen.

In some embodiments, the channel layer is a first channel layer, the elevated portion of the substrate is a first elevated portion, the gate is a first gate, and the insulation layer is a first insulation layer. In such embodiments, the device can further include a second channel layer disposed over a second elevated portion of the substrate and between the first epitaxial source/drain and a third epitaxial source/drain. The device can further include a second insulation layer disposed over the second elevated portion of the substrate and between the first epitaxial source/drain and the third epitaxial source/drain. The device can further include a second gate disposed over the second elevated portion of the substrate and between the first epitaxial source/drain and the second epitaxial source/drain. The second gate surrounds the second channel layer, and the second insulation layer is between the gate and the second elevated portion of the substrate. In some embodiments, the first insulation layer and the second insulation layer include a same material. In some embodiments, the first insulation layer and the second insulation layer include different materials.

An exemplary method includes forming a fin structure over a substrate. The fin structure includes a substrate portion, a first sacrificial layer over the substrate portion, a first semiconductor layer over the first sacrificial layer, and a second semiconductor layer over the first semiconductor layer. The method further includes forming an isolation feature adjacent to the substrate portion of the fin structure and forming a second sacrificial layer over the isolation feature. The second sacrificial layer is adjacent to the substrate portion and the first sacrificial layer. The method further includes selectively removing the first sacrificial layer and the second sacrificial layer to form a gap between the first semiconductor layer and the substrate portion. The method further includes filling the gap with an insulation layer and, in a first region of the fin structure, removing the second semiconductor layer, the first semiconductor layer, the insulation layer, and a portion of the substrate portion to form a source/drain recess that extends beyond a bottom surface the insulation layer. The method further includes forming an epitaxial source/drain in the source/drain recess and, in a second region of the fin structure, replacing the first semiconductor layer with a gate stack. The gate stack surrounds the second semiconductor layer. The insulation layer is between the gate stack and the substrate portion.

In some embodiments, forming the epitaxial source/drain can include forming an undoped epitaxial layer in the source/drain recess and forming a doped epitaxial over the undoped epitaxial layer in the source/drain recess. A top surface of the undoped epitaxial layer is below a bottom surface of the second semiconductor layer and above a top surface of the insulation layer. In some embodiments, filling the gap with the insulation layer includes depositing a dielectric material and trimming the dielectric material. In some embodiments, the first semiconductor layer includes silicon germanium having a first germanium concentration, the first sacrificial layer includes silicon germanium having a second germanium concentration, and the second sacrificial layer includes silicon germanium having a third germanium concentration. The first germanium concentration is less than the second germanium concentration and the third germanium concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a semiconductor mesa;
   a semiconductor layer disposed over the semiconductor mesa;
   a gate stack that surrounds the semiconductor layer; and
   a dielectric layer disposed between the gate stack and the semiconductor mesa, wherein the dielectric layer wraps the semiconductor mesa; and
   an epitaxial source/drain structure having a doped portion disposed over an undoped portion, wherein the doped portion is disposed adjacent to the semiconductor layer and the undoped portion is disposed adjacent to the dielectric layer and the semiconductor mesa.

2. The semiconductor structure of claim 1, wherein the semiconductor layer has a first length along a widthwise direction of the gate stack, the dielectric layer has a second length along the widthwise direction of the gate stack, and the first length is about equal to the second length.

3. The semiconductor structure of claim 1, wherein a top surface of the undoped portion of the epitaxial source/drain structure is between a top surface of the dielectric layer and a bottom surface of the semiconductor layer.

4. The semiconductor structure of claim 1, wherein a first thickness of the dielectric layer is greater than a second thickness of the semiconductor layer.

5. The semiconductor structure of claim 1, wherein:
   the dielectric layer has a first dimension along a first direction and a second dimension along a second direction that is different than the first direction;
   the semiconductor layer has a third dimension along the first direction and a fourth dimension along the second direction; and
   the first dimension is about equal to the third dimension and the second dimension is greater than the fourth dimension.

6. The semiconductor structure of claim 1, further comprising an isolation feature disposed adjacent to the semiconductor mesa, wherein the dielectric layer is between the isolation feature and the gate stack.

7. The semiconductor structure of claim 6, wherein a first thickness of the dielectric layer between the gate stack and the semiconductor mesa is less than a second thickness of the dielectric layer between the gate stack and the isolation feature.

8. The semiconductor structure of claim 1, further comprising an air gap disposed in the dielectric layer.

9. A device comprising:
   a first epitaxial source/drain and a second epitaxial source/drain disposed over a substrate, wherein an elevated portion of the substrate is between the first epitaxial source/drain and the second epitaxial source/drain;
an insulation layer disposed over the elevated portion of the substrate and between the first epitaxial source/drain and the second epitaxial source/drain;
a channel layer disposed over the elevated portion of the substrate and between the first epitaxial source/drain and the second epitaxial source/drain;
an isolation feature disposed over the substrate, wherein the elevated portion of the substrate extends through the isolation feature; and
a gate disposed over the elevated portion of the substrate and between the first epitaxial source/drain and the second epitaxial source/drain, wherein:
the gate wraps around the channel layer,
the gate includes a gate dielectric and a gate electrode,
the insulation layer is between a first portion of the gate and the elevated portion of the substrate and between a second portion of the gate and the isolation feature, and
a bottom surface of the second portion of the gate is above a top surface of the elevated portion of the substrate.

10. The device of claim 9, wherein:
the insulation layer has a first thickness between the first portion of the gate and the elevated portion of the substrate; and
the insulation layer has a second thickness between the second portion of the gate and the isolation feature, wherein the second thickness is different than the first thickness.

11. The device of claim 9, wherein the first epitaxial source/drain and the second epitaxial source/drain each include an undoped epitaxial layer, wherein a top surface of the undoped epitaxial layer is below a bottom surface of the channel layer.

12. The device of claim 11, wherein a bottom surface of the undoped epitaxial layer is below a bottom surface of the insulation layer.

13. The device of claim 9, wherein the insulation layer includes silicon and nitrogen.

14. The device of claim 9, wherein the channel layer is a first channel layer, the elevated portion of the substrate is a first elevated portion, the gate is a first gate, the insulation layer is a first insulation layer, and the device further comprises:

a second channel layer disposed over a second elevated portion of the substrate and between the first epitaxial source/drain and a third epitaxial source/drain;
a second insulation layer disposed over the second elevated portion of the substrate and between the first epitaxial source/drain and the third epitaxial source/drain; and
a second gate disposed over the second elevated portion of the substrate and between the first epitaxial source/drain and the third epitaxial source/drain, wherein:
the second gate surrounds the second channel layer, and
the second insulation layer is between the second gate and the second elevated portion of the substrate.

15. The device of claim 14, wherein the first insulation layer and the second insulation layer include a same material.

16. The device of claim 14, wherein the first insulation layer and the second insulation layer include different materials.

17. A device structure comprising:
a semiconductor mesa;
a first semiconductor layer disposed over the semiconductor mesa;
a gate disposed over the first semiconductor layer; and
an insulation layer disposed between the gate and the semiconductor mesa, wherein:
in a first cross-sectional view, the insulation layer abuts the gate and a top of the semiconductor mesa and a second semiconductor layer abuts sidewalls of the semiconductor mesa, and
in a second cross-sectional view, the insulation layer abuts the gate, the top of the semiconductor mesa, and the sidewalls of the semiconductor mesa.

18. The device structure of claim 17, further comprising a void within the insulation layer between the gate and the semiconductor mesa.

19. The device structure of claim 18, wherein the void extends beyond the sidewalls of the semiconductor mesa in the second cross-sectional view and the void does not extend beyond the sidewalls of the semiconductor mesa in the first cross-sectional view.

20. The device structure of claim 17, wherein, in the first cross-sectional view, a thickness of the second semiconductor layer is greater than a sum of a thickness of the insulation layer and a height of the semiconductor mesa.

* * * * *